US011688947B2

(12) United States Patent
Smith, Jr. et al.

(10) Patent No.: US 11,688,947 B2
(45) Date of Patent: Jun. 27, 2023

(54) RADIO FREQUENCY CONNECTORS, OMNI-DIRECTIONAL WIFI ANTENNAS, OMNI-DIRECTIONAL DUAL ANTENNAS FOR UNIVERSAL MOBILE TELECOMMUNICATIONS SERVICE, AND RELATED DEVICES, SYSTEMS, METHODS, AND ASSEMBLIES

(71) Applicant: RLSmith Holdings LLC, Dallas, TX (US)

(72) Inventors: Richard Loy Smith, Jr., Dallas, TX (US); Jerry Douglas Leopold, Yukon, OK (US)

(73) Assignee: RLSmith Holdings LLC, Dallas, TX (US)

( * ) Notice: Subject to any disclaimer, the term of this patent is extended or adjusted under 35 U.S.C. 154(b) by 240 days.

(21) Appl. No.: 16/914,220

(22) Filed: Jun. 26, 2020

(65) Prior Publication Data
US 2021/0119339 A1   Apr. 22, 2021

Related U.S. Application Data

(60) Provisional application No. 62/868,528, filed on Jun. 28, 2019.

(51) Int. Cl.
*H01Q 1/22* (2006.01)
*H01Q 9/28* (2006.01)
(Continued)

(52) U.S. Cl.
CPC .......... *H01Q 9/285* (2013.01); *H01Q 1/2291* (2013.01); *H01Q 1/42* (2013.01); *H01Q 1/50* (2013.01);
(Continued)

(58) Field of Classification Search
CPC .... H01Q 1/22–50; H01Q 1/2291; H01Q 9/28; H01Q 9/285; H05K 1/0243; H05K 2201/10098
See application file for complete search history.

(56) References Cited

U.S. PATENT DOCUMENTS

| 4,978,965 A | 12/1990 | Mohuchy |
| 6,014,112 A | 1/2000 | Koscica et al. |

(Continued)

FOREIGN PATENT DOCUMENTS

| CN | 102013560 | 4/2011 |
| CN | 203690467 | 7/2014 |

(Continued)

OTHER PUBLICATIONS

Antennas for Communicaiton, :Radome Transmission Loss and Antenna Pattern Degradation, retrieved on Jun. 4, 2020 in 15 pgs.
(Continued)

*Primary Examiner* — Hasan Islam
(74) *Attorney, Agent, or Firm* — Knobbe, Martens, Olson & Bear, LLP

(57) ABSTRACT

Antenna systems have an RF connector, a PCB dipole antenna, and a radome. The RF connector provides a direct connection to the PCB and limits PIM. An omni-directional WiFi antenna has a pair of horizontal dipole antennas on a PCB having different wavelengths and same frequency. An omni-directional UMTS dual antenna has a vertical arrangement of two independent antennas on a PCB and has a jumper printed circuit board connecting the RF connector to the upper antenna. Corresponding connectors, radomes, and ways of combining antenna elements on a single PCB are also disclosed. A single frequency omnidirectional antenna includes both half and full wavelength dipole elements. A plus-shaped radome enhances the omnidirectional radiation pattern of the enclosed antenna. A jumper printed circuit
(Continued)

board allows independent antennas on a single circuit board without the degradation of internal coaxial connections. The connector provides a direct interface with a circuit board to reduce the number of parts and also reduce passive intermodulation.

7 Claims, 33 Drawing Sheets

(51) Int. Cl.
  *H01Q 1/42* (2006.01)
  *H01Q 1/50* (2006.01)
  *H05K 1/02* (2006.01)
(52) U.S. Cl.
  CPC . *H05K 1/0243* (2013.01); *H05K 2201/10098* (2013.01)

(56) References Cited

U.S. PATENT DOCUMENTS

| | | | |
|---|---|---|---|
| 6,400,332 B1 | 6/2002 | Tsai et al. | |
| 6,424,311 B1 | 7/2002 | Tsai et al. | |
| 6,683,570 B2 | 1/2004 | Skladany et al. | |
| 6,831,615 B2 | 12/2004 | Götti | |
| 6,859,176 B2 | 2/2005 | Choi | |
| 7,268,745 B2 * | 9/2007 | Yang | H01Q 11/08 343/702 |
| 7,336,241 B2 | 2/2008 | Bailey et al. | |
| 7,427,966 B2 | 9/2008 | Boss et al. | |
| 7,616,168 B2 | 11/2009 | Tillery | |
| 7,868,842 B2 | 1/2011 | Chair | |
| 7,986,280 B2 | 7/2011 | Semonov | |
| 8,294,613 B2 | 10/2012 | Stucki | |
| 8,514,144 B2 * | 8/2013 | Gray | H01Q 1/12 343/718 |
| 9,433,083 B2 * | 8/2016 | Moncayo | H05K 1/025 |
| 9,461,370 B2 | 10/2016 | Yona et al. | |
| 9,609,530 B2 | 3/2017 | Lea et al. | |
| 9,843,108 B2 | 12/2017 | Le et al. | |
| 9,859,611 B2 | 1/2018 | Jones et al. | |
| 9,923,280 B2 | 3/2018 | Segador et al. | |
| 10,381,750 B2 | 8/2019 | Jung et al. | |
| 11,245,205 B1 | 2/2022 | Smith, Jr. et al. | |
| 2002/0163476 A1 | 11/2002 | Eriksson | |
| 2007/0229385 A1 | 10/2007 | Deng et al. | |
| 2007/0254587 A1 | 11/2007 | Schadler et al. | |
| 2009/0179814 A1 | 7/2009 | Park et al. | |
| 2011/0140975 A1 | 6/2011 | Shietomi | |
| 2013/0328733 A1 | 12/2013 | Gunnels | |
| 2014/0240188 A1 | 8/2014 | Mamo et al. | |
| 2016/0064807 A1 | 3/2016 | Reed et al. | |
| 2017/0062940 A1 | 3/2017 | Cao | |
| 2018/0366817 A1 | 12/2018 | Sung et al. | |

FOREIGN PATENT DOCUMENTS

| | | |
|---|---|---|
| CN | 105375104 A | 3/2016 |
| CN | 106654529 | 5/2017 |
| CN | 207233933 | 4/2018 |
| CN | 108717992 | 10/2018 |
| JP | H07176925 A | 7/1995 |
| JP | 11231037 A | 8/1999 |
| KR | 20130112518 | 10/2013 |
| WO | WO 2016/090463 | 6/2016 |
| WO | WO 2016/187701 | 12/2016 |
| WO | WO 2017/020114 | 2/2017 |
| WO | WO 2017/133849 | 8/2017 |
| WO | WO 2017/185184 | 11/2017 |
| WO | WO 2018/074099 A1 | 4/2018 |

OTHER PUBLICATIONS

Griffiths, Lance, "A Fundamental and Technical Review of Radomes," MFG Galileo Composites, May 2008, in 4 pgs.

Kulkarni, Vishakha A., et al., "Performance Measurement of Polarization Diversity Printed Dipole Antenna Using High Frequency Pin Diode for WLAN", International Journal of Advanced Research in Electrical, Electronics and Instrumentation Engineering, vol. 2, Issue 5, May 2013; pp. 1917-1923; total of 7 pages.

Saenz, Elena, et al., "Coupling Reduction Between Dipole Antenna Elements by Using a Planar Meta-Surface," IEEE Transactions on Antennas and Propagation, vol. 57, No. 2, Feb. 2009, pp. 383-394, total of 13 pages.

Thompson, Rob, :Radomes: Do they Matter?, Powerpoint Presntation retreived on Jun. 4, 2020 in 17 pgs.

* cited by examiner

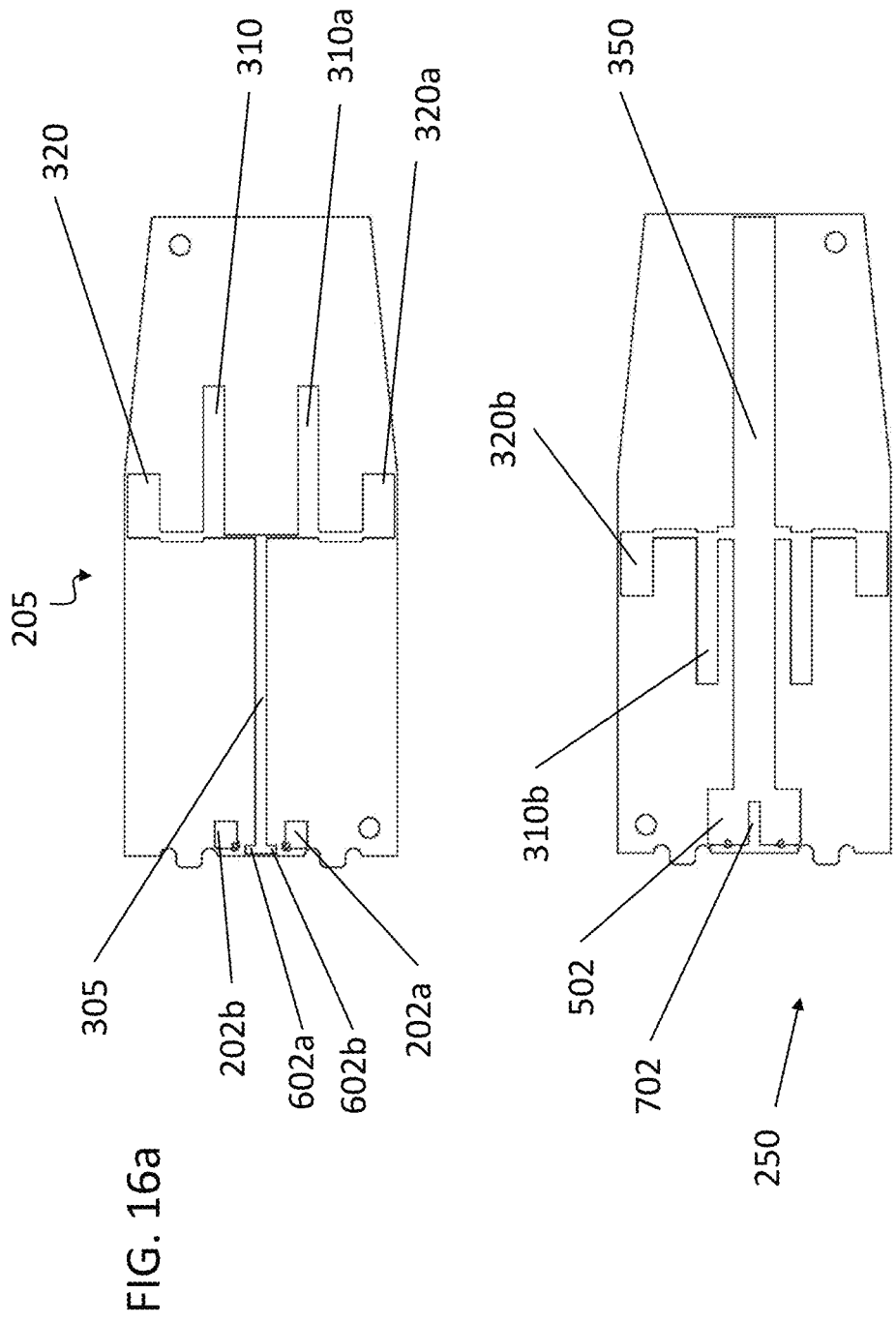

RADIO FREQUENCY CONNECTORS, OMNI-DIRECTIONAL WIFI ANTENNAS, OMNI-DIRECTIONAL DUAL ANTENNAS FOR UNIVERSAL MOBILE TELECOMMUNICATIONS SERVICE, AND RELATED DEVICES, SYSTEMS, METHODS, AND ASSEMBLIES

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Technical Field

The present disclosure relates generally to physically and conductively coupling circuits and device components, and more specifically, to physical and conductive connectors used to couple devices, cabling, and/or circuit boards to other circuit boards. It also relates to antennas, connections, and components for transmitting and/or receiving radio frequency communications.

Description of the Related Art

Connectors

Electronic circuits and devices often use connectors to physically and/or electrically couple various components. For example, power cords may have connectors (for example, a DC connector) to convey power from a power supply to an electronic device. Some devices may use coaxial or other radio frequency (RF) connectors to make physical and electrical connections to convey communications, data, and/or power. Coaxial RF connectors are generally designed to maintain shielding provided by coaxial cables or conductors. The coaxial RF connectors can provide a mechanical fastening mechanism (for example, threads, bayonets, braces, blind mates, and so forth) that also couples shielding or grounds separately from a signal conductor core. The coaxial RF connector allows for low insertion force of the cable/connector that is repeatable.

For example, many communication antennas use a coaxial or similar RF cable and connection to establish coupling between the RF connector and the antenna (sheet metal or printed circuit board (PCB)). Such connections may generally utilize RF connectors with coaxial cables between various components. However, only a small number of RF connectors are rated for particular Passive Intermodulation (PIM) values.

Antennas

An antenna is the interface between radio waves propagating through space and electric currents moving in metal conductors, used with a transmitter or receiver. In transmission, a radio transmitter supplies an electric current to the antenna's terminals, and the antenna radiates the energy from the current as electromagnetic waves (radio waves). In reception, an antenna intercepts some of the power of a radio wave in order to produce an electric current at its terminals. Antennas are useful components of radio equipment.

An antenna is an array of conductors, electrically connected to a receiver or transmitter. Antennas can be designed to transmit and/or receive radio waves in horizontal directions (parallel to the horizon) equally (omnidirectional antennas), or preferentially in a particular direction (directional, or high-gain, or "narrow beamwidth" antennas). In some applications, the construction and/or arrangement of the antenna does not adequately transmit and/or receive radio waves as desired.

SUMMARY

The present disclosure presents improvements to overcome disadvantages associated with some antennas, components, and communications systems. According to some aspects of the present disclosure, advantageous features of antenna systems have been disclosed. Additional features and aspects are described herein.

Some advantageous antenna systems can have an RF connector, a PCB dipole antenna, and/or a radome. The RF connector provides a direct connection to the PCB and limits PIM. An omni-directional WiFi antenna has a pair of horizontal dipole antennas on a PCB having different wavelengths and same frequency. An omni-directional UMTS dual antenna has a vertical arrangement of two independent antennas on a PCB and has a jumper printed circuit board connecting the RF connector to the upper antenna. Corresponding connectors, radomes, and ways of combining antenna elements on a single PCB are also disclosed. A single frequency omnidirectional antenna includes both half and full wavelength dipole elements. A plus-shaped radome enhances the omnidirectional radiation pattern of the enclosed antenna. A jumper printed circuit board allows independent antennas on a single circuit board without the degradation of internal coaxial connections. The connector provides a direct interface with a circuit board to reduce the number of parts and also reduce passive intermodulation.

In some applications, RF connectors provide a PIM rated connection between the connector and a corresponding PCB or similar board without using coaxial RF connectors. In some applications, antenna systems and components are arranged such that radio waves are directed into a beam away from an undesired direction and towards an intended direction and/or into a desired radiation pattern.

According to some aspects of the disclosure, an antenna includes components not directly connected to the transmitter that can be constructed and arranged to improve the performance of the antenna. Such components can include, for example, parabolic reflectors, horns, adjustable panels to lower or raise the beamwidth and/or to steer the beam in one or more planes, parasitic elements, and//or other features and components that may serve to direct the radio waves into a beam away from an undesired direction and towards an intended direction and/or into a desired radiation pattern.

According to some example aspects of the disclosure, an RF connector can include one or more of the following features in various combinations. Additional features, aspects, and advantages are disclosed herein.

In some applications, an antenna assembly comprises a printed circuit board with an antenna thereon. The antenna is arranged for wireless communication of a radio frequency signal. An edge launch radio frequency connector comprises a pin soldered to a trace of the printed circuit board and electrically connected to the antenna. Conductive arms are on opposing sides of the pins. Each of the conductive arms is soldered to ground pads of the printed circuit board and has a portion spaced apart from the printed circuit board. The edge launch radio frequency connector is configured to achieve a passive intermodulation (PIM) of better than −140 decibels relative to a carrier (dBc).

In some applications, a radio frequency connector comprises a pin configured to carry a radio frequency signal. Ground arms are positioned on opposing sides of the pin. The ground arms are configured to connect with respective ground connections of a printed circuit board. Each of the ground arms comprises a first portion arranged to contact the printed circuit board. A second portion is arranged to be spaced apart from the printed circuit board when the first portion is in contact with the printed circuit board. The ground arms are shaped to provide thermal relief while the radio frequency connector is being soldered to the printed circuit board.

In some applications, a method of manufacturing a radio frequency device assembly comprises positioning a radio frequency connector along an edge of a printed circuit board. A pin of the radio frequency connector is configured to carry a radio frequency signal is aligned with a conductive trace of the printed circuit board. Ground arms of the radio frequency connector on opposing sides of the pin are aligned with respective ground connections of the printed circuit board. Each of the ground arms comprises a first portion in contact with one of the ground connections and a second portion spaced apart from the printed circuit board. The method includes soldering (a) the first portion of each of the ground arms to the respective ground connection of the printed circuit board and (b) the pin to the conductive trace. The radio frequency connector has a passive intermodulation (PIM) of better than −140 decibels relative to a carrier (dBc) after the soldering. In some applications, a method of manufacturing an omni-directional antenna system as disclosed herein. In some applications, a method of using an omni-directional antenna system as disclosed herein. In some applications, a method of manufacturing a dual antenna system as disclosed herein. In some applications, a method of using a dual antenna system as disclosed herein. In some applications, a method of manufacturing antenna components as described herein.

In some applications, a radio frequency connector comprises a conductive body. At least one pair of conductive arms each configured to provide an electrical connection between the conductive body and ground pads of a printed circuit board (PCB). The at least one pair of conductive arms further configured to hold the PCB therebetween. Each of the conductive arms comprises at least one cutout that provides thermal relief when a heat source is applied to an end of the conductive arm configured to contact the PCB. A center pin is configured to electrically contact a trace on the PCB and communicate a signal with the trace. An insulator is configured to electrically isolate the center pin from the at least one pair of conductive arms and the conductive body. A connector portion is configured to couple the at least one pair of conductive arms, the center pin, the conductive body, and the insulator to a device.

In some applications, the at least one cutout has one of a square, rectangular, circular, or semicircular shape. The radio frequency connector is configured to achieve a passive intermodulation (PIM) of better than −140 decibels relative to a carrier (dBc) when soldered to the PCB. The carrier operates in a frequency in a range from 160 megahertz (MHz) to 80 gigahertz (GHz).

In some applications, an apparatus for transmitting data and/or power wirelessly comprises a printed circuit board (PCB) comprising a transmission line and a ground trace electrically isolated from the transmission line. A radio frequency connector comprises a conductive body. At least one pair of conductive arms is each configured to provide an electrical connection between the conductive body and ground pads of a printed circuit board (PCB). The at least one pair of conductive arms further configured to hold the PCB therebetween. Each of the conductive arms comprises at least one cutout that provides thermal relief when a heat source is applied to an end of the conductive arm configured to contact the PCB. A center pin is configured to electrically contact a trace on the PCB and communicate a signal with the trace. An insulator is configured to electrically isolate the center pin from the at least one pair of conductive arms and the conductive body.

In some applications, the at least one cutout has one of a square, rectangular, circular, or semicircular shape. The radio frequency connector is configured to achieve a passive intermodulation (PIM) of better than −140 decibels relative to a carrier (dBc) when soldered to the PCB. The carrier operates in a frequency in a range from 160 megahertz (MHz) to 80 gigahertz (GHz). The PCB further comprises a matching circuit configured to increase a reflected power ratio match between the radio frequency connector and the transmission line. The matching circuit comprises one or more tuning tabs having an electrical connection with the transmission line and a slot in a ground plane disposed on a side of the PCB opposite the ground pads.

According to some example aspects of the disclosure, an omni-directional antenna can include one or more of the following features in various combinations. Additional features, aspects, and advantages are disclosed herein.

In some applications, an omnidirectional Wifi antenna system comprises a radio frequency connector (RF connector), a printed circuit board (PCB), and a radome. The RF connector comprises a cable connector portion configured to be operably coupled to a coaxial cable in an electrical connection and adapted to communicate radio frequencies in the multi-megahertz range and to generally maintain the shielding provided by the coaxial cable. The RF connector comprises a PCB connector portion having a center pin and at least a pair of conductive arms. The center pin is electrically isolated from the conductive arms. The center pin is configured to electrically contact a conductive trace portion on a PCB and communicate a signal with the conductive trace portion. The pair of conductive arms have a thermal relief cutout and are configured to be operably coupled to the PCB to electrically contact ground pads of the PCB and hold the PCB between the pair of conductive arms. The RF connector comprises a body through which at least one aperture is defined and configured to receive a fastener for coupling the radome to the RF connector.

In some applications, the PCB comprises a conductive trace portion on a first side of the PCB configured to be electrically coupled to the center pin of the RF connector. The conductive trace portion is electrically connected to a microstrip line portion on the first side of the PCB. At least a pair of conductive ground pads are positioned on a second side of the PCB opposite the first side. The conductive ground pads are electrically connected to a groundplane on the second side of the PCB. The groundplane is electrically isolated from the microstrip line. The microstrip line and the groundplane are positioned along a centerline defined in a vertical plane through the center of the PCB. The microstrip line is positioned along the centerline on the first side of the PCB and the ground plane is positioned along the centerline on the second side of the PCB. The PCB comprises a conductive line electrically connected to at least a pair of outer dipoles and at least a pair of inner dipoles. The conductive line generally transverses a width of the PCB and is electrically coupled to the microstrip line on the first side of the PCB and electrically coupled to the ground plane on the second side of the PCB. The first side is a circuit-side surface of the PCB and the second side is a groundplane-side surface of the PCB.

In some applications, the pair of outer dipoles comprises a first outer dipole positioned proximate a first edge of the PCB and a second outer dipole spaced from the first outer dipole and positioned proximate a second edge of the PCB opposite the first edge. The first and second outer dipoles each comprise a pair of outer arms positioned on opposite sides of the PCB and extending in opposite directions from the generally transversely extending conductive line.

In some applications, the first outer dipole has an upper arm on the first side of the PCB that extends in a direction away from the conductive line and away from a base portion of the PCB configured to be connected to the RF connector in use. The first outer dipole has a lower arm on the second side of the PCB that extends in a direction away from the conductive line and toward the base portion of the PCB.

In some applications, the second outer dipole has an upper arm on the first side of the PCB that extends in a direction away from the conductive line and away from the base portion of the PCB. The second outer dipole has a lower arm on the second side of the PCB that extends in a direction away from the conductive line and toward the base portion of the PCB.

In some applications, the first and second outer dipoles are each positioned equidistant from the centerline and each has an effective electrical length configured to generally correspond to a half-wavelength of a target wavelength in use.

In some applications, the pair of inner dipoles comprises a first inner dipole positioned between the centerline and the first outer dipole. A second inner dipole is positioned between the centerline and the second outer dipole. The first and second inner dipoles each comprise a pair of inner arms positioned on opposite sides of the PCB and extending in opposite directions from the generally transversely extending conductive line.

In some applications, the first inner dipole has an upper arm on the first side of the PCB that extends in a direction away from the conductive line and away from the base portion of the PCB. The first inner dipole has a lower arm on the second side of the PCB that extends in a direction away from the conductive line and toward the base portion of the PCB.

In some applications, the second inner dipole has an upper arm on the first side of the PCB that extends in a direction away from the conductive line and away from the base portion of the PCB. The second inner dipole has a lower arm on the second side of the PCB that extends in a direction away from the conductive line and toward the base portion of the PCB. The first and second inner dipoles are each positioned equidistant from the centerline and each has an effective electrical length configured to generally correspond to a full-wavelength of the target wavelength in use.

In some applications, the pair of inner dipoles are configured to radiate at the same frequency as the outer dipoles in use. In some applications, the frequency is about 5 GHz.

According to some example aspects of the disclosure, an omni-directional UMTS dual antenna system can include one or more of the following features in various combinations. Additional features, aspects, and advantages are disclosed herein.

In some applications, an omnidirectional UMTS dual antenna system comprises first and second radio frequency connectors (RF connectors), a printed circuit board (PCB), a jumper printed circuit board connector, and a radome.

In some applications, each of the RF connectors comprises a cable connector portion, a center pin, a pair of conductive ground arms, and a radome connector portion configured to attach to the radome when positioned over the PCB in use. The center pins are configured to electrically contact conductive trace portions on a PCB and communicate independent signals with the conductive trace portions. Each of the respective conductive arms has a thermal relief cutout and is configured to electrically contact at least one ground pad of the PCB and hold the PCB between each of the respective pairs of conductive arms.

In some applications, the PCB comprises first and second conductive trace portions on a circuit side of the PCB to be electrically coupled to respective center pins of the RF connectors.

In some applications, the first conductive trace portion is electrically connected to a first microstrip line portion on the circuit side of the PCB for driving a first dipole antenna on a groundplane side of the PCB opposite the circuit side. The first conductive trace is configured to be operably coupled to the elements of the first dipole antenna positioned on a lower portion of the PCB.

In some applications, the second conductive trace portion is electrically connected to a jumper printed circuit board connector electrically connected to a second microstrip line portion on the circuit side of the PCB for driving a second dipole antenna on the groundplane side of the PCB opposite the circuit side. The jumper printed circuit board connector is attached to the groundplane side of the PCB. The jumper printed circuit board comprises a jumper microstrip line that connects at the lower end to a lower bus wire and at the upper end to an upper bus wire. The second conductive trace connects to the lower bus wire and directs a signal to the groundplane side via the jumper printed circuit board connector to an upper bus wire that returns the signal back to the circuit side of the PCB. The jumper printed circuit board, the lower bus wire, the jumper microstrip line, and the lower bus wire are electrically insulated from the groundplane. The upper bus wire connects to a microstrip transformer before driving an upper antenna.

In some applications, at least one conductive ground pad is positioned on the groundplane side of the PCB. The conductive ground pad is electrically connected to a groundplane. The groundplane is electrically isolated from the first and second microstrip lines. The first and second microstrip lines and the groundplane are positioned along a centerline defined in a vertical plane through the center of the PCB. The first and second microstrip lines are positioned along the centerline on the circuit side and the ground plane is positioned along the centerline on the groundplane side. The upper antenna comprises a pair of dipoles, with a dipole on either side of the centerline. The lower antenna comprises a pair of dipoles, with a dipole on either side of the centerline.

In some applications, the groundplane side of the PCB has both the upper antenna and the lower antenna visible. The upper arm and the lower arm of the upper dipole antenna are both positioned on the same groundplane side of the PCB. The upper arm and the lower arm of the lower dipole antenna are both positioned on the same groundplane side of the PCB.

In some applications, the antenna feeds for the upper arms of the first and second dipole antennas are positioned on the circuit side directly opposite the respective upper arms positioned on the groundplane side. The antenna feeds for the upper arms are electromagnetically coupled feeds. Each electromagnetically coupled feed has an open circuit at the end of the respective microstrip line. The length of the electromagnetically coupled feed is approximately ¼ wavelength long from the end of the line to the feed point of the dipole. The feed point for the dipole at the top of the balun is a virtual short circuit.

In some applications, the circuit side has a capacitively coupled dipole that drives an antenna element on the opposite side of the PCB. The driving elements for the lower arms of the first and second dipole antennas are positioned on the circuit side directly opposite the respective lower arms positioned on the groundplane side. The driving elements drive the lower arms by capacitive couplings from the opposite side of the PCB.

BRIEF DESCRIPTION OF THE DRAWINGS

The various features illustrated in the drawings may not be drawn to scale. Accordingly, the dimensions of the various features may be arbitrarily expanded or reduced for clarity. In addition, some of the drawings may not depict all of the components of a given system, method or device.

FIG. 16a shows the front side of the PCB and the components visible on that side according to an example embodiment.

FIG. 16b shows the back side of the PCB and the components visible on that side according to an example embodiment.

DETAILED DESCRIPTION

Figure 1:
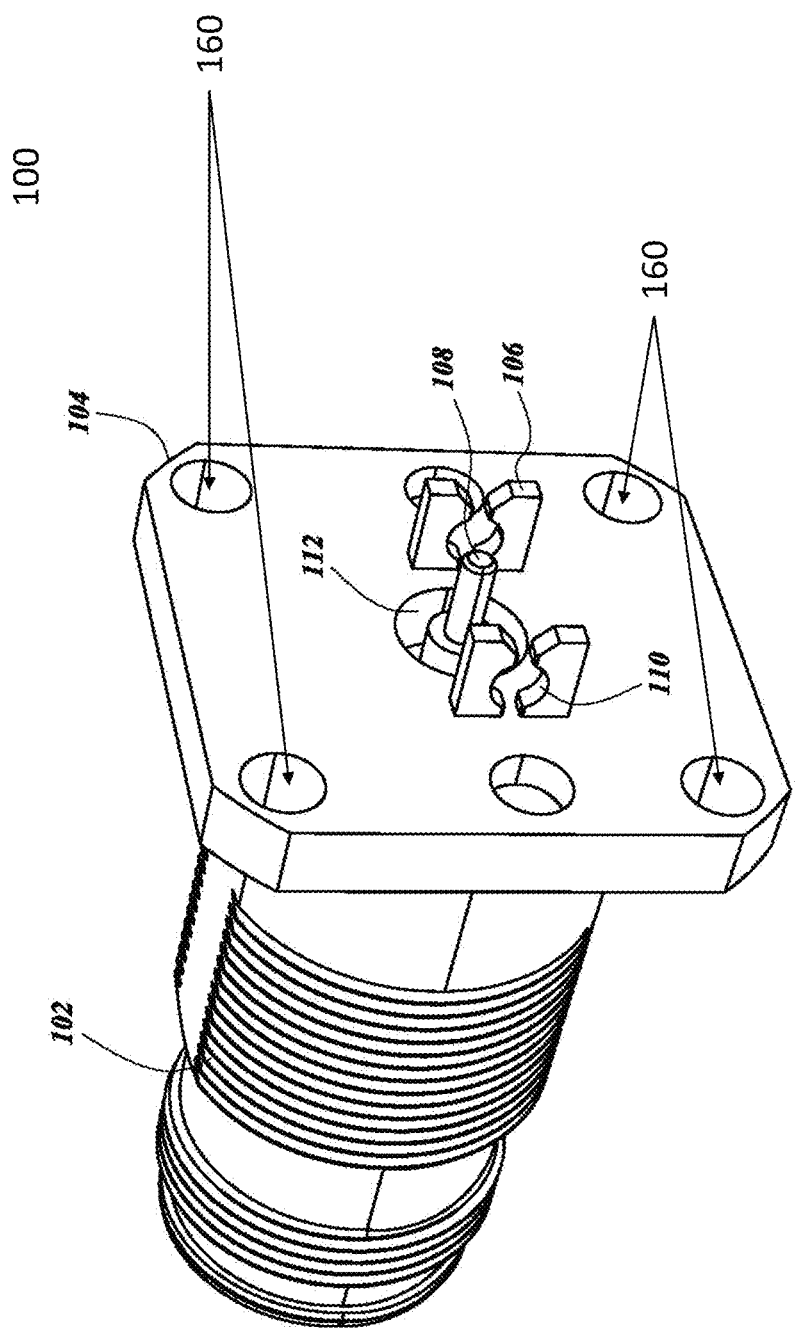
FIG. 1 is a perspective view of a coaxial radio frequency (RF) connector configured to have a low PIM rating or value, according to an example embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Electronic devices are used by billions of people around the world. Many of these devices are capable of wired or wireless communication and/or communicate data and/or power between components or devices. Many of such communications occur over radio frequencies (RF) and, thus, utilize RF communications. RF communications may occur at various frequencies, from frequencies in the low kilohertz (kHz) range to the megahertz (MHz) or gigahertz (GHz) ranges. For example, RF communications can occur within a frequency range from 100 MHz to 85 GHz in certain applications.

RF Connector

A coaxial radio frequency (RF) connector is an electrical connector usually designed to work at radio frequencies in the multi-megahertz range. RF connectors are typically used with coaxial cables and are designed to maintain the shielding that the coaxial design offers. Mechanically, RF connectors may provide a fastening mechanism, such as threads, bayonets, braces, blind mates, and springs for a low ohmic electric contact. RF connectors may be used for television receivers, two-way radio, certain Wi-Fi devices with removable antennas, and industrial or scientific measurements instruments using radio frequencies.

RF communications are subject to interference that may reduce performance of RF communication devices. The interference may be caused by nonlinearities in the RF communication devices. Various techniques exist for improving performance of (and thus, reducing interference within) active components of the RF communication devices. However, nonlinear effects generated by passive components of the RF communication devices may be unknowingly neglected. These nonlinearities, though caused by passive components, may undesirably impact performance of the RF communications devices.

For communications occurring at any radio frequencies, passive intermodulation (PIM) of the passive component(s) of the RF communication device may cause at least some of the nonlinear effects described above. PIM is the generation of interfering signals caused by nonlinearities in the electrical connection between mechanical components of a wireless system. Two signals may mix together, for example by amplitude modulation, to produce sum and difference signals and products within the same band, causing interference. Poor passive intermodulation performance degrades the voice quality and data rate between the base station and the handset. Any connection between materials works like a diode. The effect of differences between frequencies and their mixing to create harmonics results in interference. The problem may be minimized by using good galvanic contacts. Properly done solder may do a good job but cold soldered joints may not. Cold soldering occurs when the material being soldered to is not hot enough to knit together with the hot solder. The solder melts and solidifies on the material rather than intertwining with it. Such a cold solder joint does not have a good electrical path and introduces variations in electrical transmission. In a circuit, such nonlinear effects may introduce interference and/or otherwise cause reductions in radio reception and/or useable bandwidth at specific radio frequencies.

A receiver may be capable of receiving signals just above the thermal noise floor. The total thermal noise power (kTB) is a function of three quantities, Boltzmann's constant "k" in Joules/° K, temperature in ° Kelvin, and the overall bandwidth of the channel selective filtering in the receiver. This is referred to as "Thermal Noise" because of the dependency on temperature. Sometimes the term kTB noise floor is used.

A receiver may be able to work at 16 orders of magnitude difference in power level from the transmission level. Old analog cellular systems always manifested audible crackles and pops that stemmed from interference. In those cases, two surfaces, metal or plastic, came together to form a non-linear junction, or connection. That interface may create a poor diode and a diode can create mixing that result in harmonics within the same frequency band as the desired signals. A tone at frequency one and a tone at frequency two may have a difference of frequency number three, which is within the intended reception range of the antenna system. That artificial signal at frequency three formed by the difference of a real signal at frequency one and a real signal at frequency two may form a passive intermodulation tone. This noise comes from the difference between the two frequencies.

When a transmitter operates at a high power and the receiver is capable of very sensitive reception, these erroneous signals that represent interference between legitimate signals are strong enough to be received and interpreted as noise. This intermodulation noise is on frequency and is difficult to filter and hence is a direct interferer. In analog days, systems could endure the problem because the systems didn't have much discrepancy between the transmit power and the receive power. Today's systems push reception to the lowest possible limits and avoiding passive intermodulation-based noise caused by harmonic interference requires passive intermodulation to be nearly perfect.

Reducing passive intermodulation requires good galvanic contacts between objects. A well-connected soldered interface may create a good galvanic contact. A cold soldered joint doesn't have good galvanic contact and will create measurable passive intermodulation. Solder joints should be wetted properly which means that the objects being soldered are above the melting point of the solder. Heating metals creates voids in the crystalline structure of the metal that solder can connect. When the crystalline structures in the metal cool back down it can create a tight joint. If the solder melts without the underlying metal heating up enough to open the crystalline structures, the cooled metal doesn't have a good contact between the interfaces.

In some embodiments, various aspects of the passive device cause the non-linear properties. For example, interactions by mechanical components with one or both of the signals may result in at least a portion of the non-linear properties. Junctions of different metal components and/or different metals may be a particular source for PIM, thereby making loose cables, dirty or loose connectors, loose or rusty mounting hardware, poorly fastened mounting components, and so forth potential sources of PIM. The PIM rating of a component may be indicative of how much passive intermodulation is introduced by the component. A poor PIM rating may represent a higher amount of passive intermodulation introduced.

Due to the to close frequency spacing of frequency duplexed radios used in RF communications, PIM can present significant issues in such communications, such as creating interference and/or reducing sensitivity. Such issues can aggregate to prevent RF communications altogether. As such, PIM can create problems for service providers and equipment manufacturers alike. Thus, manufacturers and users of the passive devices that introduce PIM (for example, connectors, cables, cable assemblies, and so forth) wish to access improved connectors and similar components with improved PIM values for various frequency ranges.

In some embodiments, a design of the corresponding devices considers the PIM of the resulting device. For example, the corresponding devices may be designed to minimize PIM at one or more operational frequencies of the devices. In some embodiments, designing the devices to minimize PIM may comprise selecting particular materials for one or more components of the devices and/or designing the one or more components to reduce PIM. Details of some design considerations to reduce PIM in devices such as RF connectors are provided below.

In some embodiments, the PIM of a particular RF connector may be influenced by characteristics of mechanical and conductive (thermal and electrical) connections associated with the RF connector. For example, solder connections of the RF connector introduce PIM if the solder connections heat too slowly or cool too quickly during the soldering process. For example, cold soldering is known to introduce PIM with RF connectors. Accordingly, the PIM of the RF connector (and any remaining assembly) may be reduced and/or otherwise controlled by controlling the temperatures of various components of the RF connector during the soldering process (for example, when soldering the RF connector to a PCB). In some embodiments, the temperatures of the RF connector can be controlled actively or passively.

However, actively controlling component temperatures during soldering may be impractical or costly during fabrication and/or manufacture. Passive temperature control during soldering may include adjusting a physical property (for example, the size, shape, and/or material of one or more components of the RF connector). Details of different methods of controlling temperature during soldering and similar manufacturing processes and/or operation of the RF connector to control the PIM of the RF connector are provided below. The details provided herein allow for a PIM rated connection between the RF connector and the PCB regardless of whether or not a coaxial connector is used.

In some embodiments, the circular opening on the connector arms creates a thermal barrier to allow the end of the connector arm to approach the needed temperature for soldering without allowing all of the heat transferring to the rest of the connector body. Heat flow is proportional to cross sectional area. The cutouts in the connector arms create a thermal resistor to allow heat to remain at the tip of the connector arm during soldering. That may allow a soldering iron to heat the tip to the appropriate temperature without the heat flowing into other components that may be damaged by the heat. The design allows the connector arms to heat up and create better solder connections to reduce passive intermodulation.

The same principals apply to the center pin connection as apply to the connector arm connection. However, in some embodiments, the center pins have low mass and connect to plastic pieces with poor thermal conductivity. Careful soldering is required to heat up the pins without melting the plastic parts. Parts may be hand or machine soldered.

FIG. 1 is a perspective view of a coaxial radio frequency (RF) connector 100 configured to have a low PIM rating or value, according to an example embodiment. The illustrated RF connector 100 is an edge launch connector. Though the RF connector 100 is shown as a coaxial connector, the coaxial connector can be replaced with any other suitable type of connector and/or connection while maintaining the benefits and details described herein. In some embodiments, the RF connector 100 enables connecting of a pad and/or trace of a printed circuit board (PCB) to a cable, conductor, or other connector. This can electrically connect an RF component on the PCB to coaxial connector of the RF connector 100. For example, the RF connector 100 can connect an antenna of the PCB to a device or component that drives the antenna to transmit data and/or power or receives data and/or power from the antenna.

As shown, the RF connector 100 includes a connector portion 102 to which a coaxial or other cable or connector may be coupled. In some embodiments, the connector portion 102 is threaded as illustrated. Alternatively, a connector portion can be unthreaded and/or partially threaded and is part of a coaxial or other type of connection. The RF connector 100 also comprises a body 104. The body 104 may be constructed of metal or another suitable conductive material to connect the RF connector 100 to a device housing, frame, or other support structure. For example, the body 104 includes one or more apertures 160 or holes with which the body 104 is coupled to the support structure. In some embodiments, the holes provide for proper alignment of the PCB with the RF connector 100. The holes may have flattened bottoms so that the PCB better engages with the holes. In some embodiments, the one or more apertures may also or alternatively provide cooling of the body 104 and, accordingly, any coupled thermally conductive components. In some embodiments, the body 104 is thermally and/or electrically conductively coupled to the connector portion 102 and forms part of a ground or common connection for the RF connector 100.

The RF connector 100 further comprises a plurality of connector arms 106. The connector arms 106 may be arranged in pairs such that the PCB is positioned between a pair of connector arms 106 and held relatively in place mechanically. In some embodiments, the connector arms 106 may be thermally and/or electrical conductively coupled to the body 104 and/or the connector portion 102. The connector arms 106 may contact the PCB at one or more locations. Multiple pairs of connector arms 106 may ensure that the PCB is held in place such that at least one portion of the PCB contacts a center pin 108 of the RF connector 100. The center pin 108 may be isolated from the thermally and/or electrically conductive body 104 and/or connector portion 102. In some embodiments, the center pin 108 may convey information and/or data, for example from within a cable, etc., to the PCB, or vice versa.

In some embodiments, one or more of the connector arms 106 have an end (for example, opposite the end coupled to the conductive body 104) that couples to the PCB 201. In some embodiments, this end of the two conductive arms 106a and 106b are pointed or otherwise shaped to enable conductive coupling with the two conductive pads 202a and 202b, respectively. In some embodiments, the shape of the end of the connector arms 106 is determined based on manufacturing conditions and constraints.

In some embodiments, one or more of the connector arms 106 includes a cutout or thermal relief portion 110. The cutout 110 reduces a thickness of the connector arms 106 at one or more locations of the connector arms 106. Accordingly, temperature changes on one of the sides of the cutout 110 may be more slowly conveyed to the other side of the cutout 110 due to the reduced quantity of material to convey heat across the cutout 110, as will be described in further detail below. Thus, the cutout 110 provides a thermal relief that allows for, for example, proper solder joints to be created. With straight connector arms that do not employ the cutout 110, solder joints and/or connections may not properly wet out, thereby reducing PIM performance of corresponding antennas and components. The cutout 110 may represent a portion of the connector arm 106 that separates the connector arm 106 from the PCB 201 in FIG. 2 and thus creates a portion of the connector arm 106 that is spaced apart from the PCB 201. For example, when the cutout 110 is a semicircle as shown in FIG. 1, a portion of the connector arm 106 above the cutout 110 relative to the PCB 201 may correspond to the portion spaced apart from the PCB.

The cutout 110 may also provide for a "spring" type action for the connector arms 106, thereby allowing the connector arms 106 to mechanically engage and hold the PCB within nominal tolerance dimensions. Accordingly, connection angles and gap tolerances between the PCB and the solder points on the connector arm 106 may be more accurately controlled. By more accurately controlling the soldering locations, alignment of components, and soldering temperatures, the PCB and the RF connector 100 may be coupled in a manner that improves first pass test yields for PIM, return loss, insertion loss, and isolation.

In some embodiments, an insulator 112 exists between the center pin 108 and the body 104 to thermally and/or electrically isolate the center pin 108 from the body 104. For example, the insulator 112 may comprise air, plastic, rubber, or any other substantially non-conductive material. The insulator 112 separates the center pin 108 from the body 104 so that signals received via the center pin 108 are not affected by properties of the body 104.

Figure 2:
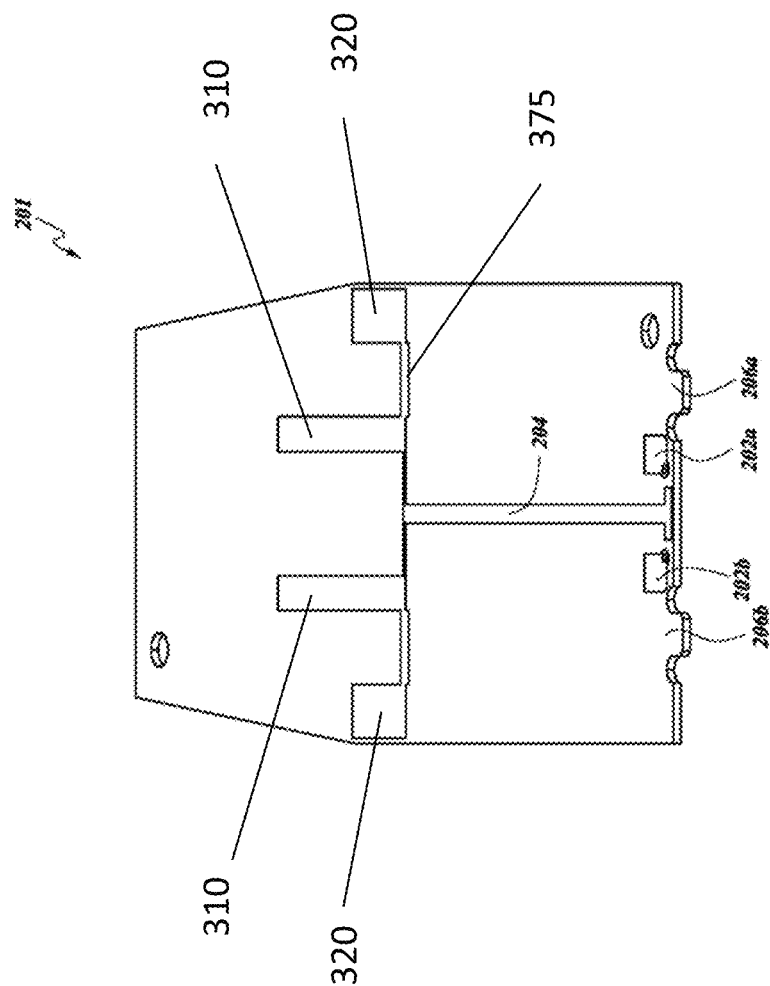
FIG. 2 is a top view of a printed circuit board (PCB) configured to connect to the coaxial RF connector of FIG. 1, according to an example embodiment.

FIG. 2 is a top view of a printed circuit board (PCB) 201 configured to connect to the RF connector of FIG. 1, according to an example embodiment. The PCB 201 may be used as a base for a circuit or component to or from which data and/or power is conveyed via the RF connector 100. The PCB may include one or more traces to convey the data and/or power.

The PCB 201 has a first face that is shown in FIG. 2. The first face of PCB 201 includes two conductive pads (or ground pads) 202a and 202b disposed near an edge of the PCB 201. The conductive traces on the PCB 201 may be formed from one or more conductive materials, including copper, tin and other similar materials. Between and electrically isolated from the two conductive pads 202a and 202b is a conductive trace 204 that extends from near the same edge of the PCB 201 and leads to additional conductive traces and/or other components disposed on the PCB 201 (not shown in this figure). In some embodiments, the additional conductive traces may form an antenna or transmission line or may couple to another RF component of a device (not shown in this figure). The antenna can be a micro strip based antenna, for example. Examples of other RF components on a PCB that can be electrically connected to the RF connector 100 include without limitation RF filters, RF combiners, RF switches, matching networks, power amplifiers, low noise amplifiers, and the like. In some embodiments, not shown in this figure, the two conductive pads 202a and 202b may pass through the PCB 201 to one or more common conductive pads, as described in further detail below.

The PCB 201 includes two fingers 206a and 206b that may be inserted into a mechanical receptacle or portion of the body 104 of the RF connector 100 of FIG. 1 (for example, one of the holes of the body 104). As shown in FIG. 2, the two fingers 206a and 206b of the PCB 201 extend from the same edge along which the two conductive pads 202a and 202b and the conductive trace 204 are generally positioned. In some embodiments, the fingers 206a and 206b have a flat surface that engages with the sides of the holes of the body 104.

Figure 3:
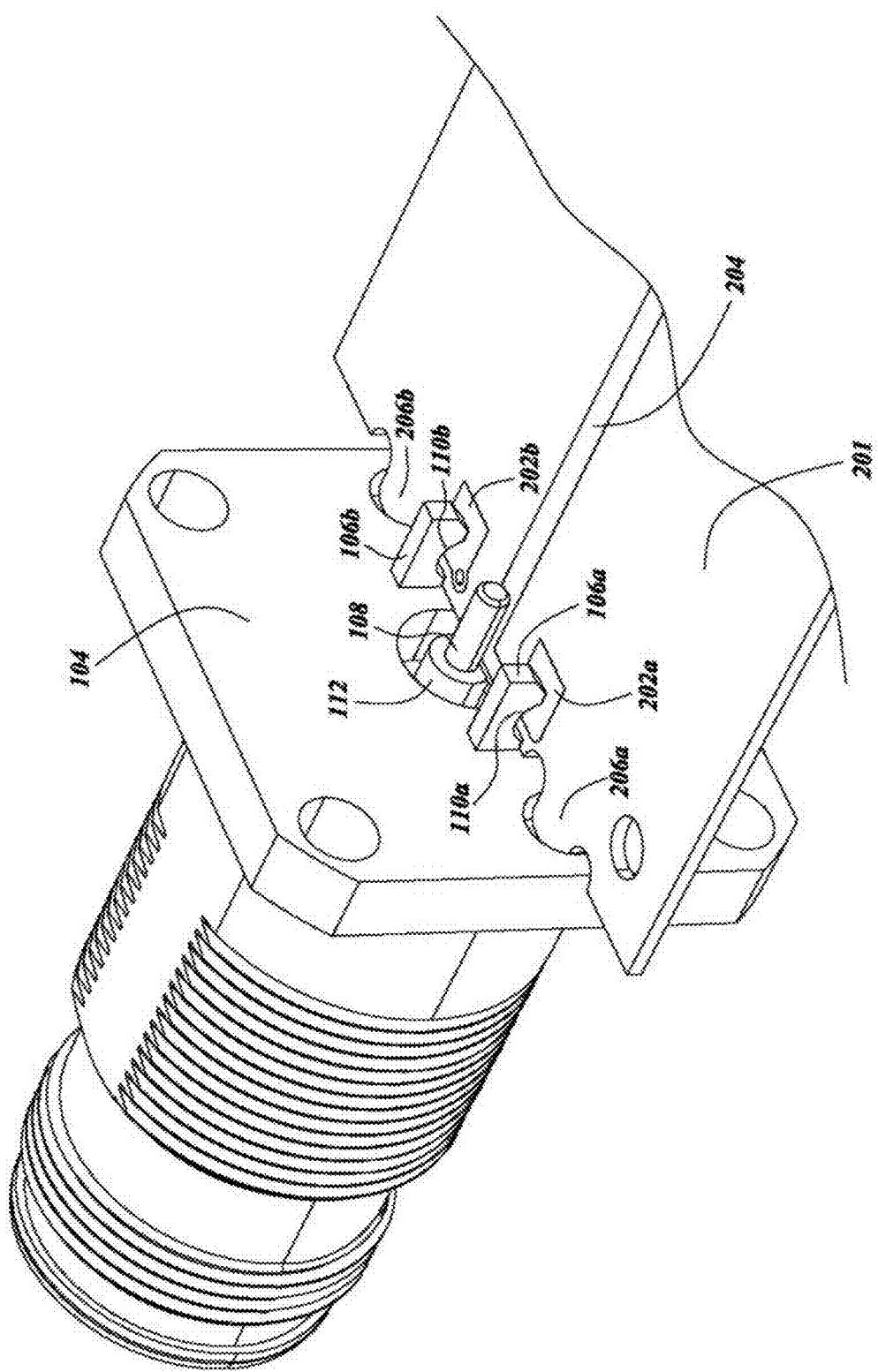
FIG. 3 is a perspective view of the PCB of FIG. 2 coupled to the coaxial RF connector of FIG. 1, according to an example embodiment.

FIG. 3 is a perspective view of the PCB 201 of FIG. 2 coupled to the RF connector 100 of FIG. 1, according to an example embodiment. When the PCB 201 has an antenna thereon, the PCB 201 and the RF connector 100 are included in an antenna assembly. As shown in FIG. 3, the PCB 201 is disposed such that a thickness of the PCB 201 fits between the pairs of connector arms 106. In some embodiments, a gap between each conductive arm of the pair of conductive arms is substantially equal to a thickness of the PCB 201 such that when the PCB 201 is inserted into the gap between pairs of conductive arms 106, the PCB 201 is substantially held in place by friction and/or compression forces. The fingers 206a and 206b may be inserted, at least in part, into two holes of the body 104 to provide additional mechanical support and alignment to the PCB 201. By being positioned with the fingers 206a and 206b within the holes of the body 104 (at least in part) and between the pairs of the connector arms 106, the PCB 201 is generally prevented from moving.

Furthermore, each connector arm 106 of each pair of connector arms 106a and 106b may be electrically coupled or connected to one of the two conductive pads 202a and 202b, respectively. For example, each connector arm 106 may touch one of the conductive pads 202 at one or more locations. As such, when the connector arms 106 are part of a ground or common circuit or connection, the corresponding two conductive pads 202a and 202b are part of the ground or common circuit or connection of the PCB 201. Similarly, the center pin 108 of the RF connector 100 may be positioned to contact the conductive trace 204. As such, any data and/or power signals conveyed to and/or through the center pin 108 of the RF connector 100 may be communicated between the center pin 108 and the conductive trace 204. Thus, any signals communicated via an antenna of the PCB 201 and/or any other device of the PCB 201 or connected to the PCB 201 may be communicated via the conductive trace 204. Using the RF connector 100, the PCB 201 can be connected to a coaxial cable or similar component or cable.

In some embodiments, the connector arms 106 each have cutouts or portions 110 of the connector arms 106 removed in space between the body 104 and the location where each connector arm 106 touches its respective conductive pad 202. In some embodiments, the connector arm 106a has a cutout 110a in the shape of a semicircle. Alternatively, any other suitable shape cutout may be used, such as an oval, square, rectangle, triangle, or other polygon or geometric shape. In some embodiments, the shape and/or size of the cutout 110a in relation to the shape and/or size of the connector arm 106a is determined based on a relationship between the shape and/or size of the connector arm 106a and/or thermal conductive properties of the connector arm 106a. In some embodiments, a cross-section and/or other size, density, shape, and similar properties of the connector arms 106 impacts the size, shape, and/or location of the cutout 110. In some embodiments, a plurality of cutouts 110 may exist on each connector arm 106. For example, two cutouts 110 may be placed on the connector arm 106a along a same edge of the connector arm 106a (for example, the edge closest to the PCB 201). Alternatively, or additionally, the cutouts 110 may be placed on different edges of the connector arm 106. In some embodiments, a location of the cutout 110 on the connector arm 106 relative to where the connector arm 106 contacts the conductive pad 202 on the PCB 201.

In some embodiments, as described in brief above, the PIM of the RF connector 100 may be controllable by controlling the temperatures of components of the RF connector 100 during manufacture and/or assembly. The cutout 110 may provide multiple benefits to the RF connector 100. For example, the cutout 110 enables additional air cooling by permitting air to flow through the cutout 110 and cools the RF connector 100 and the connector arms 106. Additionally, the cutout 110 may reduce an amount of heat that is conveyed by the connector arm 106 across the cutout 110 to the body 104. For example, because the cutout 110 reduces an amount of material of the connector arm 106 where the cutout 110 exists, less heat can be transferred from one end of the connector arm 106 (on one side of the cutout 110) to the other end of the connector arm 106 (on the other side of the cutout 110). This allows the components at the interface between connector arm 106 and pads 202 to reach the required temperature for soldering.

The pin 108 and arms 106a and 106b of RF connector 100 can be soldered to respective conductive features on the PCB 201. As arranged in FIG. 3, the RF connector 100 can achieve low PIM values. For example, the RF connector 100 having the features described herein and soldered to the PCB 201 can have a PIM better than −140 decibels relative to the carrier (dBc). In some instances, the PIM of the RF connector 100 can be between −150 dBc and −165 dBc. RF connectors having a PIM value not between −150 dBc and −165 dBc or better for third-order PIM (when testing with two carriers at 43 dBm output power each) may be unusable for duplexed radio/telecommunications applications for any communications that occur at frequencies of and between 100 MHz and 85 GHz. However, some embodiments of the RF connector 100 described herein have a PIM falling within this range and, thus, are desirable for duplexed radio/telecommunications applications that occur at frequencies between 100 MHz and 85 GHz.

Figure 4:
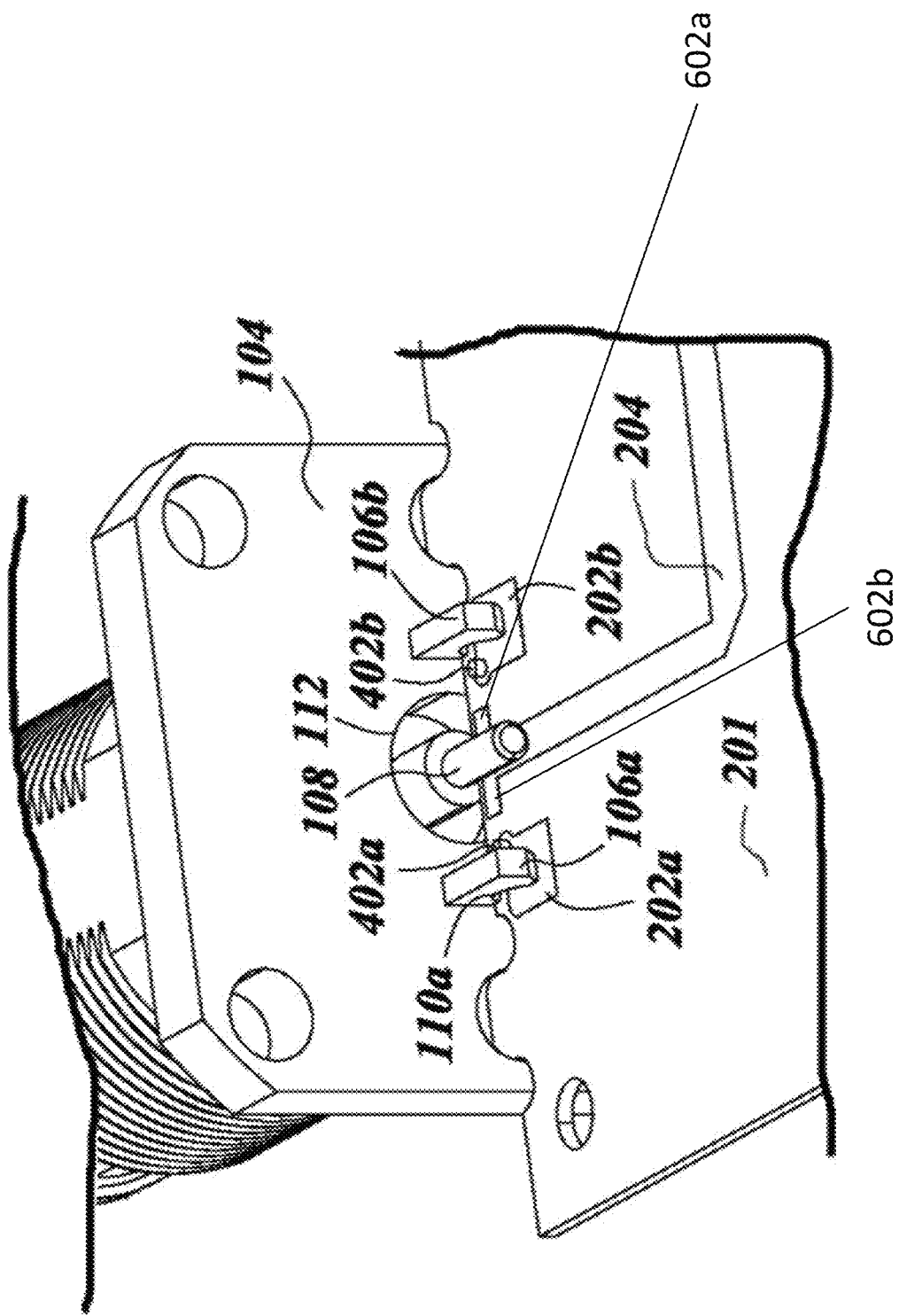
FIG. 4 is a top perspective view of a drawing of a PCB coupled to a coaxial RF connector, according to an example embodiment.

FIG. 4 is a top perspective view of an alternate drawing of the PCB 201 coupled to the RF connector 100, according to an example embodiment. FIG. 4 shows the arrangement of the various components of the RF connector 100 and the PCB 201 introduced above.

The body 104 of the RF connector 100 may be substantially square or rectangular in shape, though any other shape is envisioned. Near the center of the body 104, protruding from a side of the body 104 opposite the connector portion 102, is the center pin 108. FIG. 4 shows that the center pin 108 may have a smoothed or substantially flat surface that contacts the PCB 201, and, more specifically, the conductive trace 204 of the PCB 201. The conductive trace 204 may carry any signals received from the center pin 108 (or transferred to the center pin 108) to/from other components on the PCB 201, not shown here. A substantially flat surface of the center pin 108 may provide a desirable physical and electrical connection between the center pin 108 and the conductive trace 204. In some embodiments, the center pin 108 is substantially round and the flat surface of the center pin 108 represents the soldered connection of the substantially round center pin 108 to the conductive trace 204. Connected to the conductive trace 204 near the interface to the center pin 108 are two tuning tabs, 602a and 602b. The size and location of these tabs may alter the tuning of the electrical elements on the PCB 201 in some embodiments.

On either side of the center pin 108, also protruding from the side of the body 104 opposite the connector portion 102, are the two conductive arms 106a and 106b. Not shown in FIG. 4 (but previously shown in FIGS. 1 and 3 above) are bottom conductive arms that form pairs with the conductive arms 106a and 106b to help hold the PCB 201 in place mechanically, as described above. Thus, the bottom conductive arms can also protrude from the same face as the two conductive arms 106a and 106b. When the PCB 201 is inserted into the gap between pairs of conductive arms 106, the PCB 201 may be generally held in place with the center pin 108 in contact with the conductive trace 204 and the conductive arms 106a and 106b in contact with the two conductive pads 202a and 202b, respectively. In some embodiments, as described above, the two conductive arms 106a and 106b have ends that are pointed or otherwise shaped to enable conductive coupling with the two conductive pads 202a and 202b, respectively. The connection of the two conductive arms 106a and 106b to the two conductive pads 202a and 202b may be shown having a flat joint (as seen in FIG. 4) due to the soldered connection of the shaped two conductive arms 106a and 106b to the two conductive pads 202a and 202b.

As shown in FIG. 4, the insulator 112 maintains electrical isolation between the center pin 108 and the body 104, while the body 104 and the conductive arms 106 are electrically connected.

Additionally, FIG. 4 shows two pins 402a and 402b that extend away from a surface of the two conductive pads 202a and 202b, respectively, and the first face of the PCB 201. The two pins 402a and 402b ensure that the two conductive pads 202a and 202b, respectively, are electrically connected to a common conductive trace on an opposite (or second) face of the PCB 201 (not shown in this figure). The two pins 402a and 402b may be formed from the same material as the two conductive pads 202a and 202b or any other conductive material (for example, gold, copper, and so forth).

FIG. 4 also shows the cutouts 110a and 110b in the conductive arms 106a and 106b, respectively. In some embodiments, the cutouts 110a and 110b provide an air gap between a portion of the conductive arms 106 and the first face of the PCB 201. As such, the cutouts 110a and 110b may aid in cooling the conductive arms 106a and 106b, respectively, while and/or after the conductive arms 106a and 106b are connected to the PCB 201 and/or while conveying any signals between the RF connector 100 and the conductive traces of the PCB 201. Additionally, the cutouts 110 provide cooling for the RF connector 100 in general, as any thermal heat conveyance between components of the RF connector 100 on different sides of the cutouts 110 may be reduced due to the cutouts 110. The cutouts 110 may also provide a thermal resistance between far end of arms 106 and the body 104. This may also allow for soldering of the far end of arm 106 to the pad 202 and 502 in FIG. 5.

Figure 5:
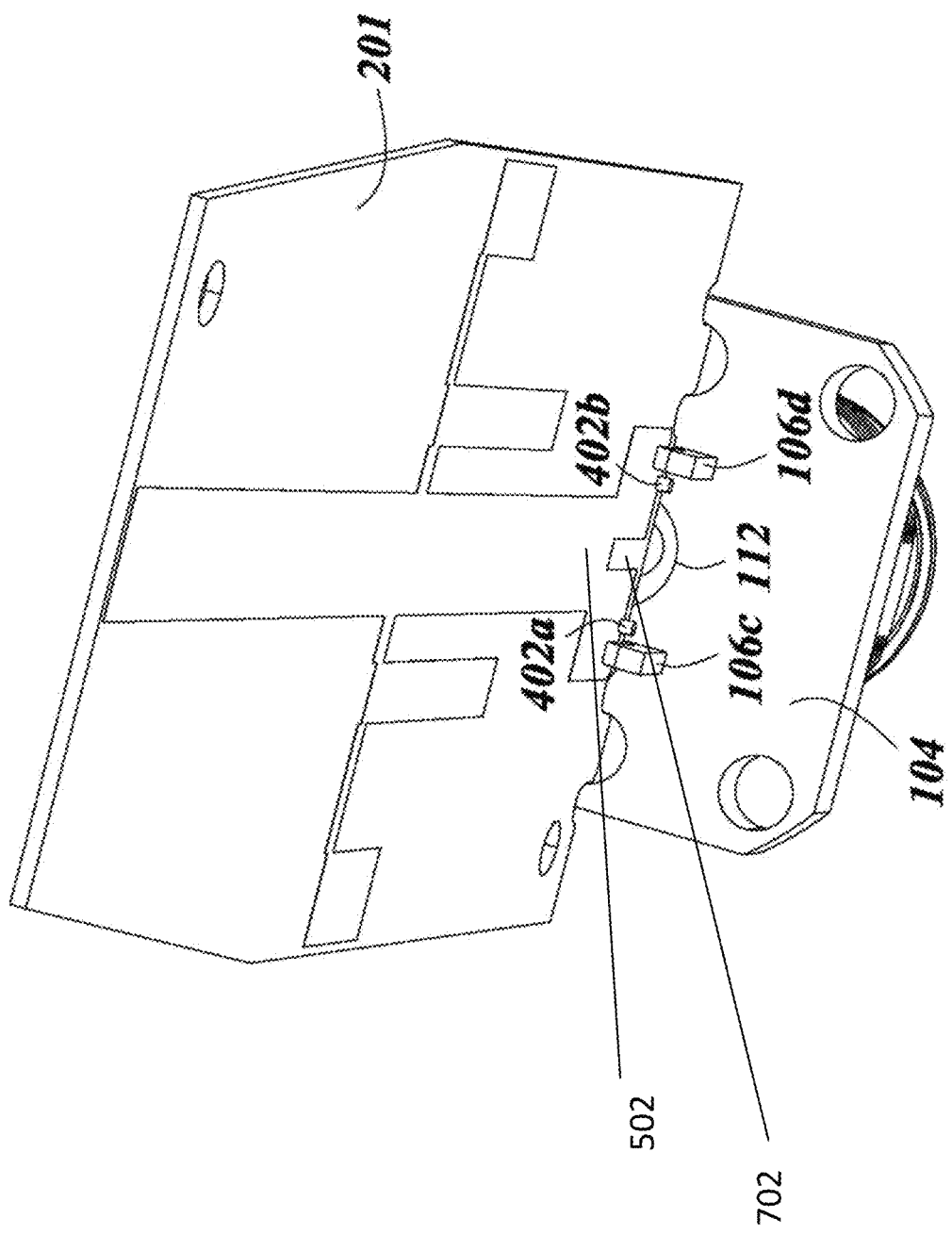
FIG. 5 is a bottom perspective view of the PCB and coaxial RF connector of FIG. 4, according to an example embodiment.

FIG. 5 is a bottom perspective view of the drawing of the PCB 201 of FIG. 4 coupled to the RF connector 100, according on an example embodiment. FIG. 5 shows the second face of the PCB 201. As described above, the second face of the PCB 201 includes the common conductive trace 502. The common conductive trace 502 may cover most of the second face of the PCB 201 as shown in FIG. 5. Additionally, the two pins 402a and 402b described above with reference to FIG. 4 also protrude through the second face of the PCB 201 and through the common conductive trace 502, providing a conductive path through the PCB 201 between the common conductive trace 502 and the two conductive pads 202a and 202b. FIG. 5 also shows that the two conductive arms 106c and 106d extend from the first face of the body 104 and contact the common conductive trace 502. The two conductive arms 106c and 106d, as described above, are shown having the cutouts 110c and 110d, respectively, between the body 104 and where the conductive arms 106c and 106d contact the common conductive trace 502.

Additionally shown in FIG. 5 is a slot 702 on the PCB 201 that extends between portions and/or into the common conductive trace 502, according to an example embodiment. In combination, the tuning tabs 602a and 602b and the slot 702 may work together to provide a reflected power ratio (e.g., a voltage standing wave ratio (VSWR) or return loss) match between the RF connector 100 and a transmission line on the PCB 201 (for example, the additional conductive traces on the first face of the PCB 201 that are coupled to the conductive trace 204). In some embodiments, the tuning tabs 602a and 602b and the slot 702 provide the VSWR or return loss match between the RF connector 100 having a 50-ohm (Ω) impedance and the transmission line on the PCB 201 having a 50Ω impedance. The tuning tabs 602a and 602b and the slot 702 may work and/or operate together so that reflections are reduced and/or minimized between the RF connector 100 and the transmission line on the PCB 201. Because the ground signal/circuit travels a circuitous path about the PCB 201, the tuning tabs 602a and 602b and the slot 702 may add capacitance to cancel inductances presented by the RF connector 100 and the transmission line on the PCB 201. Thus, sizes of the tuning tabs 602a and 602b and a size of the slot 702 may be related to each other and to details of the RF connector 100 and the transmission line on the PCB 201. For example, different impedance ratings for either or both of the RF connector 100 and the transmission line on the PCB 201 result in different sized tuning tabs 602a and 602b and the slot 702. Additionally, or alternatively, different sized tuning tabs 602a and 602b may result in different sized slot 702, and vice versa. In some embodiments, external factors result in different sizes for the tuning tabs 602a and 602b and the slot 702. In some embodiments, the tuning tabs 602a and 602b and the slot 702 provide the VSWR or return loss match between the RF connector 100 having a 75Ω impedance and the transmission line having a 75Ω impedance.

Figure 6:
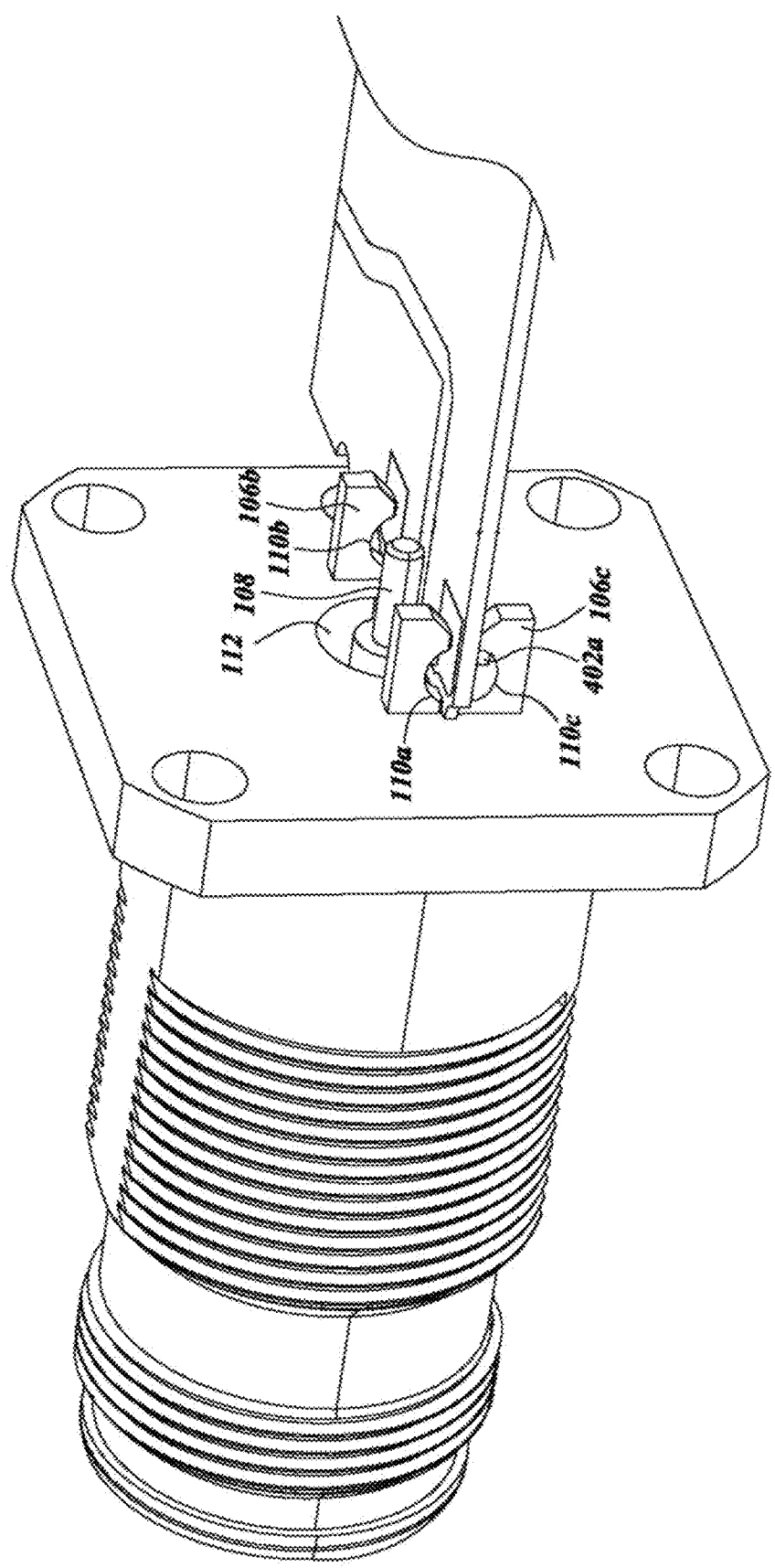
FIG. 6 is a perspective view of the PCB of FIG. 2 coupled to the RF connector 100 of FIG. 1, according to an example embodiment.

FIG. 6 is a perspective view of the PCB 201 coupled to the coaxial RF connector 100 of FIG. 1, according to an example embodiment. FIG. 6 shows how the PCB 201 is held in place between the pairs of connector arms 106. As shown in FIG. 6, each of the connector arms 106 and the body 104 contact the PCB 201, providing stable mechanical support for the PCB 201. As shown, the PCB 201 is positioned between the connector arms 106a and 106c with the edge of the PCB 201 nearest the two conductive pads 202a and 202b, the conductive trace 204, and the fingers 206a and 206b (described above) in contact with the body 104 between the connector arms 106a and 106c. The PCB 201 is similarly positioned between the connector arms 106b and 106d (not shown in this figure) with the edge of the PCB 201 in contact with the body 104 between the connector arms 106b and 106d. Each of the connector arms 106 may contact the PCB 201 at least two locations. For example, the connector arms 106a and 106c hold the PCB 201 at a first location nearest the edge of the PCB 201 (but without contacting either of the conductive pad 202a or the common conductive trace 502). The connector arms 106a and 106c also hold the PCB 201 at a second location such that the connector arm 106a is in contact with the conductive pad 202a and the connector arm 106c is in contact with the common conductive trace 502. The connector arms 106b and 106d, though not explicitly shown in FIG. 6, hold the PCB 201 in place at a first location nearest the edge of the PCB 201 (but without contacting either of the conductive pad 202b or the common conductive trace 502) and at a second location such that the connector arm 106b is in contact with the conductive pad 202b and the connector arm 106d is in contact with the common conductive trace 502.

In some embodiments, the connector arms 106 are formed from the same material as the body 104 or any other suitable metallic material. In some embodiments, the connector arms 106 are exposed to or reach such temperatures (for example, during manufacture and/or operation) that may cause some materials to degrade or lose integrity. As such, the connector arms 106 are formed from a material capable of withstanding such temperatures. For example, the cutouts 110 are designed to allow a portion of the connector arm 106 in contact with the PCB 201 to reach a high soldering temperature for soldering the connector arm 106 to the PCB 201 before the rest of the connector arm 106 and the body 104 reach that temperature. As such, the connector arm 106 can be soldered to the PCB 201 without exposing the entirety of the connector arm 106 and the PCB 201 to the soldering temperature. Additionally, the cutouts 110 also prevent the arms from cooling too quickly after soldering or heat too slowly before soldering. Thus, the cutouts 110 effectively create a thermal resistance or dam between an end of the connector arm 106 that is soldered to the conductive pad 202 and the body 104. The thermal dam prevents heat from soldering the connector arm 106 to the conductive pad 202 from being conveyed to the body 104 before the end of the connector arm 106 soldered to the conductive pad 202 reaches the proper soldering temperature to ensure a solder join that contributes to a well-rated PIM connection. The cutouts 110 provide temperature relief for the connector arms 106 and improve manufacture and/or assembly of the RF connector 100 and the PCB 201. As such, a proper solder joint can be established between the connector arms 106 and the respective conductive traces on the PCB 201 that allows for a very low ohm (for example, less than 1 mΩ) connection between the connector arm 106 and the respective conductive trace on the PCB 201. To obtain the PIM of between −150 dBc and −165 dBc, as described herein, the solder joint between the connector arm 106 and the respective conductive trace on the PCB 201 should have surface junctions that have strong or high electrical contact (for example, be well wetted). This is because when signals pass through the connector arm 106 and the solder joint at radio and/or telecommunication frequencies, currents corresponding to the signals ride on a surface of the conductor. As such, the electrical connection between the connector arm 106 and the conductive trace of the PCB 201 (for example, the solder joint) should be of high quality to ensure that interference and/or loss (non-linear behavior) is not introduced due to the solder joint. This low ohm connection provides for a stable, high performance, PIM rated connection between the RF connector 100 and the transmission line of the PCB 201.

As described herein, the RF connector 100 includes various features and aspects that enable the RF connector 100 to be soldered to the PCB 201 at an appropriate position and/or location (for example, such that the respective connector arms 106 and the pin 108 are electrically connected to the appropriate conductive traces on the PCB 201). These features and aspects ensure that the solder joint between the RF connector 100 and the PCB 201 achieves acceptable PIM performance (for example, between −150 dBc and −165 dBc PIM). The tuning tabs 602 and the slot 702 allow for adjustment of the VSWR of the RF connector 100 and the PCB 201. Thus, the RF connector 100 provides an edge launch connection with the PCB 201, where the cutouts 110 in the connector arms 106 provide for a stable and repeatable manufacturing (for example, soldering) process for connecting the connector arms 106 to their respective conductive pads 202 on the PCB 201.

Figure 7:
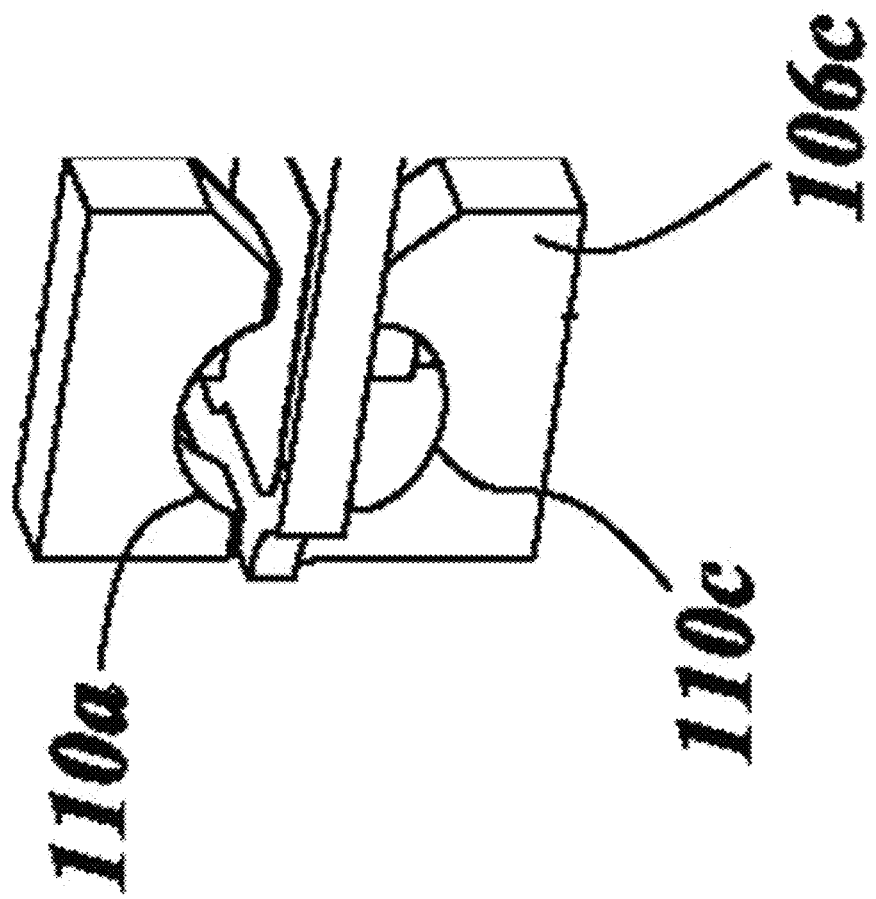
FIG. 7 is an enlarged view of connector arms interfacing with a PCB according to an example embodiment.

FIG. 7 specifically identifies a PIM reducing feature of some embodiments (for example, the cutouts 110a and 110c) of the coaxial RF connector 100 as shown with reference to FIG. 6.

WiFi Dipole

The present disclosure also relates generally to circuits and device components configured to provide an antenna, and more specifically, to providing an antenna for wireless communication having a single printed circuit board configuration to create a 6 dBi omni-directional WiFi antenna.

An antenna cannot increase the power provided by a transmitter, but only affects the direction in which it radiates power. Correspondingly as a receiver, an antenna is most receptive to signals from the directions the antenna would radiate as a transmitter. While an antenna may exclusively transmit or receive, in the WiFi range, antennas typically perform both transmit and receive functions.

In some applications, it may be desirable to provide an omni-directional antenna. Antennas often focus the transmission or reception of signals in particular directions. An omni-directional antenna seeks to avoid a preferential direction. While such non-directivity may seem a default pattern, most antennas have directionality built-in by their design and an omni-directional antenna must be specifically designed to approximate this non-preferential direction objective.

A collinear sleeved dipole design has an excellent circular, omni-type, antenna pattern. However, this type of antenna is very hard to produce in a cost effective manner when high performance passive intermodulation (PIM) is required, meaning minimizing PIM.

In some cases, an omni-directional antenna has been designed and made with a tube and coil construction. However, there are some challenges associated with a tube and coil design and construction for omni-directional antennas. Tube and coil designs have a very narrow bandwidth. Additionally, in some applications, a tube and coil omni-directional antenna does not have a stable elevation pattern.

Most designs intend an antenna to radiate mostly in the horizontal plane and less in the vertical plane. Antenna designers often seek to maximize radiation in the horizontal plane. An unstable elevation pattern means an antenna does not have its maximum at the horizontal. At different frequencies, an unstable pattern may have a maximum either above or below horizontal.

A whip antenna is an unbalanced line that must pair with a groundplane. As an example, a whip antenna may extend from a car for a CB antenna, or an AM/FM radio antenna. The best place to locate the whip antenna would be in the center of a metal roof. The metal roof would act as a groundplane and if the whip is located in the center it would optimize the omni-directional coverage. In some circumstances, a large groundplane is not a possible component of the design. WiFi Antennas are often mounted where a large ground plane isn't possible.

In some other cases, an omni-directional antenna has been designed and made with multiple printed circuit boards to construct the antenna. However, there are some challenges associated with a multiple printed circuit board design and construction for omni-directional antennas. For example, multiple circuit boards require transmission lines to carry signals between boards. Those transmission lines inherently require connections to the boards at each end. Any transition between a transmission line and a circuit board carries the possibility of poor electrical connectivity leading to passive intermodulation.

Large PCBs are expensive. The relationship between the size of a PCB and its cost is non-linear. When elements on a PCB require large spatial separation, putting those elements on separate PCBs connected by coaxial wire is typically the only fiscally feasible solution. Such connections with coaxial between boards, however, increase the problems caused by passive intermodulation.

Neither the tube and coil configuration antennas, nor the multiple circuit board configuration antennas, has been designed or constructed to meet the passive intermodulation requirements of the antenna and radio platform.

The term antenna may refer to the entire structure for transmitting and receiving signals. The active portion may be called the radiating element. Other portions of the antenna may be reflective elements or parasitic elements, both of which alter the antenna's pattern. Additionally, a radome may cover, or surround, an antenna to protect the antenna components from sun, weather, or other external factors.

For a radio, either a transmitter or a receiver, to deliver power to an antenna, the impedance of the radio and transmission line should be well matched to the antenna's impedance. The parameter Voltage Standing Wave Ratio (VSWR) is a measure that numerically describes how well the antenna is impedance matched to the radio or transmission line it is connected to. Isotropic radiation is the radiation from a point source, radiating uniformly in all directions, with the same intensity regardless of the direction of measurement. The improvement of radiation pattern of an antenna is compared to this idealized isotropic antenna. If the radiation is equal in all directions, then it is known as isotropic radiation. A point source would be an example of an isotropic radiator. However, isotropic radiation is practically impossible, because every antenna radiates its energy with some directivity. The isotropic radiator has unity gain, because the output is the same in all directions. The decibel, abbreviated dB, is a logarithmic scale used in sound and electromagnetic systems. In terms of decibels (dB), an isotropic radiator has 0 dBi gain, and correspondingly zero loss, or is stated to be 100% efficient. When an antenna's gain is compared to an idealized isotropic radiator the increase in directivity is often listed as dBi, where the "i" represents the comparison to the isotropic radiator. An antenna's return loss is a figure that indicates the proportion of radio waves arriving at the antenna input that are rejected as a ratio against those that are accepted. Return loss is also specified in decibels (dB) relative to a short or open circuit (100 percent rejection).

When an antenna is being used in transmit mode. The radio waves from the transmitter are routed via a transmission line to the input flanges of the antenna feed. At all waveguide junctions there is a mechanical mismatch, the size of which will determine the size of the consequential electrical mismatch. Thus, a proportion of the radio waves will be reflected back down the transmission line from the antenna input flange connection. The remainder will continue into the feed system. However any imperfections within the feed system will again cause small amounts of the incident radio waves to be reflected back again towards the input flange. Finally, the radio waves may emerge from the feed aperture and may be radiated onto the parabolic reflector, if used, prior to being directed into the atmosphere towards their intended target. Again, a small percentage of the radio waves will be reflected back from the reflector into the feed system and back towards the input flange. The sum of all the reflected components at the input flange represents the total reflected signal. Return Loss is significant to radio system designers for a number of different reasons. If a large proportion of the incident radio waves are rejected by the antenna, this represents a loss of signal and the antenna efficiency is therefore reduced. Second, in a transmitting system where, for example, the antenna is remote from the radio equipment, rejected radio waves returned from the antenna will travel back down the transmission line to the radio. From there, they will be reflected and returned back up the transmission line to the antenna. A percentage of this returned signal will be radiated and, once again, a proportion routed back to the radio. This secondary radiated component will be a delayed version of the primary signal—the delay being set by the time taken for the signal to travel back down the transmission line to the radio equipment and back again. Secondary radiation will look like an echo signal on the main signal, and this can cause errors in the detection of the desired information at the remote receiver. If the reflected radio waves back into the transmitter are of sufficient magnitude, the transmitter performance can be severely degraded.

The present disclosure describes antenna system embodiments that limit inefficiencies and defects associated with some traditional antenna systems. The present disclosure provides an antenna system for improved wireless communication having a single printed circuit board configuration to create an enhanced omni-directional WiFi antenna with improved distribution characteristics in a simplified compact and economically advantageous design. Some aspects of the disclosure can also be applicable to designs with multiple PCB arrangements, in some other embodiments.

Omni directional antennas often seek a circular pattern of gain for an antenna in the horizontal plane. An idealized electromagnetic dipole creates a circular pattern in the horizontal plane. However this idealized pattern cannot be obtained in practice because of the connections and other elements to drive the antenna. In the vertical plane, a dipole creates a figure-8-shaped pattern with the dipole at the center. Such a figure-8 pattern has nulls directly above and below the dipole. Additionally, such a dipole may radiate more energy above and below the horizon than desired.

Figure 8A:
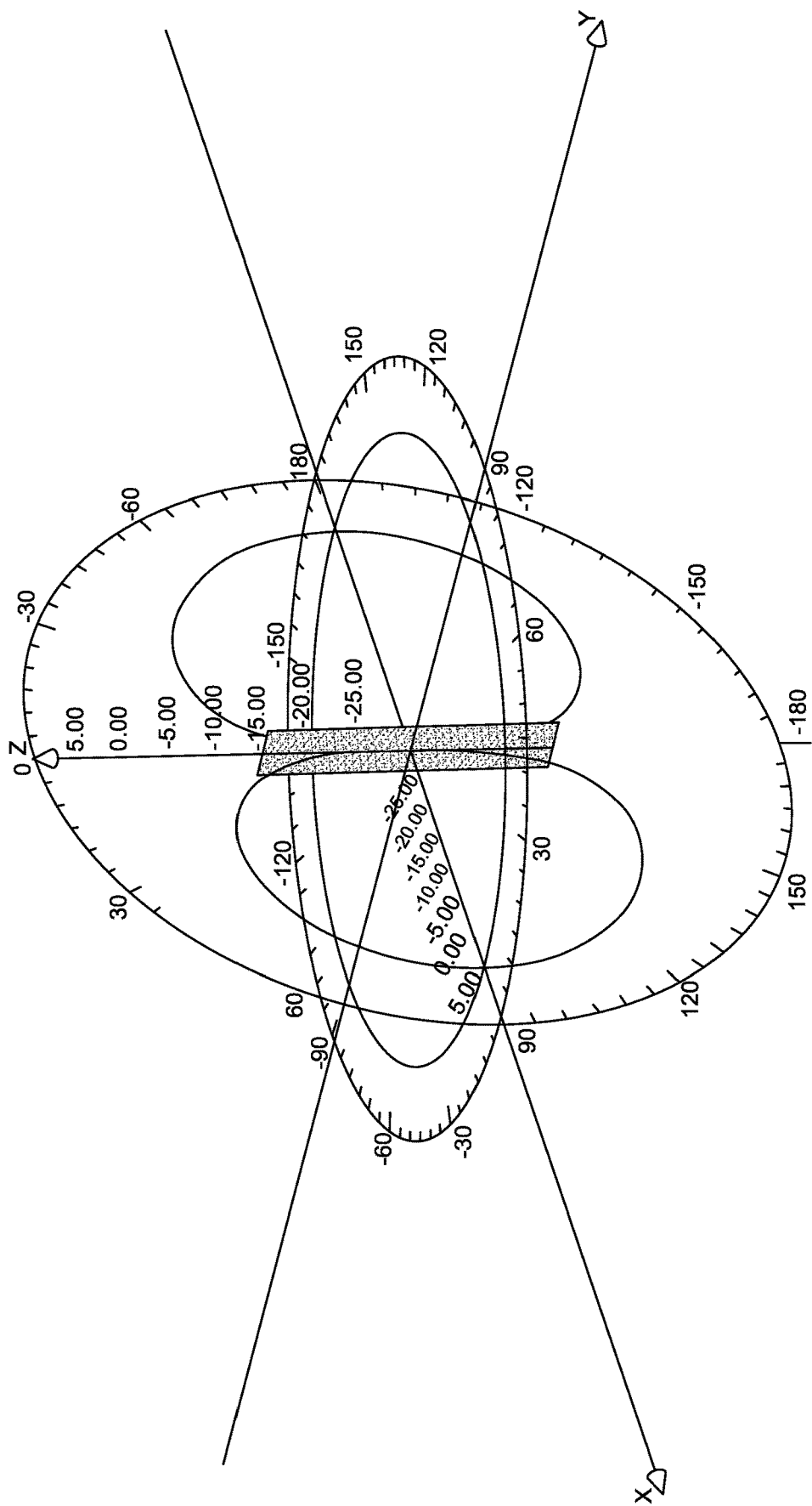
FIG. 8a shows the radiation pattern of an ideal dipole in three dimensions.

FIG. 8a shows the radiation pattern of an ideal dipole in three dimensions. The figure illustrates the circular pattern in the horizontal plane and the figure-8 shaped pattern in the vertical plane. Such an idealized dipole is not possible in practice because once connectors and groundplanes are nearby those components alter the radiation pattern.

Figure 8B:
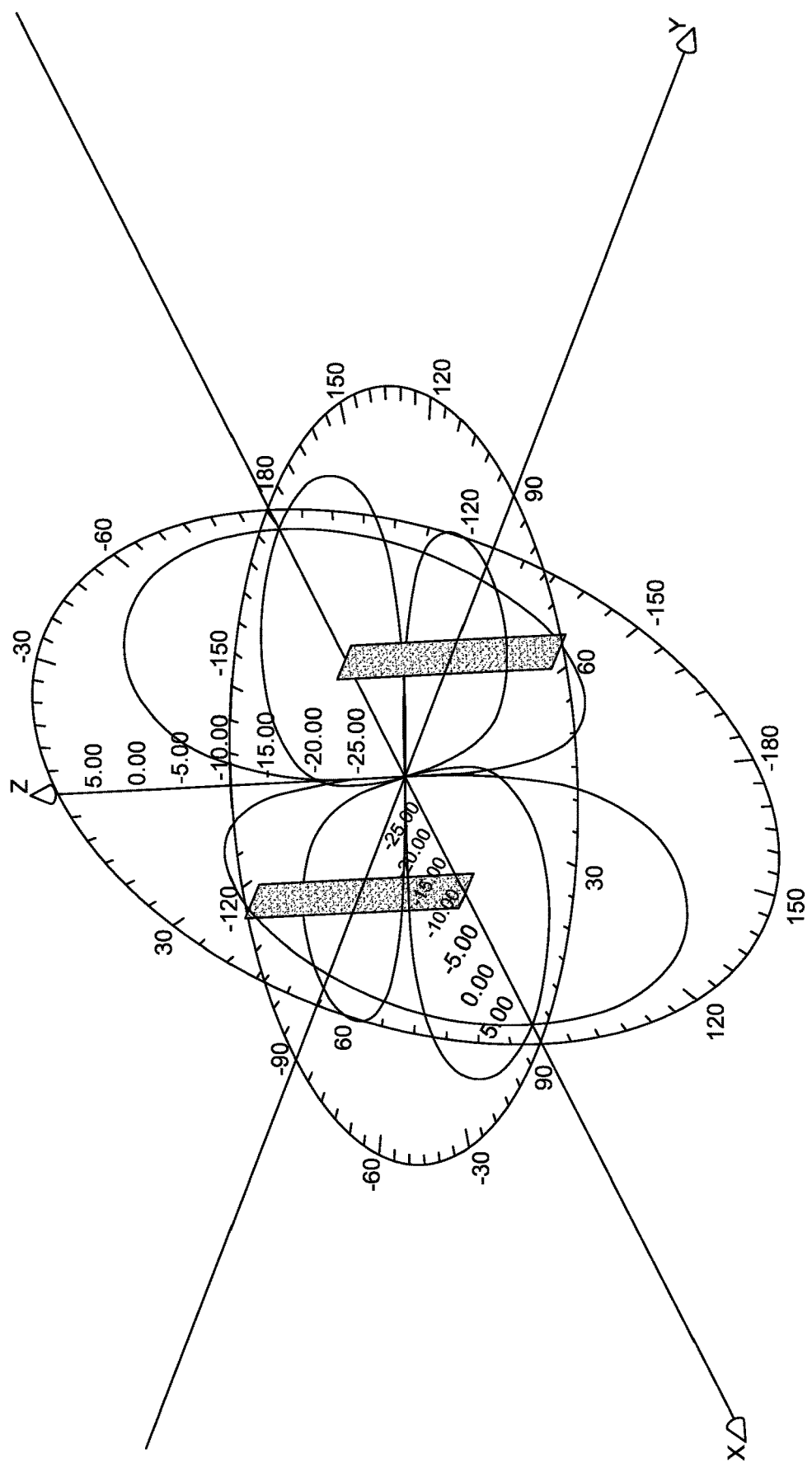
FIG. 8b shows the radiation pattern of an ideal pair of dipoles excited equal power and equal phase in three dimensions.

FIG. 8b shows the radiation pattern of an ideal pair of dipoles in three dimensions. The figure illustrates the same figure-8 vertical pattern as a single dipole. In the horizontal plane, however, the pair of dipoles, excited by equal power and equal phase, create a four-lobbed pattern with nulls at 45, 135, 225, and 315 degrees. The ideal pattern shown is without a groundplane or connectors. However, the addition of a groundplane and connectors to a pair of dipoles does not have as drastic an effect as it does on a single ideal dipole.

Figure 9:
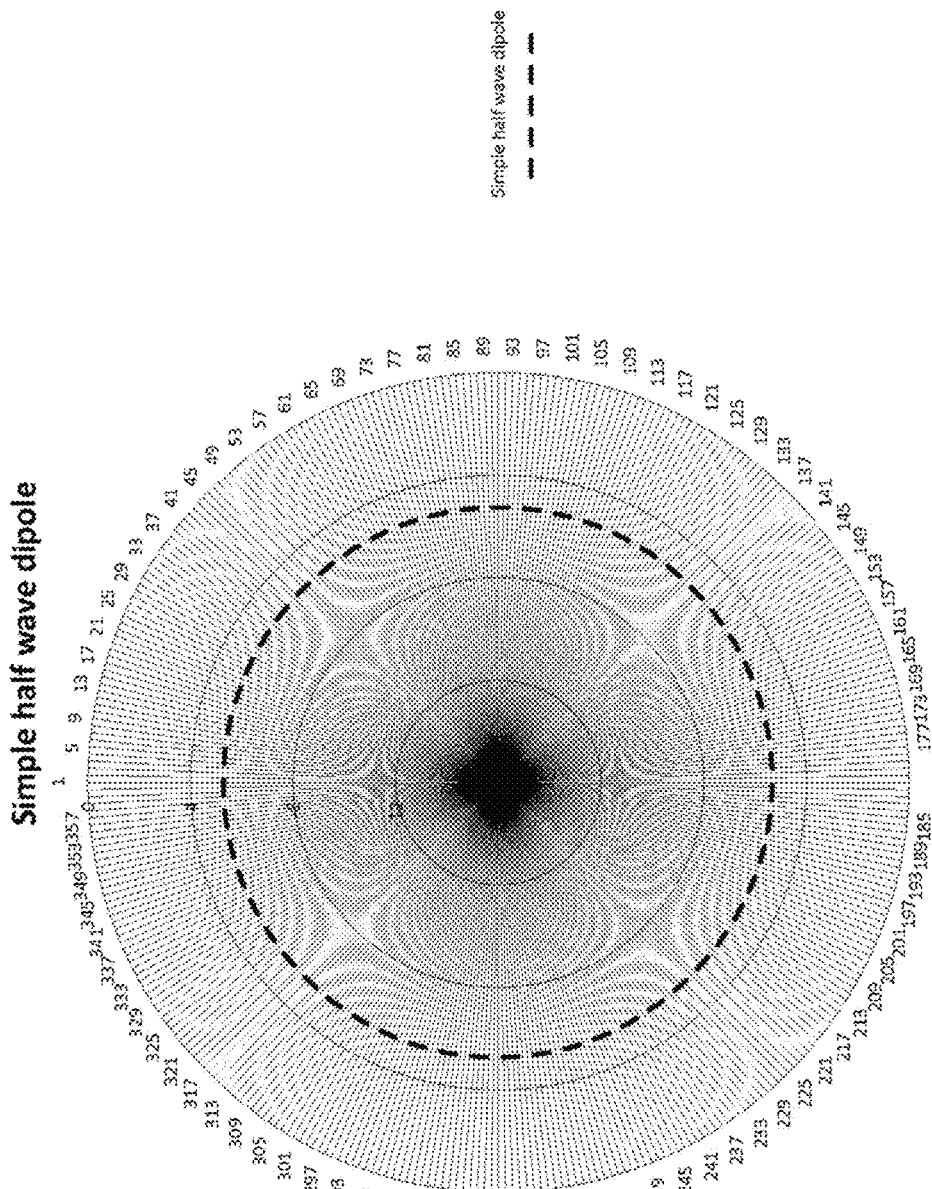
FIG. 9 shows the radiation pattern in the horizontal plane of an ideal simple dipole.

FIG. 9 shows the horizontal plane radiation pattern of an ideal simple dipole.

Figure 10:
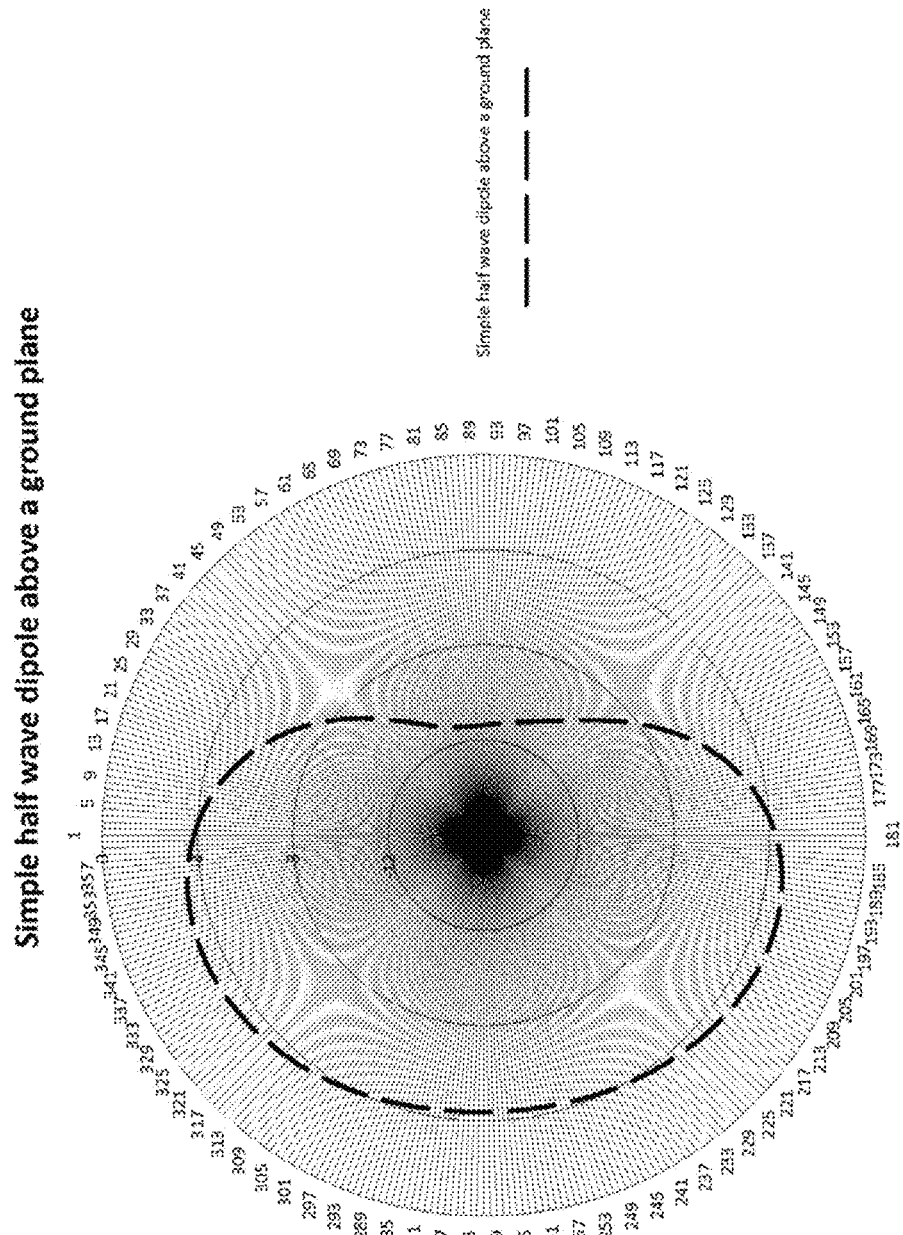
FIG. 10 shows the radiation pattern of a simple dipole in proximity to a ground plane.

FIG. 10 shows a simple dipole near a ground plane. The presence of the groundplane shifts the pattern. FIG. 10 is still an ideal theoretical situation without any connectors.

Figure 11:
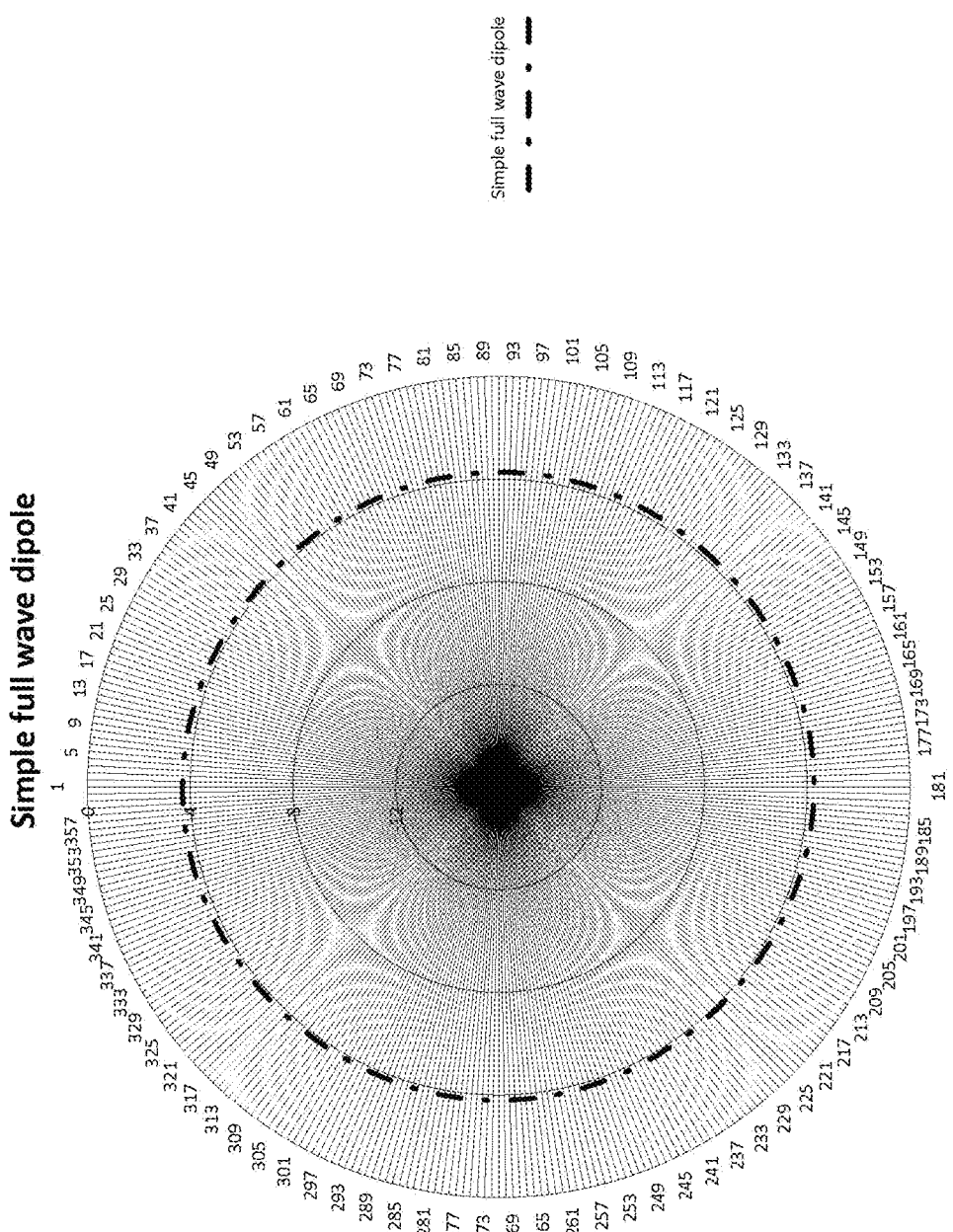
FIG. 11 shows the horizontal radiation pattern of an ideal full-wavelength dipole.

FIG. 11 shows the horizontal radiation pattern of an ideal full-wavelength dipole. Full wavelength dipoles also have a circular radiation pattern in the horizontal plane but are rarely used because they have a high input impedance and are difficult to incorporate in an antenna due to their high impedance and the difficulty of meeting the typical impedance matching requirements.

Figure 12:
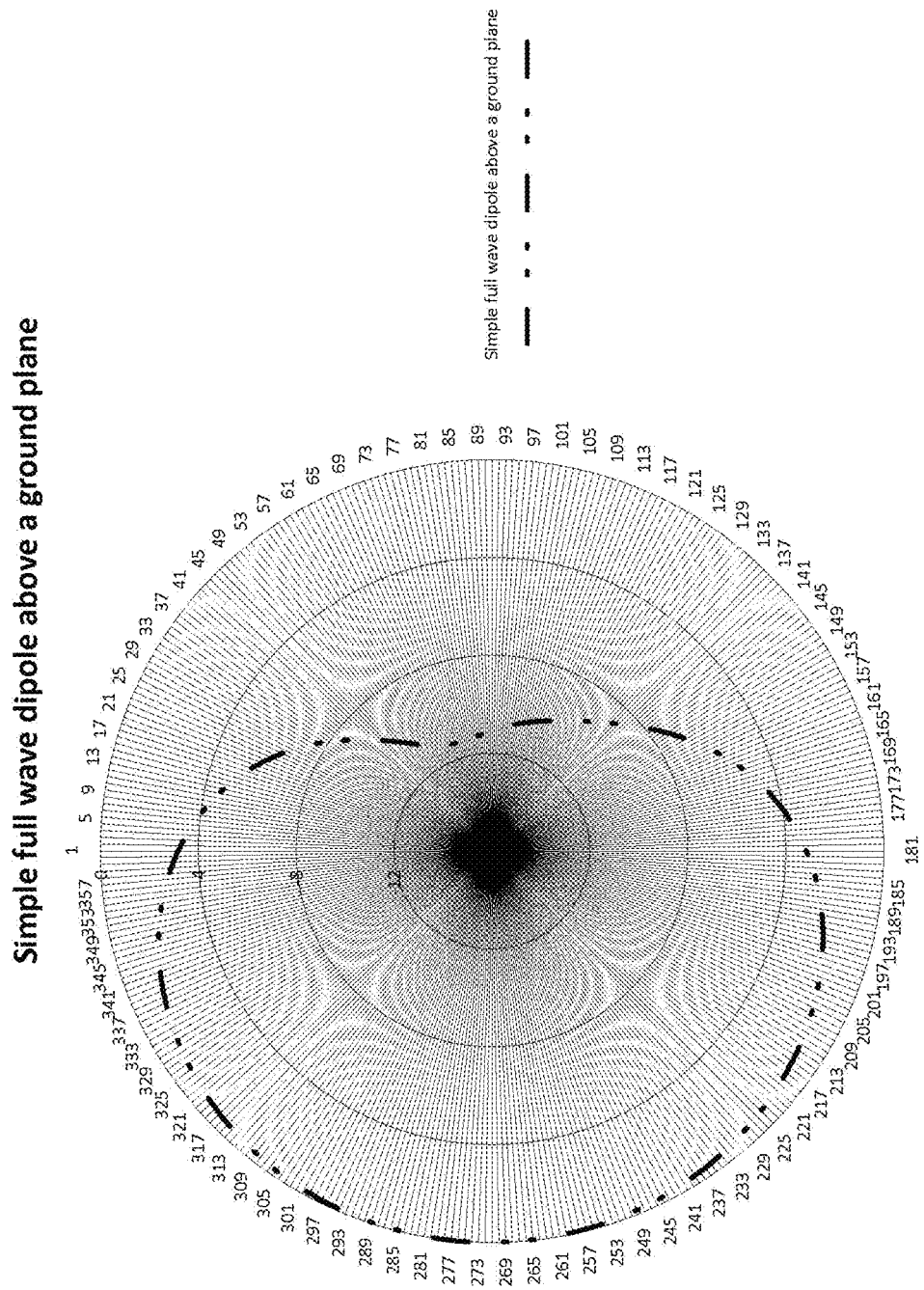
FIG. 12 shows the radiation pattern of a full-wavelength dipole above a groundplane.

FIG. 12 shows a full-wavelength dipole in proximity to a groundplane. The dipole in FIG. 12 is still ideal in at least two ways. First, the dipole in FIG. 12 lacks connectors, among other essential real world elements. Second, a full wavelength dipole has high impedance and typically would lose more power to heat and reflected power than would be lost due to radiation. For these and other reasons, full-wavelength dipoles are almost never used in practice.

Antennas can focus their signal in a particular direction using multiple, spatially separated, components.

Antennas may spread their components out vertically or horizontally. Both of these strategies for focusing a signal expand the size of the antenna array. Antennas may spread their elements vertically to narrow the antenna pattern along in the elevation plane. That may alter how well the antenna receives RF power verses angle in the elevation plane, ranging from straight up vertically, to the horizon, or straight down. Spreading elements vertically is disadvantageous because the antenna is now a longer device and there may be nulls, or dead spots, in the elevation plane.

Antennas may spread their elements horizontally to narrow the antenna pattern in the azimuth plane. Spreading elements horizontally is disadvantageous because in most cases there will be nulls in the azimuth plane. An example is two idealized dipoles horizontally separated which create a four-lobed-clover-leaf pattern. Such a clover pattern has four null spots in the horizontal plane. The addition of a groundplane to a pair of dipoles smooths out the radiation pattern in the horizontal plane, but still leaves the signal less round than desirable. Additionally, a pair of dipoles retains the figure-8 pattern in the vertical plane. An omni-directional antenna seeks to increase the power radiated horizontally and minimize the vertical components of the radiation.

In some applications, it may be desirable to surround an antenna with a protective enclosure, typically called a radome. Both the radome shell wall and any structural framework are likely in the path of the antenna signal, which typically results in signal loss.

Transmission loss, and insertion loss, measure how much RF energy turns into heat going from point A to point B in a transmission line. It is a measure of the intrinsic efficiency of the transmission line.

Scattering is the reflection of signals off objects. RF signals bounce off all types of objects in the environment surrounding an antenna and scattering can affect both transmission and reception. This scattering alters antenna communication performance as both a transmitter and receiver.

Far field effects typically occur at a location many wavelengths away from a signal source. Near field effects occur closer to the antenna. Near field effects are primarily influenced by dielectric properties rather than scattering.

Frequency and wavelength are directly connected. The speed of a wave is the product of its frequency and its wavelength. For electromagnetic radiation, the wave speed is the speed of light, which is constant in vacuum. Therefore, wavelength is a function of frequency according to the formula $\lambda = c/f$, where $\lambda$ is the wavelength, c is the speed of light, and f is the frequency.

In electromagnetics, permittivity is a fundamental material parameter, which affects the propagation of electric fields. Permittivity is typically denoted by the Greek letter epsilon ($\epsilon$). Permittivity is often referred to as the dielectric constant.

Radome transmission loss is the combination of the ordinary insertion loss of the antenna signal passing through the radome wall plus the scattering loss off the radome. A radome design typically seeks to minimize insertion loss through material selection and geometry. Scattering loss not only decreases the strength of an antenna signal, but may alter the geometry of the signal pattern as well. Traditionally, altered signal patterns defeated directional objectives. Past designs therefore sought to minimize any alteration of an antenna's signal pattern.

Some embodiments bypass the need for coaxial cables between the RF connector and the antenna elements. By using the RF coaxial connector described above to attach the printed circuit board to the RF coaxial connector, the antenna requires only a single printed circuit board.

Figure 13:
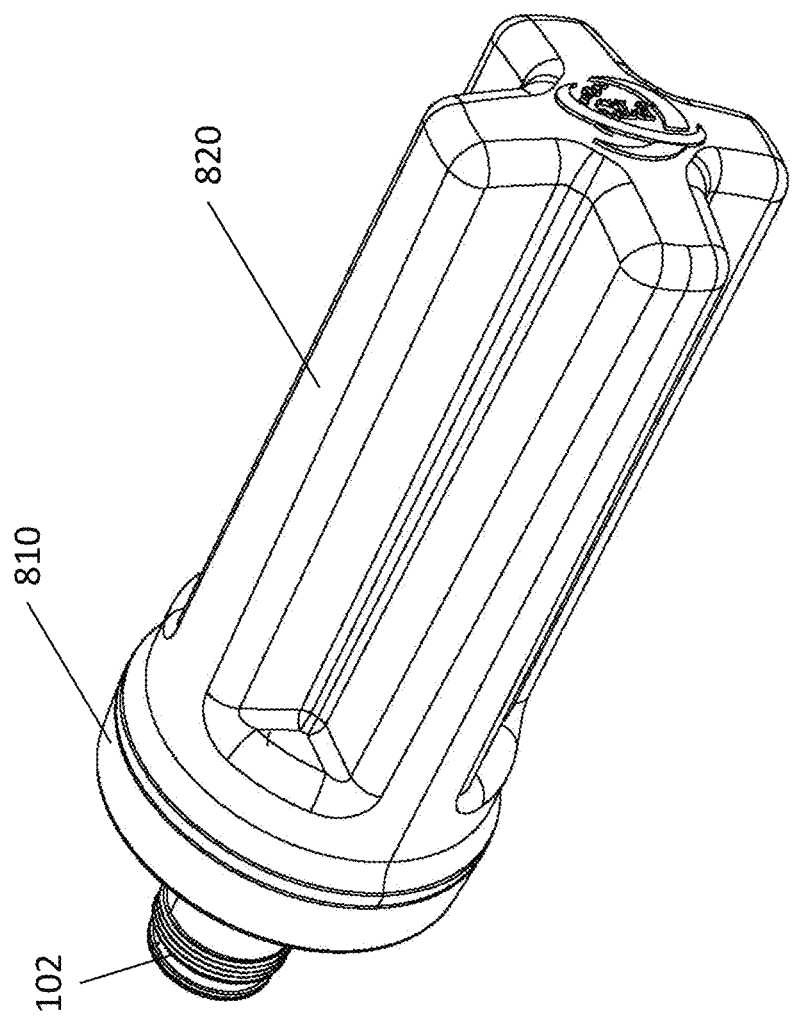
FIG. 13 shows an assembled connector, radome shell, and radome base according to an example embodiment.

FIG. 13 shows the radome shell 820 connected to the radome base 810. A threaded end of the RF connector, the connector portion 102, is visible in the figure. The plus shaped design of the radome shell 820 enhances the omni-directional nature of the dipoles within the radome.

Figure 14:
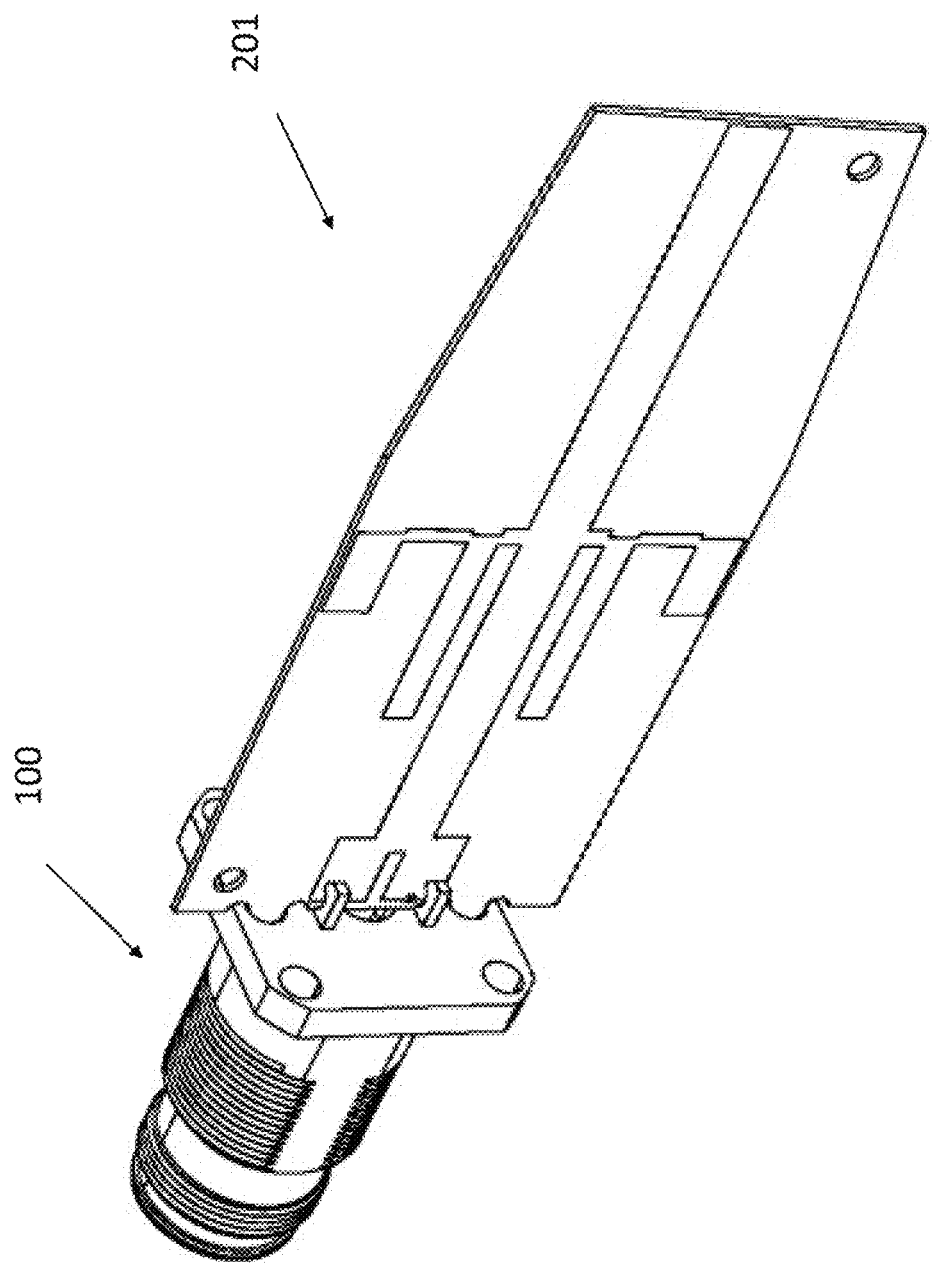
FIG. 14 shows an RF connector with a PCB attached according to an example embodiment.

FIG. 14 shows an RF connector with a PCB attached according to an example embodiment.

Figure 15:
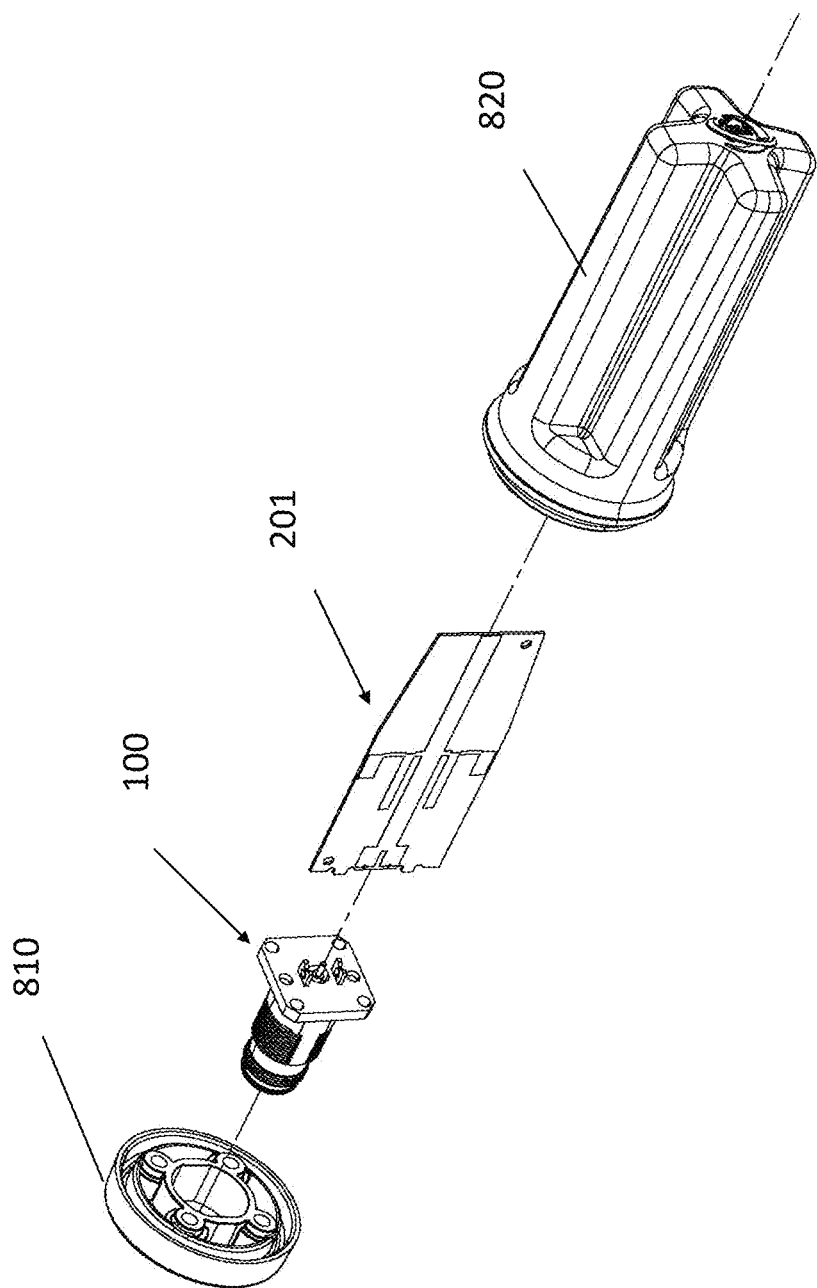
FIG. 15 shows an exploded view of components according to some embodiments of an Omnidirectional WiFi system.

FIG. 15 shows an exploded view of the components according to some embodiments of the Omnidirectional WiFi system. The RF connector 100 attaches to the PCB 201. Once the PCB 201 is properly oriented, the electrically conductive portions of the RF connector 100 and the PCB 201 may be connected, usually via soldering. The radome shell 820 surrounds the PCB 201 and attaches to the radome base 810, enclosing the PCB 201 and connector body 104 within the radome 800. The RF connector portion 102 extends out of the radome base 810. The connector 100 may allow attachment to a bracket or other mounting device, not shown in the figure. The connector portion 102, sometimes called the stem, of the RF connector may connect to a coaxial, or other appropriate, cable to provide a signal path to and/or from the RF connector and antenna.

FIGS. 16a-16b show opposite sides of the PCB 201. In the embodiment shown in the figures, once the RF signal is on the main circuit board, the RF signal follows the microstrip line(s) from the RF coaxial connector to the dipoles.

FIG. 16a shows the front side of the PCB 205 and the components visible on that side. Other terms for the front side of the PCB 205 may be PCB front 205, PCB circuit side 205, the circuit side of the PCB 205, PCB microstrip side 205, or another similar variation. The microstrip line 305 connects to the center pin 108 at the interface to the connector 100. The microstrip line 305 feeds a conductive line connecting both the inner dipole 310 and outer dipole 320. The outer dipole 320 is one-half wavelength long. The inner dipole 310 is a full-wavelength long. These lengths, a half-wavelength long and a full-wavelength long are the effective lengths, sometimes also called the electrical length. The physical sizes of the conductors on the PCB may vary to accommodate fringing fields, and other, effects that may be compensated for by altering the physical size of the conductive elements. The portion of the inner dipole 310 visible on the front side of the PCB 205 is an upper arm of the inner dipole 310a. The portion of the outer dipole 320 visible on the front side of the PCB 205 is the upper arm of the outer dipole 320a.

In some advantageous configurations and embodiments an omni-directional wifi antenna may include conductive trace portions and inner and outer dipole arms of various lengths, widths, and spacings. According to at least one preferred example arrangement as shown in FIGS. 16A and 16B, the length of the upper half of the outer arm 320a is between about 8 mm and about 12 mm, preferably about 10 mm and the length of the upper half of the inner arm 310a is between about 20 mm and about 28 mm, preferably about 24 mm. The width of the upper half of the outer arm 320 is between about 3 mm and about 7 mm, preferably about 5 mm and the width of the upper half of the inner arm 310 is between about 2 mm and about 5 mm, preferably about 3.5 mm. The distance between the inner arm 310 and the outer arm 320 is between about 5 mm and about 10 mm, preferably about 7 mm. The distance between the edges of the inner arms 310 is between about 8 mm and about 16 mm, preferably about 12 mm. The distance from the edge of the inner arm 310 to the centerline is between about 4 mm and about 8 mm, preferably about 6 mm. The widths and lengths of portions of the conductive line 375 may vary along different trace portions, and may also vary between the circuit-side of the PCB and the groundplane-side of the PCB. In some example embodiments, as shown for example with reference to FIGS. 16a and 16b, at least portions of the conductive line 375 has a width between about 1 mm and about 2 mm, preferably about 1.5 mm in the gap between the inner arm 310 and outer arm 320 and a width of between about 0.1 mm and about 1 mm, preferably about 0.4 mm for the line between the inner arms 310. For the outer arm, the upper half 320a and the lower half 320b are approximately the same length. For the inner arm, the upper half 310a and the lower half 310b are approximately the same length. Any of these measurements may vary by up to plus or minus 15 percent according to variations of some embodiments. Other variations are features are also contemplated as discussed more herein. According to the illustrated example embodiment, the distance from the edge of the PCB 201 closest to the connector 100 to the conductive line 375 is between about 40 mm and about 60 mm, preferably about 50 mm. This distance may vary more than other dimensions.

Other elements also appear in FIG. 16a. These elements include: conductive pads 202a and 202b, which provide a solder interface to the connector arms 106 of the conductor 100; and the tuning tabs, 602a and 602b. Sizes and configurations of the conductive pads, connector arms, tuning tabs, and slot can be adjusted as needed to achieve the desired antenna characteristics as described herein.

FIG. 16b shows the back side of the PCB 250 and the components visible on that side. The back side of the PCB 250 may also be referred to as: PCB back 250, PCB groundplane side 250, the groundplane side of the PCB 250, or other similar variation. The groundplane 350 may run down the middle of the PCB and connect to the conductive trace 502. The conductive trace 502 may provide a connection via the connector arm to the connector body and connects to the groundplane 350. Between the portions of the conductive trace 502 that connect to the connector arms 106 is a notch, or slot, 702. The size of the slot 702 and the tuning tabs 602a and 602b may be adjusted to alter the VSWR matching as mentioned above. The groundplane 350 may feed a conductive line to the inner dipole 310 and outer dipole 320. The inner dipole 310 is closer to the groundplane 350 than the outer dipole 320. The portion of the inner dipole 310 visible on the back side of the PCB is a lower arm of the inner dipole 310b. The portion of the outer dipole 320 visible on the back side of the PCB is the lower arm of the outer dipole 320b. The separation between the inner and outer arms creates the proper phase difference between the two arms so the combined radiation from the two different length arms interacts to improve the desired omi-directional radiation pattern.

One advantage of some embodiments is the use of an inner set of dipole arms 310 that radiate at the same frequency as the outer arms 320 but that are at a different multiple of the wavelength. For example, the outer arms 320 can be standard half-wavelength dipoles. In the embodiment shown in the figures, the inner set of arms 310 are full-wavelength dipoles. Dipoles approximating full-wavelength dipoles are also contemplated and provide advantages. As shown, each set of arms are resonant at the desired frequency, 5 GHz WiFi. The spacing between the inner set of dipole arms 310 and the outer set of dipole arms 320 create an approximated omni-directional radiation pattern providing superior performance. The radome size and shape and the width of the ground plane and the combined radiation from the four dipoles also contribute to creating an enhanced approximated omni-directional radiation pattern.

Traditionally, full-wavelength dipoles were not typically used because they have high impedance and are difficult to impedance match. However, in the arrangement described above, the combination of the inner arms 310 and outer arms 320 has the desired effect when most of the power is radiated by the outer arms 320. The use of higher impedance inner arms 310 contributes to that objective because the higher impedance allows less power to radiate out of the inner arms 310. Accordingly, in the present disclosure, the high impedance of approximately full-wavelength dipoles is a benefit rather than a limitation. The balancing of power between the inner and outer arms is further refined by the size of the trace between the arms and between the inner arm and the center. The center preferably being aligned with centerlines of the microstrip line 305 on one side and the groundplane 350 on the other.

A one-wavelength-long antenna element typically has a high impedance, which is normally hard to impedance match and not practical. Placing a high impedance element close to the groundplane typically lowers the impedance. Placing the full-wavelength arms 310 on the inside of the array, closer to the groundplane takes advantage of this effect. Linking high impedance and low impedance elements to intentionally alter the power delivery balance between elements uses the normally impractical full-wavelength antenna as an advantage. The full-wavelength antenna uses less energy from the feed line. This creates some amplitude taper between the inner dipole 310 and the outer dipole 320, so the outer arms 320 radiate more energy while focusing the radiation in the elevation plane without increasing the height of the antenna.

The amplitude taper between inner and outer dipoles is desirable because of the impact on the overall radiation patterns. If the elements radiate equal power, the radiation pattern is poor. Reducing the power to the inner arms significantly compared to the power level of the outer arms creates a pattern closer to the desired omnidirectional shape. The next step is to adjust the phase relationship between the arms because one arm is fed earlier than the other. Adding a phase taper on the array leads to the correct theoretical model. An antenna is constructed to correspond to and/or approximate the desired theoretical model.

The arm placement and ground plane size is such that the elevation beam width and peak gain of the antenna is similar to an antenna that has four dipoles that are very similar in size and vertically separated from one another by approximately one wavelength. This vertical separation would often require the use of a printed circuit board jumper (see, for example, the UMTS dipole disclosure noted below) so that a microstrip line could be routed to each vertical pair with the length of microstrip line being very similar for all four dipoles.

In this embodiment, the four dipoles of two drastically different lengths are used in a horizontal fashion. The dipoles along with the size of the ground plane and the shape of the radome shell 820 focus the RF radiation in the vertical plane while maintaining a nearly circular, omnidirectional pattern in the horizontal plane.

While the example described has a desired frequency of 5 GHz, for use with WiFi, the same principles would apply to an antenna design for another frequency. Such other designs are contemplated by the present disclosure.

Figure 17B:
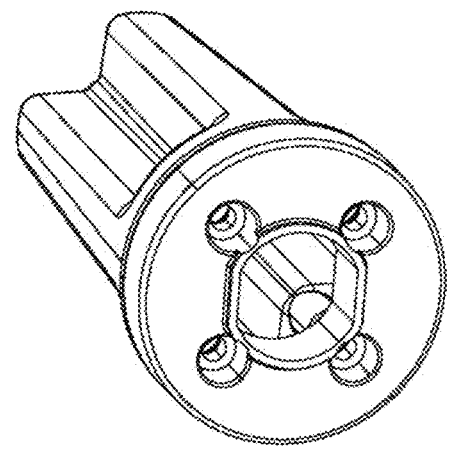
FIG. 17b is a perspective view of a radome embodiment viewed from the direction of the radome base.
Figure 17C:
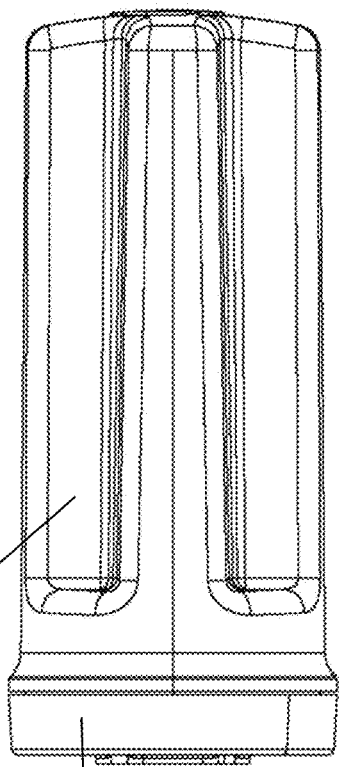
FIG. 17c is a side view of a radome embodiment.
Figure 17A:
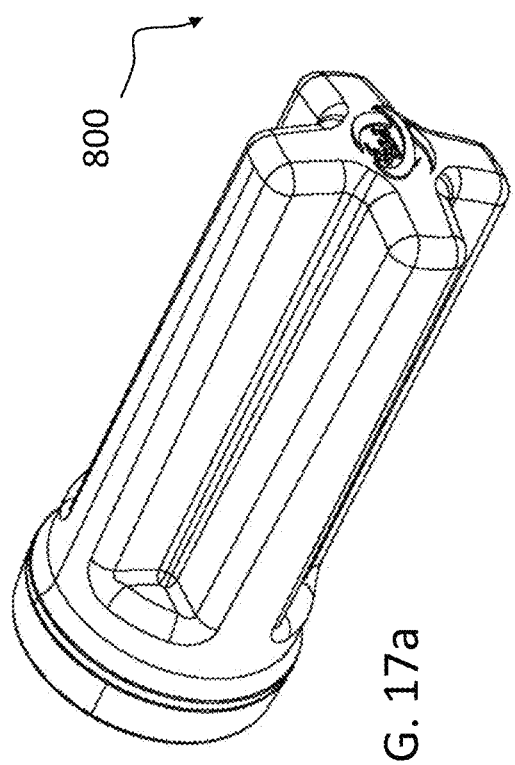
FIG. 17a is a perspective view of a radome embodiment viewed from the direction of the radome shell.

FIGS. 17a, 17b, 17c show the radome 800 according to some embodiments. FIG. 17a is a perspective view of a radome embodiment from the direction of the radome shell. FIG. 17b is a perspective view of a radome embodiment from the direction of the radome base. FIG. 17c is a side view of a radome embodiment. The radome 800 has a radome shell 820 and a radome base 810. The radome shell 820 and radome base 810 may be designed to fit together, potentially with an O-ring positioned between the components. Holes in the radome base 810 allow fasteners, such as screws, to attach the radome base 810 to the radome shell 820. The holes in the radome base 810 and radome shell 820 are aligned to position and/or sandwich the conductor body 104 between the radome shell 820 and radome base 810. The fasteners connecting the radome base 810 to the radome shell 820 may pass through holes 160, or apertures, in the connector body 104. Connecting the connector body 104, the radome shell 820, and radome base 810 using fasteners passing through the apertures 160 in the connector body allows the PCB 201 attached to the connector 100 to be properly aligned within the radome shell 820.

The radome 800 shape results in a modified spatial gain pattern that enhances the omnidirectional nature of the antenna it surrounds. As shown in one preferred embodiment, the PCB 201 is preferably coupled to the RF connector 100 and positioned within the radome 800 such that the PCB 201 is positioned generally within first and second protrusions of a generally plus-shaped radome on opposite sides of the radome. Third and fourth protrusions of the generally plus-shaped radome are shown positioned at approximate right angles relative to the first and second protrusions on opposite sides of the generally plus-shaped radome. The radome surrounds and protects the PCB 201 from incidental damage that may be caused by direct contact to the PCB. The third and fourth protrusions are generally void. When the PCB is positioned within the first and second protrusions of the radome 800, the generally void third and fourth protrusions extending away from the PCB 201 during use, interacts with the electronic signals to and/or from the antenna such that the generally omni directional pattern of the antenna is enhanced by the plus-shaped radome. The recognition that providing a radome with a desired shape that advantageously interacts with the antenna to produce a more desirable distribution pattern is one aspect of the advantageous features of the present disclosure. Other shapes and variations that include protrusions not adapted or configured to house a portion of the PCB are also contemplated and may provide similar or additional advantages.

The shape of the radome enhances the circular pattern of the antennas and further evens out the coverage of the antenna. By taking advantage of the scattering and absorbing properties of the radome materials, the radome enhances the omnidirectional nature of the antenna in addition to providing the environmental protection a radome is typically designed for. The radome is spatially aligned with the antenna to enhance the spatial radiation pattern of the antenna. The symmetrical design of the radome also provides manufacturing and asthetic advantages for the omnidirectional wifi antenna system. The shape of the radome shell 820 and the elements on the PCB 201 are designed together to obtain a uniquely improved omni-directional radiation pattern using a compact and cost effective design that delivers improved performance. With reference to the figures, some radiation patterns associated with some components and/or combinations of components of an omnidirectional wifi antenna system are discussed in more detail below.

Figure 20:
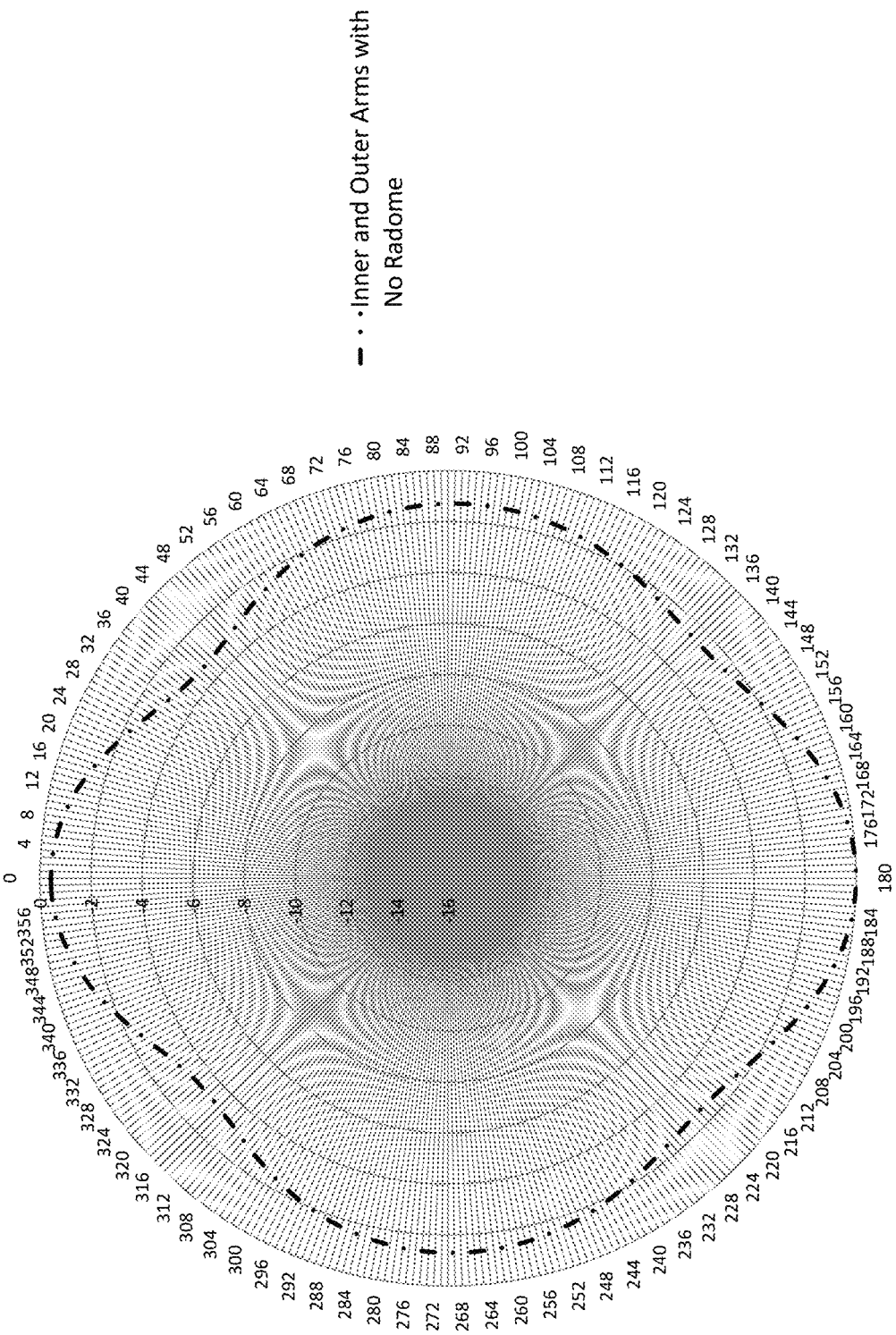
FIG. 20 shows the radiation pattern of the inner dipole and outer dipole combined, but without any radome according to an example embodiment.
Figure 21:
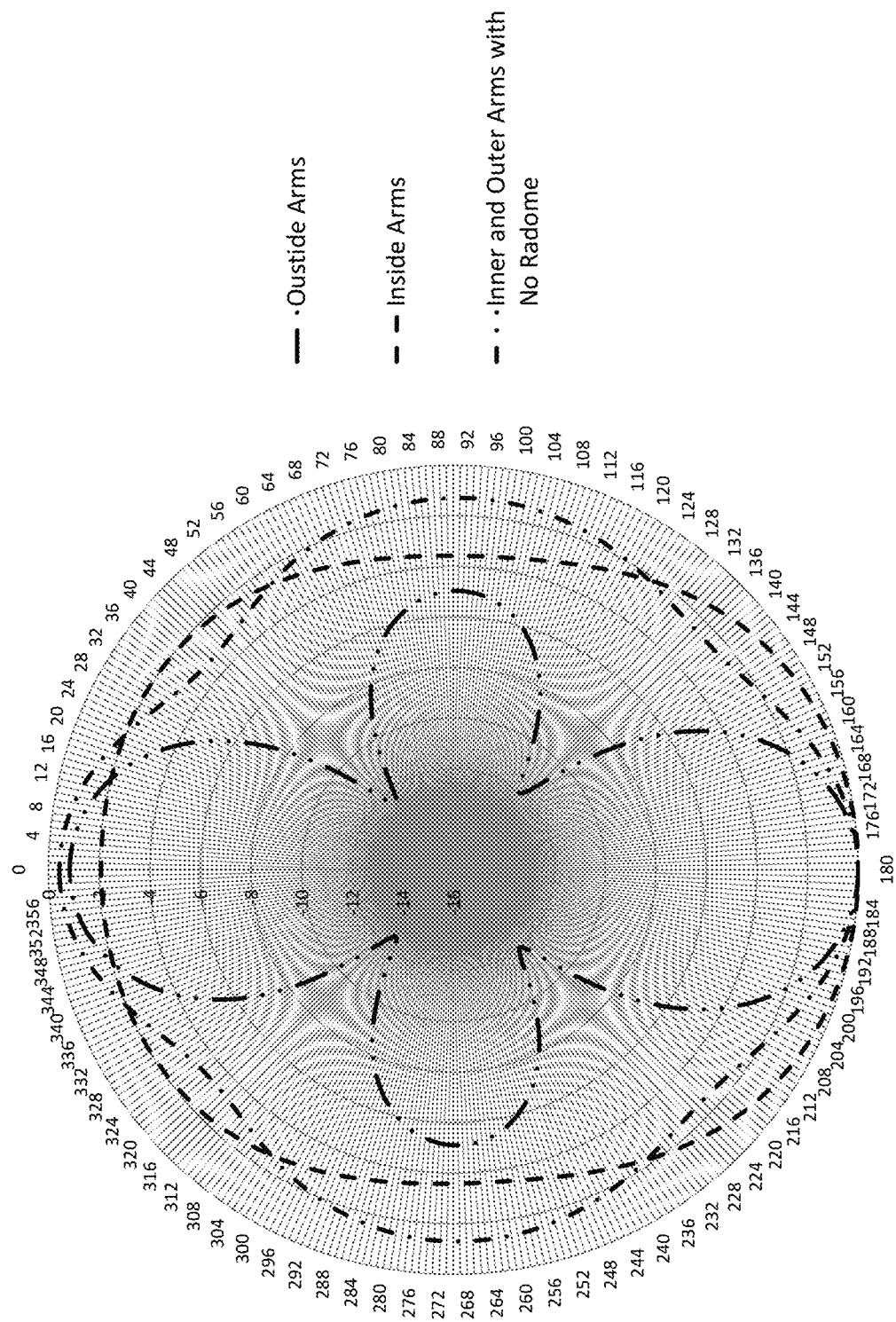
FIG. 21 shows an overlay of the radiation patterns of (1) the inner dipole only, (2) the outer dipole only, and (3) the combination of inner dipole and outer dipole but without a radome according to an example embodiment.
Figure 22:
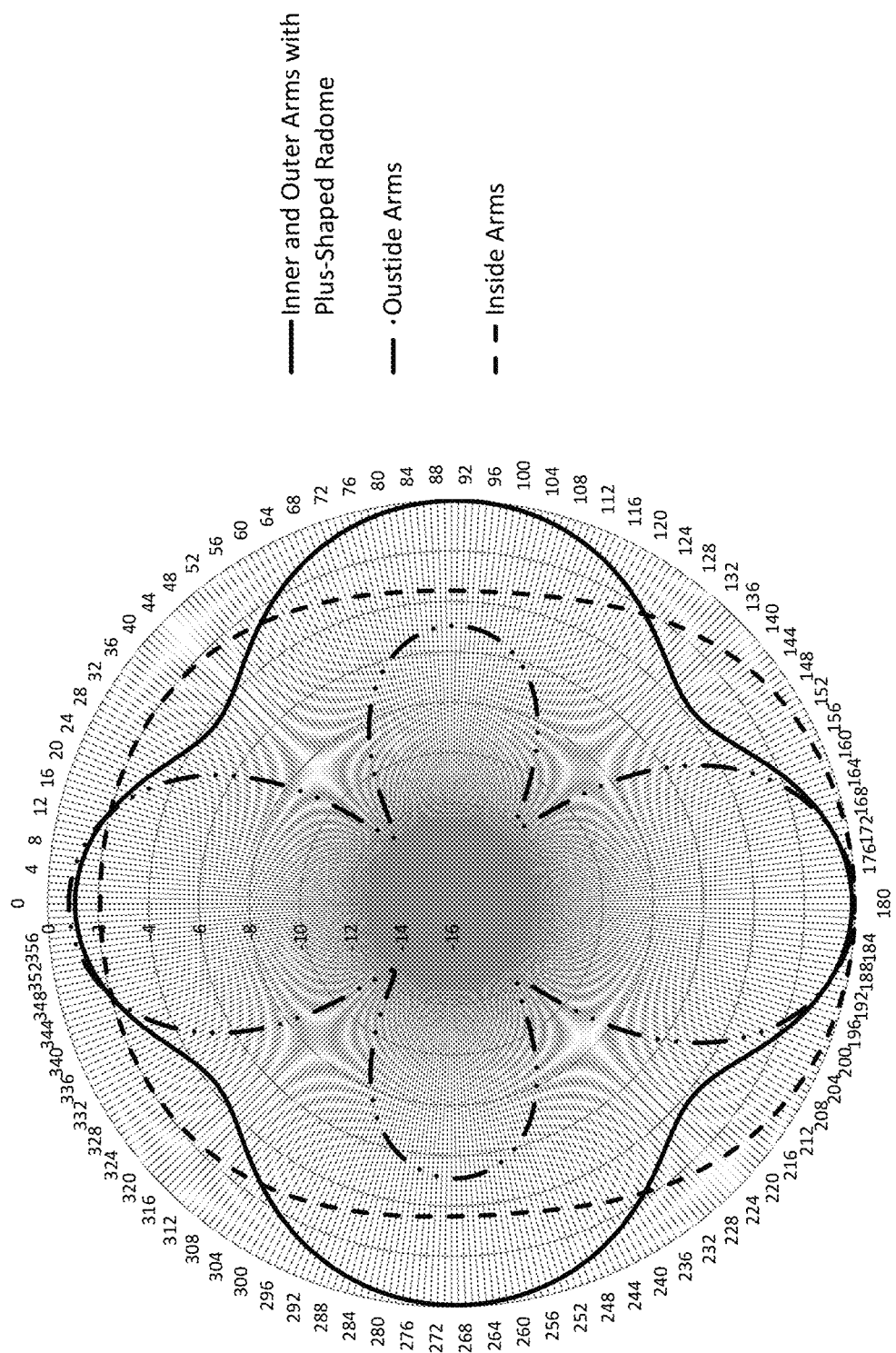
FIG. 22 shows the radiation pattern of the inner dipole, the outer dipole and a plus-shaped radome according to an example embodiment.

FIGS. 18 to 24 show antenna radiation patterns in a horizontal plane. FIG. 22 shows the radiation pattern of one embodiment with half-wavelength outer arms, full-wavelength inner arms, and the plus-shaped radome described herein.

Figure 18:
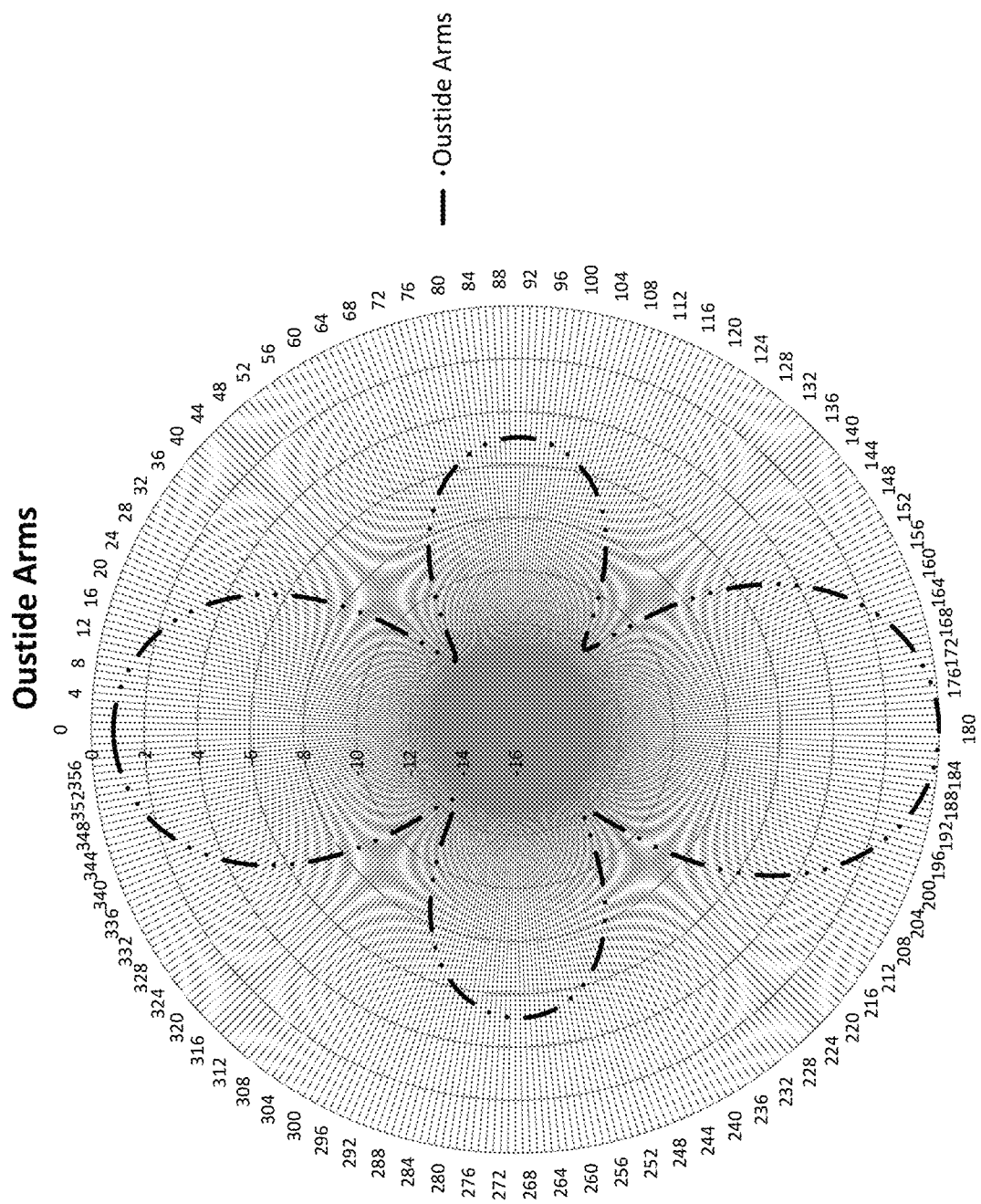
FIG. 18 shows the radiation pattern for the outer arms only according to an example embodiment.

FIG. 18 shows the horizontal plane radiation pattern for the outer arms only according to an example embodiment.

The antenna elements alone have a four-lobbed pattern as shown in FIG. 18. They exhibit a four-lobbed pattern with the forward and backward lobes stronger than the side lobes.

Figure 19:
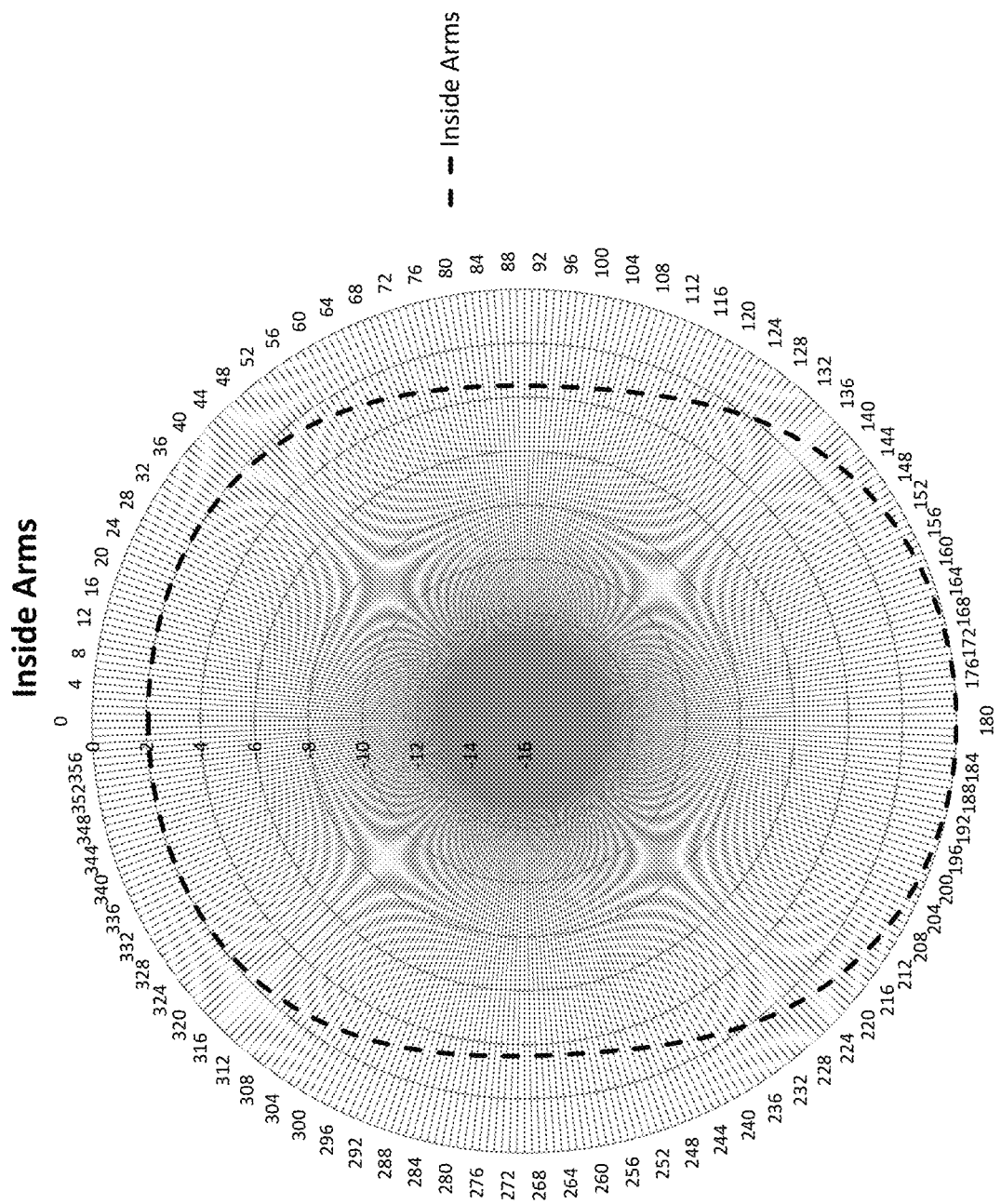
FIG. 19 shows the radiation pattern of the inner arms only according to an example embodiment.

FIG. 19 shows the radiation pattern of the inner arms only according to an example embodiment.

FIG. 20 shows the radiation pattern of the inner dipole 310 and outer dipole 320 combined, but without any radome according to an example embodiment. As illustrated in FIG. 20, the combination of the full-wavelength dipole dramatically improves the omni-directional character of the antenna. Additionally, the combination of the inner dipole 310 and outer dipole 320 is not the mere superposition, or addition, of the individual radiation patterns. The combination of the dipoles interact to create a new pattern because of the interaction, mutual coupling, between dipoles.

FIG. 21 shows an overlay of the radiation patterns of (1) the inner dipole only, (2) the outer dipole only, and (3) the combination of inner dipole and outer dipole but without a radome according to an example embodiment.

The radiation pattern of the combination of an inner dipole and an outer dipole may be further enhanced by a plus-shaped radome. A plus shaped radome, shown in FIG. 17a, smooths out this pattern and makes it more circular.

FIG. 22 shows the radiation pattern of the inner dipole, the outer dipole and a plus-shaped radome according to an example embodiment.

Figure 23:
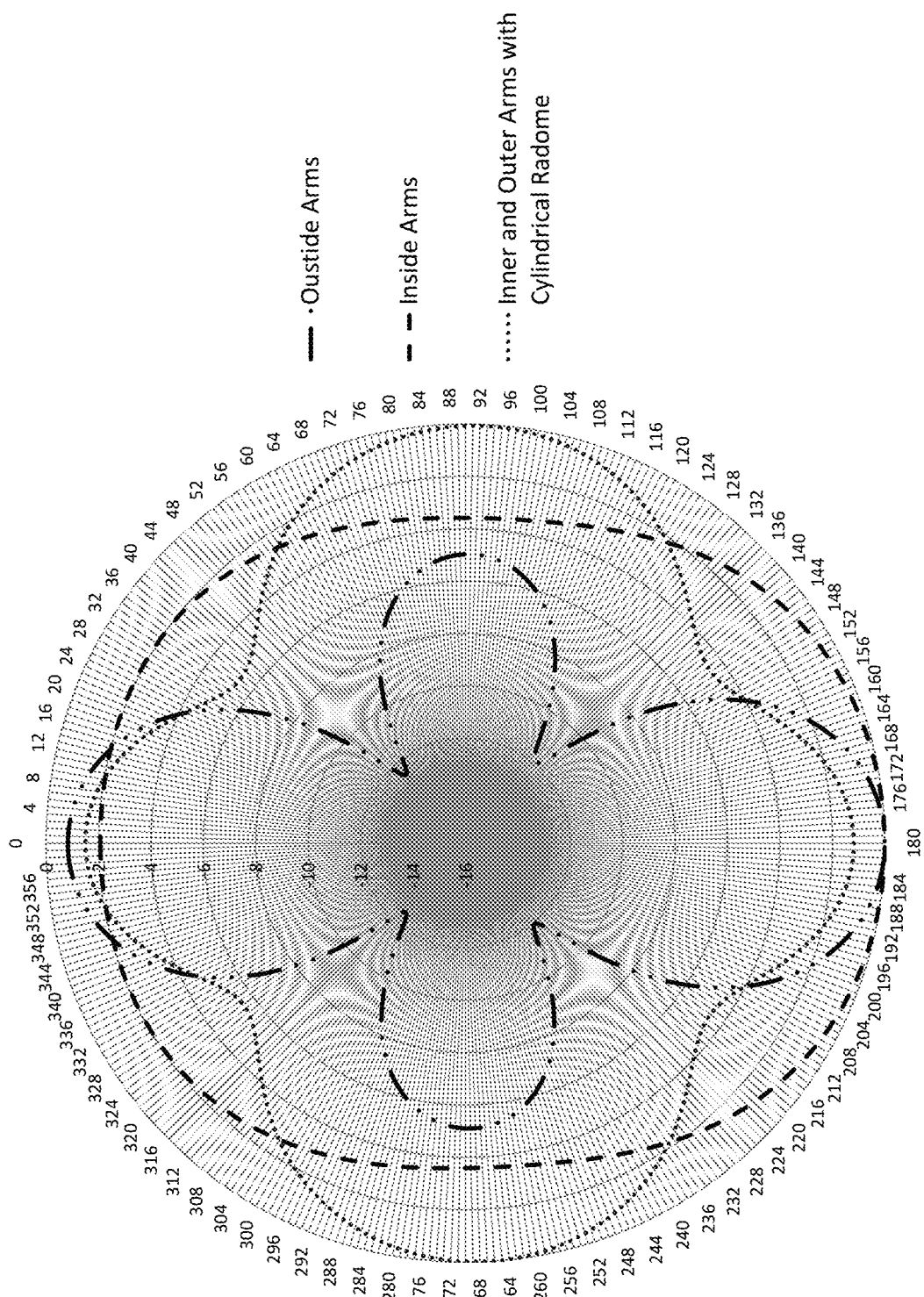
FIG. 23 shows the radiation pattern of the inner dipole, the outer dipole, and a cylindrical radome.

FIG. 23 shows the radiation pattern of the inner dipole, the outer dipole and a cylindrical radome. A cylindrical dipole is a more traditional design and does not enhance the radiation pattern according to an example embodiment.

Figure 24:
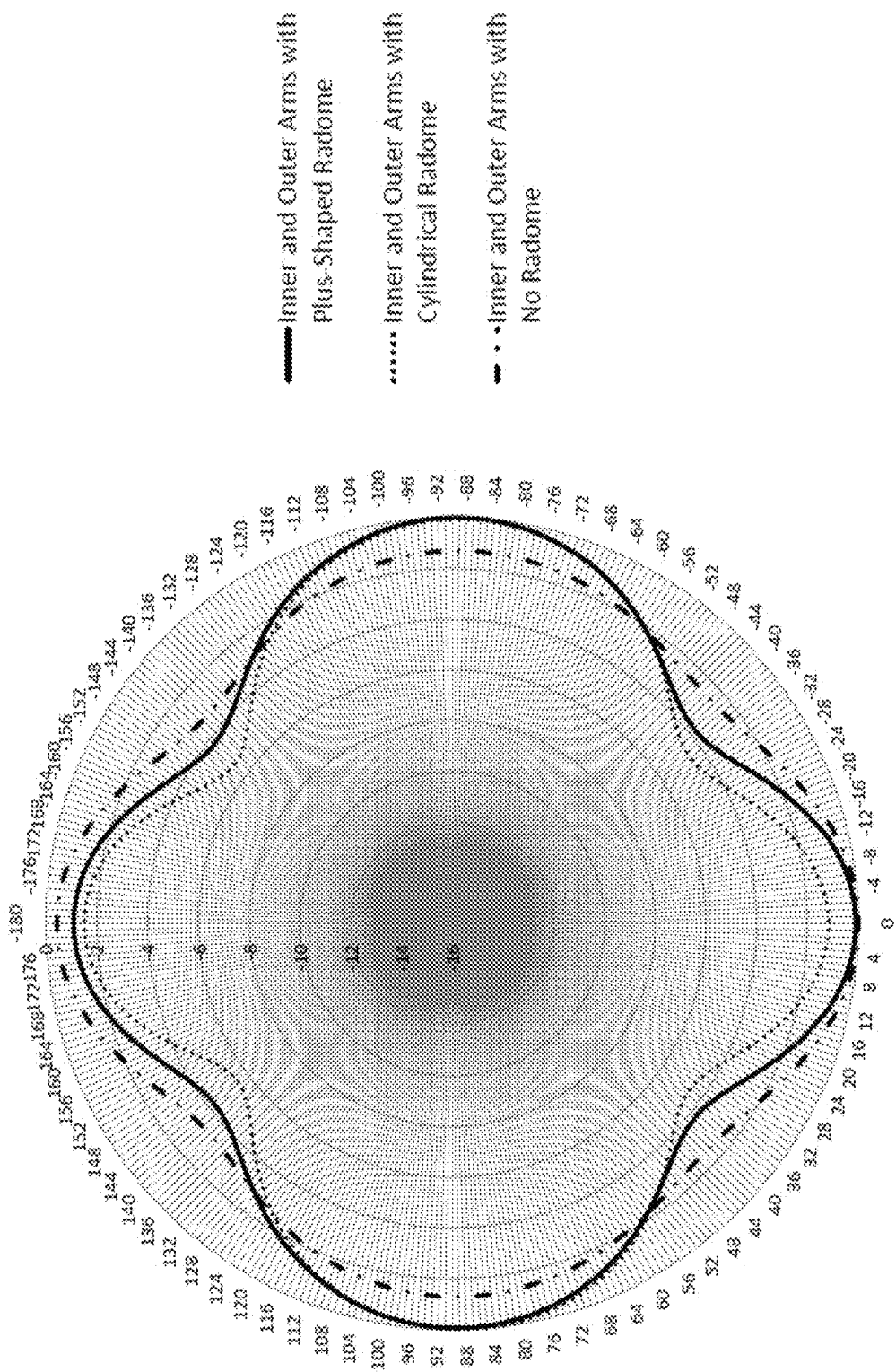
FIG. 24 shows a graph comparing the inner and outer dipoles of some embodiments when combined with (1) a plus-shaped radome, (2) a cylindrical radome, and (3) without a radome according to an example embodiment.

FIG. 24 shows a comparison of the inner and outer dipoles with (1) a plus-shaped radome, (2) a cylindrical radome, and (3) without a radome according to an example embodiment.

Plated through holes are hollow cylinders, usually of copper, between two sides of a printed circuit board that connect the conductor on one side of the printed circuit board to the conductor on the other side of the circuit board.

Return loss occurs when RF energy is moving down a transmission line, and the transmission line has a discontinuity. At the discontinuity, RF energy reflects, or returns, back in the direction it came from. Return loss is a measure of how much of the RF energy reflects back. Impedance matching minimizes return loss and may be done through proper design and appropriate manufacturing.

A single layer printed circuit board with no plated through holes is very repeatable during manufacturing. The lack of plated through holes reduces passive intermodulation, reduces return loss, and improves antenna gain and radiation pattern consistency in a high volume manufacturing environment. Additionally, a single layer printed circuit board has a lower part count than other approaches and the antenna patterns are very stable. These characteristics apply to the 5 GHz WiFi frequency band. Other bands may have similar benefits and/or characteristics.

The combinations of elements described herein are advantageous to creating a more omni-directional antenna. The use of half-wavelength outer arms and full-wavelength inner arms approximates a circular radiation pattern and narrows the elevation beamwidth in a physically constructible design. While an idealized dipole may have better radiation academically, such an antenna may not be constructed in reality because of the requirements for connections and physical mounting, among other issues.

Using horizontally spaced elements rather than vertically separated elements prevents additional null spots in the vertical plane. The use of the full-wavelength dipole also flattens the radiation pattern towards the horizontal plane and creates a more stable and narrower elevation pattern.

Placing radiating elements on a single PCB eliminates the need for connectors between boards, which improves the PIM performance. Directly connecting the PCB to the connector also reduces PIM and dramatically reduces the manufacturing part count, manufacturing complexity, and cost.

According to one aspect of the disclosure, a single printed circuit board comprises four dipoles in a horizontal configuration. The combination of inner arms, outer arms, and groundplane, with mixed wavelength dipole arms, contributes to a radiation pattern that can resemble a rounded-off square and/or a rounded-off diamond shape, see e.g., FIG. 20. It has four points of radiation on the x-y axis that are strong and then at each 45-degree direction, namely 45, −45, 135, and −135, there is a slight depression in the pattern. This combination of elements improves the omni-directional pattern at the target frequency.

This design improves the omni-directional performance at a single target frequency in contrast to antennas that support multiple frequencies. Existing designs use two sets of dipoles working at different frequencies. Such implementations may work with a standard antenna arm radiating at 5 Ghz and another antenna arm radiating at 2.4 Ghz. Rather than poor coverage of two frequencies, the present embodiment has improved coverage of a single frequency.

An idealized dipole with a circular pattern in the horizontal plane has about two dBi gain. The use of the extra arms reduces the vertical component of the antenna pattern, in the z direction. The effect is that the circular pattern can have six dBi gain rather than the more typical two. This is also close to the FCC limit of six dBi gain for a WiFi antenna. Therefore, this design can maximize the allowed gain while maintaining a circular pattern. The FCC imposes a six dBi gain limit on WiFi antennas to minimize interference in this unregulated, unlicensed, band. Other antennas may achieve this level of gain with multiple dipoles separated in the vertical direction. In this case, the multiple dipoles are in the same horizontal plane, creating a more compact antenna. The combination of dipole arms, inner arms and outer arms, at different wavelength multipliers accomplish what is more typically done with vertical separation of dipoles which typically include other significant drawbacks and disadvantages.

The shape of the radome enhances the circular pattern of the antennas and further evens out the coverage of the antenna. By taking advantage of the scattering and absorbing properties of the radome materials, the radome enhances the omnidirectional nature of the antenna in addition to providing the environmental protection a radome is typically designed for. The radome is spatially aligned with the antenna to enhance the spatial radiation pattern of the antenna.

According to some additional example aspects of the disclosure, an omni-directional antenna can include one or more of the following features in various combinations. Additional features, aspects, and advantages are disclosed herein.

In some applications, each of the upper arms of the pair of outer dipoles has an upper arm length in a vertical plane between the conductive line and respective upper ends of the upper arms, wherein the upper arm lengths of the pair of outer dipoles are substantially equal. Each of the lower arms of the pair of outer dipoles has a lower arm length in a vertical plane between the conductive line and respective lower ends of the lower arms, wherein the lower arm lengths of the pair of outer dipoles are substantially equal. The upper arm lengths and the lower arm lengths of the pair of outer dipoles are substantially equal;

In some applications, each of the upper arms of the pair of inner dipoles has an upper arm length in a vertical plane between the conductive line and respective upper ends of the upper arms, wherein the upper arm lengths of the pair of inner dipoles are substantially equal. Each of the lower arms of the pair of inner dipoles has a lower arm length in a vertical plane between the conductive line and respective lower ends of the lower arms, wherein the lower arm lengths of the pair of inner dipoles are substantially equal. The upper arm lengths and the lower arm lengths of the pair of inner dipoles are substantially equal;

In some applications, the upper arm length of the first inner dipole is longer than the upper arm length of the first outer dipole. The upper arm length of the second inner dipole is longer than the upper arm length of the second outer dipole. The lower arm length of the first inner dipole is longer than the lower arm length of the first outer dipole. The lower arm length of the second inner dipole is longer than the lower arm length of the second outer dipole.

In some applications, the upper arm length of the first inner dipole is at least 1.5 times as long as the upper arm length of the first outer dipole. The upper arm length of the second inner dipole is at least 1.5 times as long as the upper arm length of the second outer dipole. The lower arm length of the first inner dipole is at least 1.5 times as long as the lower arm length of the first outer dipole. The lower arm length of the second inner dipole is at least 1.5 times as long as the lower arm length of the second outer dipole.

In some applications, the upper arm length of the first inner dipole is at least twice as long as the upper arm length of the first outer dipole. The upper arm length of the second inner dipole is at least twice as long as the upper arm length of the second outer dipole. The lower arm length of the first inner dipole is at least twice as long as the lower arm length of the first outer dipole. The lower arm length of the second inner dipole is at least twice as long as the lower arm length of the second outer dipole.

In some applications, the upper arm length of the first inner dipole is about 2.5 times as long as the upper arm length of the first outer dipole. The upper arm length of the second inner dipole is about 2.5 times as long as the upper arm length of the second outer dipole. The lower arm length of the first inner dipole is about 2.5 times as long as the lower arm length of the first outer dipole. The lower arm length of the second inner dipole is about 2.5 times as long as the lower arm length of the second outer dipole.

In some applications, the upper arm length of the first inner dipole is about three times as long as the upper arm length of the first outer dipole. The upper arm length of the second inner dipole is about three times as long as the upper arm length of the second outer dipole. The lower arm length of the first inner dipole is about three times as long as the lower arm length of the first outer dipole. The lower arm length of the second inner dipole is about three times as long as the lower arm length of the second outer dipole.

In some applications, the upper arm length of the first inner dipole is less than about 3.5 times as long as the upper arm length of the first outer dipole. The upper arm length of the second inner dipole is less than about 3.5 times as long as the upper arm length of the second outer dipole. The lower arm length of the first inner dipole is less than about 3.5 times as long as the lower arm length of the first outer dipole. The lower arm length of the second inner dipole is less than about 3.5 times as long as the lower arm length of the second outer dipole.

In some applications, the microstrip line has a microstrip length in a vertical plane and a microstrip width in a horizontal plane. The microstrip length is greater than the combined length of the upper and lower arms of the first outer dipole. The microstrip length is greater than the combined length of the upper and lower arms of the second outer dipole. The microstrip length is greater than the combined length of the upper and lower arms of the first inner dipole. The microstrip length is greater than the combined length of the upper and lower arms of the second inner dipole. The microstrip length is approximately equal to the combined length of the upper and lower arms of the first inner dipole. The microstrip length is approximately equal to the combined length of the upper and lower arms of the second inner dipole. The microstrip length is less than the combined length of the upper and lower arms of the first inner dipole. The microstrip length is less than the combined length of the upper and lower arms of the second inner dipole.

In some applications, the microstrip length is less than the combined length of each of the upper arms of the first and second outer dipoles and the first and second inner dipoles. The microstrip length is less than the combined length of each of the lower arms of the first and second outer dipoles and the first and second inner dipoles.

In some applications, the microstrip width is less than the width of the first outer dipole. The microstrip width is less than the width of the second outer dipole. The microstrip width is less than the width of the first inner dipole. The microstrip width is less than the width of the second inner dipole. The microstrip width is between about a third of the width of the first outer dipole. The microstrip width is about a third of the width of the second outer dipole. The microstrip width is about half of the width of the first inner dipole. The microstrip width is about half of the width of the second inner dipole. The width of the first outer dipole is between about two to four times the microstrip width. The width of the second outer dipole is between about two to four times the microstrip width. The first inner dipole is between about 1.5 to three times the microstrip width. The second inner dipole is between about 1.5 to three times the microstrip width.

In some applications, the groundplane has a groundplane length in a vertical plane and a groundplane width in a horizontal plane. The groundplane length is greater than the combined length of the upper and lower arms of the first outer dipole. The groundplane length is greater than the combined length of the upper and lower arms of the second outer dipole. The groundplane length is greater than the combined length of the upper and lower arms of the first inner dipole. The groundplane length is greater than the combined length of the upper and lower arms of the second inner dipole. The groundplane length is greater than the combined length of each of the upper arms of the first and second outer dipoles and the first and second inner dipoles. The groundplane length is greater than the combined length of each of the lower arms of the first and second outer dipoles and the first and second inner dipoles.

In some applications, the groundplane width is greater than the width of first outer dipole. The groundplane width is greater than the width of second outer dipole. The groundplane width is greater than the width of first inner dipole. The groundplane width is greater than the width of second inner dipole. The groundplane width is greater than the combined width of the first and second inner dipoles. The groundplane width is approximately equal to the combined width of the first and second inner dipoles. The groundplane width is less than the combined width of the first and second inner dipoles. The groundplane width is less than the combined width of the first and second outer dipoles.

In some applications, each of the upper arms of the pair of outer dipoles has an upper arm width in a horizontal plane substantially normal to the upper arm lengths, wherein the upper arm widths of the pair of outer dipoles are substantially equal. Each of the lower arms of the pair of outer dipoles has a lower arm width in a horizontal plane substantially normal to the lower arm lengths, wherein the lower arm lengths of the pair of outer dipoles are substantially equal. The upper arm widths and the lower arm widths of the pair of outer dipoles are substantially equal.

In some applications, each of the upper arms of the pair of inner dipoles has an upper arm width in a horizontal plane substantially normal to the upper arms lengths, wherein the upper arm widths of the pair of inner dipoles are substantially equal. Each of the lower arms of the pair of inner dipoles has a lower arm width in a horizontal plane substantially normal to the lower arm widths, wherein the lower arm widths of the pair of inner dipoles are substantially equal. The upper arm widths and the lower arm widths of the pair of inner dipoles are substantially equal.

In some applications, the upper arm width of the first inner dipole is less than the upper arm width of the first outer dipole. The upper arm width of the second inner dipole is less than the upper arm width of the second outer dipole. The lower arm width of the first inner dipole is less than the lower arm width of the first outer dipole. The lower arm width of the second inner dipole is less than the lower arm width of the second outer dipole.

In some applications, the upper arm width of the first outer dipole is about 1.5 times as wide as the upper arm width of the first inner dipole. The upper arm width of the second outer dipole is about 1.5 times as wide as the upper arm width of the second inner dipole. The lower arm width of the first outer dipole is about 1.5 times as wide as the lower arm width of the first inner dipole. The lower arm width of the second outer dipole is about 1.5 times as wide as the lower arm width of the second inner dipole.

In some applications, the upper arm width of the first outer dipole is less than about twice as wide as the upper arm width of the first inner dipole. The upper arm width of the second outer dipole is less than about twice as wide as the upper arm width of the second inner dipole. The lower arm width of the first outer dipole is less than about twice as wide as the lower arm width of the first inner dipole. The lower arm width of the second outer dipole is less than about twice as wide as the lower arm width of the second inner dipole.

In some applications, each of the upper arms of the pair of outer dipoles has an upper arm width in a horizontal plane substantially normal to the upper arm lengths, wherein the upper arm widths of the pair of outer dipoles are substantially equal. Each of the lower arms of the pair of outer dipoles has a lower arm width in a horizontal plane substantially normal to the lower arm lengths, wherein the lower arm lengths of the pair of outer dipoles are substantially equal. The upper arm widths and the lower arm widths of the pair of outer dipoles are substantially equal;

In some applications, the first and second outer dipoles and the first and second inner dipoles each defines a midline along a vertical plane passing through a center of each of the respective dipoles. The midline of at least one of the inner dipoles is oriented generally parallel with the centerline of the PCB and is offset from the centerline of the PCB by a first offset distance. The midline of at least one of the outer dipoles is oriented generally parallel with the centerline of the PCB and is offset from the centerline of the PCB by a second offset distance. In some applications, the second offset distance is at least about 1.5 times greater than the first offset distance. The second offset distance is more than about double the first offset distance. The second offset distance is less than about three times greater than the first offset distance.

In some applications, the at least one pair of inner dipoles and the at least one pair of outer dipoles are spaced along a common horizontal plane and configured to produce, in use, an approximated omni-directional radiation pattern.

In some applications, a first circuit-side inner trace portion of the conductive trace positioned between and electrically coupling the microstrip line and the upper arm of the first inner dipole, has a first circuit-side inner trace width in a vertical plane normal to the circuit side of the PCB, and a first circuit-side inner trace length in a horizontal plane normal to the circuit side of the PCB, In some applications, a second circuit-side inner trace portion of the conductive trace positioned between and electrically coupling the microstrip line and the upper arm of the second inner dipole, has a second circuit-side inner trace width in a vertical plane normal to the circuit side of the PCB, and a second circuit-side inner trace length in a horizontal plane normal to the circuit side of the PCB.

In some applications, a first circuit-side outer trace portion of the conductive trace positioned between and electrically coupling the upper arm of the first inner dipole and the upper arm of the first outer dipole, has a first circuit-side outer trace width in a vertical plane normal to the circuit side of the PCB, and a first circuit-side outer trace length in a horizontal plane normal to the circuit side of the PCB.

In some applications, a second circuit-side outer trace portion of the conductive trace positioned between and electrically coupling the upper arm of the second inner dipole and the upper arm of the second outer dipole, has a second circuit-side outer trace width in a vertical plane normal to the circuit side of the PCB, and a second circuit-side outer trace length in a horizontal plane normal to the circuit side of the PCB.

In some applications, a first ground-side inner trace portion of the conductive trace positioned between and electrically coupling the groundplane and the lower arm of the first inner dipole, has a first ground-side inner trace width in a vertical plane normal to the groundplane side of the PCB, and a first ground-side inner trace length in a horizontal plane normal to the groundplane side of the PCB.

In some applications, a second ground-side inner trace portion of the conductive trace positioned between and electrically coupling the groundplane and the lower arm of the second inner dipole, has a second ground-side inner trace width in a vertical plane normal to the groundplane side of the PCB, and a second ground-side inner trace length in a horizontal plane normal to the groundplane side of the PCB.

In some applications, a first ground-side outer trace portion of the conductive trace positioned between and electrically coupling the lower arm of the first inner dipole and the lower arm of the first outer dipole, has a first ground-side outer trace width in a vertical plane normal to the groundplane side of the PCB, and a first ground-side outer trace length in a horizontal plane normal to the groundplane side of the PCB.

In some applications, a second ground-side outer trace portion of the conductive trace positioned between and electrically coupling the lower arm of the second inner dipole and the lower arm of the second outer dipole, has a second ground-side outer trace width in a vertical plane normal to the groundplane side of the PCB, and a second ground-side outer trace length in a horizontal plane normal to the groundplane side of the PCB.

In some applications, the first circuit-side outer trace width is greater than the first circuit-side inner trace width by a multiple of at least about 1.5, 2, 2.5, 3, 3.5, 4, 4.5, 5, 5.5, or 6 times. In some applications, the second circuit-side outer trace width is greater than the second circuit-side inner trace width by a multiple of at least about 1.5, 2, 2.5, 3, 3.5, 4, 4.5, 5, 5.5, or 6 times. In some applications, the first circuit-side outer trace length is greater than the first circuit-side inner trace length by a ratio of about 2:1, 9:5, 7:4, 5:3, 3:2, 4:3, 5:4, 6:5, or 7:6. In some applications, the second circuit-side outer trace length is greater than the second circuit-side inner trace length by a ratio of about 2:1, 9:5, 7:4, 5:3, 3:2, 4:3, 5:4, 6:5, or 7:6. In some applications, the first ground-side inner trace width is greater than the first ground-side outer trace width by a ratio of about 2:1, 9:5, 7:4, 5:3, 3:2, 4:3, 5:4, 6:5, or 7:6. In some applications, the second ground-side inner trace width is greater than the second ground-side outer trace width by a ratio of about 2:1, 9:5, 7:4, 5:3, 3:2, 4:3, 5:4, 6:5, or 7:6. In some applications, the first ground-side outer trace length is greater than the first ground-side inner trace length by a multiple of at least about 1.5, 2, 2.5, 3, 3.5, 4, 4.5, 5, 5.5, or 6 times. In some applications, the second ground-side outer trace length is greater than the second ground-side inner trace length by a multiple of at least about 1.5, 2, 2.5, 3, 3.5, 4, 4.5, 5, 5.5, or 6 times.

In some applications, the first circuit-side outer trace width is greater than the first ground-side outer trace width by a ratio of about 2:1, 9:5, 7:4, 5:3, 3:2, 4:3, 5:4, 6:5, or 7:6. In some applications, the second circuit-side outer trace width is greater than the second ground-side outer trace width by a ratio of about 2:1, 9:5, 7:4, 5:3, 3:2, 4:3, 5:4, 6:5, or 7:6. In some applications, the first ground-side inner trace width is greater than the first circuit-side inner trace width by a multiple of at least about 1.5, 2, 2.5, 3, 3.5, 4, 4.5, 5, 5.5, 6, 6.5, 7, 7.5, or 8 times. In some applications, the second ground-side inner trace width is greater than the second circuit-side inner trace width by a multiple of at least about 1.5, 2, 2.5, 3, 3.5, 4, 4.5, 5, 5.5, 6, 6.5, 7, 7.5, or 8 times. In some applications, the first circuit-side inner trace length is greater than the first ground-side inner trace length by a multiple of at least about 1.2, 1.5, 1.8, 2, 2.2, 2.5, 2.8, or 3 times. In some applications, the second circuit-side inner trace length is greater than the second circuit-side ground-side inner trace length by a multiple of at least about 1.2, 1.5, 1.8, 2, 2.2, 2.5, 2.8, or 3 times.

In some applications, the first circuit-side outer trace width is greater than the first circuit-side inner trace width by a multiple of between about 3 to 5 times. In some applications, the second circuit-side outer trace width is greater than the second circuit-side inner trace width by a multiple of between about 3 to 5 times. In some applications, the first circuit-side outer trace length is greater than the first circuit-side inner trace length by a ratio of between about 3:2 to 5:4. In some applications, the second circuit-side outer trace length is greater than the second circuit-side inner trace length by a ratio of between about 3:2 to 5:4. In some applications, the first ground-side inner trace width is greater than the first ground-side outer trace width by a ratio of between about 7:4 to 3:2. In some applications, the second ground-side inner trace width is greater than the second ground-side outer trace width by a ratio of between about 7:4 to 3:2. In some applications, the first ground-side outer trace length is greater than the first ground-side inner trace length by a multiple of between about 2 to 4 times. In some applications, the second ground-side outer trace length is greater than the second ground-side inner trace length by a multiple of between about 2 to 4 times. In some applications, the first circuit-side outer trace width is greater than the first ground-side outer trace width by a ratio of between about 3:2 to 5:4. In some applications, the second circuit-side outer trace width is greater than the second ground-side outer trace width by a ratio of between about 3:2 to 5:4. In some applications, the first ground-side inner trace width is greater than the first circuit-side inner trace width by a multiple of between about 4 to 6 times. In some applications, the second ground-side inner trace width is greater than the second circuit-side inner trace width by a multiple of between about 4 to 6 times. In some applications, the first circuit-side inner trace length is greater than the first ground-side inner trace length by a multiple of between about 1.5 to 2.5 times. In some applications, the second circuit-side inner trace length is greater than the second circuit-side ground-side inner trace length by a multiple of between about 1.5 to 2.5 times.

In some applications, the first circuit-side outer trace width is greater than the first circuit-side inner trace width by a multiple of about 4 times. In some applications, the second circuit-side outer trace width is greater than the second circuit-side inner trace width by a multiple of about 4 times. In some applications, the first circuit-side outer trace length is greater than the first circuit-side inner trace length by a ratio of about 4:3. In some applications, the second circuit-side outer trace length is greater than the second circuit-side inner trace length by a ratio of about 4:3. In some applications, the first ground-side inner trace width is greater than the first ground-side outer trace width by a ratio of about 5:3. In some applications, the second ground-side inner trace width is greater than the second ground-side outer trace width by a ratio of about 5:3. In some applications, the first ground-side outer trace length is greater than the first ground-side inner trace length by a multiple of about 3 times. In some applications, the second ground-side outer trace length is greater than the second ground-side inner trace length by a multiple of about 3 times. In some applications, the first circuit-side outer trace width is greater than the first ground-side outer trace width by a ratio of about 4:3. In some applications, the second circuit-side outer trace width is greater than the second ground-side outer trace width by a ratio of about 4:3. In some applications, the first ground-side inner trace width is greater than the first circuit-side inner trace width by a multiple of about 5 times. In some applications, the second ground-side inner trace width is greater than the second circuit-side inner trace width by a multiple of about 5 times. In some applications, the first circuit-side inner trace length is greater than the first ground-side inner trace length by a multiple of about 2 times. In some applications, the second circuit-side inner trace length is greater than the second circuit-side ground-side inner trace length by a multiple of about 2 times.

In some applications, the radome comprises a radome base and a radome shell, the radome base and the radome shell are configured to be coupled to the RF connector and to generally surround and protect PCB antenna components. In some applications, the radome base comprises a first portion that defines a first opening configured for receiving at least a portion of a stem of the RF connector. A second portion defines at least a second opening configured to be aligned with a corresponding opening portion in the RF connector through which at least one fastener can be positioned. The radome shell has a connector portion defining at least one opening configured to be aligned with the radome base and RF connector to receive the at least one fastener. Wherein the base of the radome is operably coupled to the radome shell via the fastener passing through the RF connector. The connector portion of the radome shell is configured to fit within a groove of the radome base when connected. An o-ring is sized to be positioned within the groove of the radome base to provide a sealed connection between the radome base and the radome shell when assembled.

In some applications, the radome shell comprises a housing portion. The housing portion is configured to have multiple protrusions along a length of the radome shell that are adapted to interact with radiation distribution signals during use. The protrusions on the radome shell form a symmetric shape. First and second protrusions on opposite sides of the radome shell are configured to receive portions of the PCB within recesses of the first and second protrusions. Third and fourth protrusions on the radome shell extend in opposite directions to each other between the first and second protrusions at angles generally normal to the first and second protrusions. The recesses within the third and fourth protrusions are arranged to be void during use and not house a portion of the PCB. One or more of the protrusions comprise rounded outer surface portions. The protrusions on the radome shell form a rounded-plus configuration to shape the radiation distribution pattern during use.

In some applications, the RF connector, the PCB, and the radome are configured to be coupled together for use. During use the inner set of dipole arms radiate at the same frequency as the outer arms but are at a different multiple of the wavelength. The outer arms radiate at approximately standard half-wavelength dipoles. The inner set of arms are approximately full-wavelength dipoles. Each set of arms are resonant at 5 GHz WiFi. The spacing between the inner set of dipole arms and the outer set of dipole arms, the size, shape, and spacing of the ground plane, and the radome shape generate an approximated omni-directional radiation pattern providing superior performance in a simple, compact, and economical arrangement. In some applications, during use, most of the power is radiated by the outer arms which have lower impedance than the inner arms.

In some applications, the PCB comprises four dipoles positioned and aligned in a horizontal configuration, wherein the two outer dipoles have a relatively lower impedance. The two inner dipoles have a relatively higher impedance. The two inner dipoles with the relatively higher impedance are positioned closer to the groundplane than the two outer dipoles such that the inner dipoles draw less energy from the feed line. An amplitude taper between the inner and outer dipoles causes the outer dipoles to radiate more energy in the elevation plane to achieve an omni-directional pattern. In some applications, the phase relationship between the arms is configured to be adjusted so that one arm is fed earlier than the other by adding a phase taper on the array. In some applications, the dipole arm placements and groundplane side is such that the elevation beam width and peak gain of the antenna is similar to an antenna that has four dipoles that are very similar in size and vertically separated from one another by approximately one wavelength.

In some applications, four dipoles of two drastically different lengths are used in a horizontal fashion along with the radome shell to focus the RF radiation in the vertical plane while maintaining a nearly circular omnidirectional pattern in the horizontal plane. In some applications, the PCB is a single layer printed circuit board with no through holes. In some applications, the PCB is a single layer printed circuit board with no plated through holes. In some applications, use of horizontally spaced elements rather than vertically separated elements limits null spots in the vertical plane. In some applications, use of a full-wavelength dipole flattens the radiation pattern towards the horizontal plane and creates a stable and narrow elevation pattern.

In some applications, a single printed circuit board antenna configuration comprises four dipoles arranged in a horizontal configuration. The combination of inner arms, outer arms, and groundplane, with mixed wavelength dipole arms, contributes to a radiation pattern that improves the omni-directional performance at a single target frequency. The omni-directional radiation pattern has a generally rounded-off square shape and/or a rounded-off diamond shape in some applications.

In some applications, the single printed circuit board Wifi antenna configuration has a gain of about six dBi while maintaining a generally circular omni-directional radiation pattern. In some applications, the radome is shaped and configured to scatter and/or absorb portions of the radiation to enhance the omnidirectional nature of the antenna in addition to providing environmental protection to enhance the spatial radiation pattern of the antenna.

UMTS Dipole

The present disclosure also relates generally to circuits and device components configured to provide an antenna, and more specifically, to providing multiple antennas for wireless communication having a single printed circuit board configuration. Additionally, the present disclosure relates to stacking two independent dipole antennas on top of one another and then feeding the dipoles from two different connectors with no coaxial cable internal to the antenna.

Prior techniques used a coaxial cable to establish the RF connection between RF connectors and antenna elements. This degrades the isolation that is required between the two antenna elements. This also increases the complexity of the manufacturing process.

Locations for mounting antennas on a tower are limited and creating compact antennas is of great importance. Merging multiple independent antennas into a single enclosure is one way to accomplish that. Collocating antennas creates potentially unwanted effects, including cross-coupling between antennas, design challenges, and manufacturing problems. The reasons to avoid vertical stacking of dipoles discussed above related to the vertical separation of elements in a single antenna. This embodiment regards the vertical separation of independent antennas. Concerns regarding PIM for the connection of components apply. Concerns regarding radiation patterns discussed above due to the vertical separation of components do not apply in this case because the vertically separated antennas are independent of each other.

Capacitive coupling is the transfer of energy between disconnected electrical elements by displacement current between circuit nodes, induced by the electric field. For antenna elements, capacitive coupling allows an alternating current signal to pass between elements that are disconnected. This can be used to link a signal on one side of a PCB to the other side of a PCB.

A capacitive dipole feed may use capacitive coupling to drive a dipole arm on one side of a PCB from a feed line on the opposite side of the PCB.

By using a quarter-wavelength of transmission line, the impedance of the load can be transformed. This can be called a quarter-wavelength transmission line. Such a quarter-wave transmission line is only a quarter-wavelength at a single frequency, making this a narrow-band matching technique. In some cases, the term microstrip transformer may refer to a quarter-wave transmission line.

A bus wire is an electrical conduit for carrying electrical power and/or signals. A bus wire may be tapped by feed wires, also called feel lines. A bus wire has advantages over some alternative types of electrical connections, such as plated through holes, or other methods.

A jumper printed circuit board is a piece of PCB containing conductive lines and attached to an underlying PCB. Such a jumper may provide a path between parts of the underlying PCB that could not easily be traced on the underlying PCB itself.

Some embodiments may bypass the need for coaxial cables between the RF connector and the antenna elements. By using elements of the RF coaxial connector configurations described previously to attach the printed circuit board to the RF coaxial connector, the antenna may only require a single printed circuit board. Once RF signals are on the main circuit board, the RF signals follow their respective microstrip line(s) from an RF coaxial connector to their respective dipoles.

In some embodiments, VHB tape, such as the VHB tape manufactured by 3M, bonds a piece of PCB with a second microstrip line onto the groundplane side of the PCB. Bus wire electrically connects this second piece of microstrip line to the microstrip line on the opposite side of the main printed circuit board. This signal path eventually leads to the top dipole. This establishes a second piece of microstrip line that forms an RF jumper that is low cost and highly repeatable and also demonstrates superior performance compared to using a coaxial cable.

In some embodiments, each dipole pair may be made from two dipoles with a common ground plane and a common connection to the microstrip line feed that are mirror images of one another. The microstrip line feed may be electromagnetically coupled to each dipole. This may reduce the number of solder connections to manufacture the antenna and reduce the opportunity for a poor solder joint. Poor solder joints and plated through holes are a common cause for passive intermodulation. The width of the microstrip line affects the impedance of the microstrip line. This embodiment uses a microstrip line to feed each dipole and is chosen to be similar to the real part of the feed impedance for each dipole. The length of the electromagentic portion of each microstrip line along with the tuning tab is chosen to match the impedance of the dipole to that of the microstrip line leading up to the dipole. When each microstrip line used to feed each dipole meets at the center line of the printed circuit board, the combined impedance of the two lines do not match the impedance of the RF coaxial connector. Hence, there is a two-section-quarter-wave transformer at the split point of each microstrip feed line to match this combined impedance to the impedance of the RF coaxial connector. This two-section-quarter-wave transformer matches the real portion of the impedance of the two parallel feed lines to the 50 ohm microstrip line that is connected to the RF coaxial connector.

One possible way to isolate the two dipole pairs is for each to have their own RF coaxial connector and an isolated microstrip feed line. Impedance and loss are both affected by the size, shape, and relative arrangement of traces, baluns, and elements in an antenna. The width of the balun and the width of the dipole arms and the spacing between the baluns may be adjusted to match impedance relative to each other. The size and width of the ground plane affect the return loss and isolation performance of the antenna according to well-known principals.

When required for an embodiment, the size of the radome is chosen so that it can mount to a structure that holds a cellular radio and the antenna described above and fits inside the right-of-way leased by the service provider. The size of the radome limits the vertical separation between the two dipole pairs as well as the type of antenna that can be constructed to meet the target requirements for desirable electrical, mechanical, and environmental performance. The shape of the radome and the materials it is constructed from alter the return loss and isolation.

Figure 25:
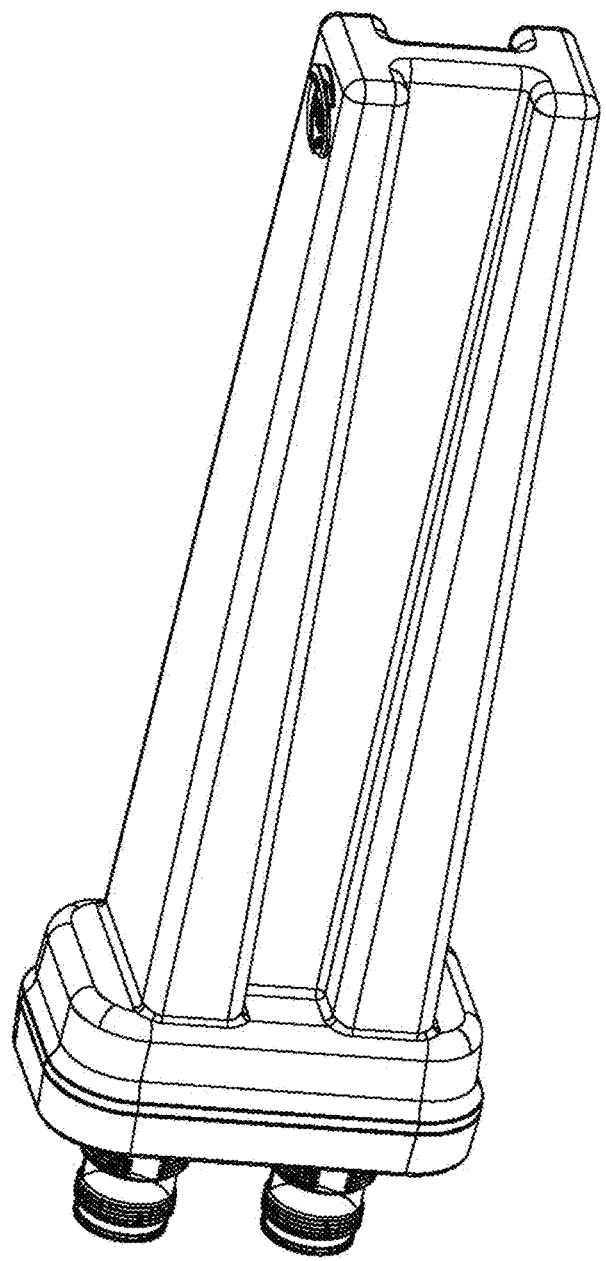
FIG. 25 shows an embodiment of a dual-omni antenna for Universal Mobile Telecommunications Service (UMTS).

FIG. 25 shows an example embodiment of a dual-omni antenna for Universal Mobile Telecommunications Service (UMTS). This embodiment is similar to the omni-directional WiFi antenna discussed previously in some aspects. Similarities include a radome 800, radome shell 820, radome base, and a PCB inside the radome shell. A contrasting feature includes the use of two independent RF connectors, which may carry separate signals to the internal antennas.

Figure 26:
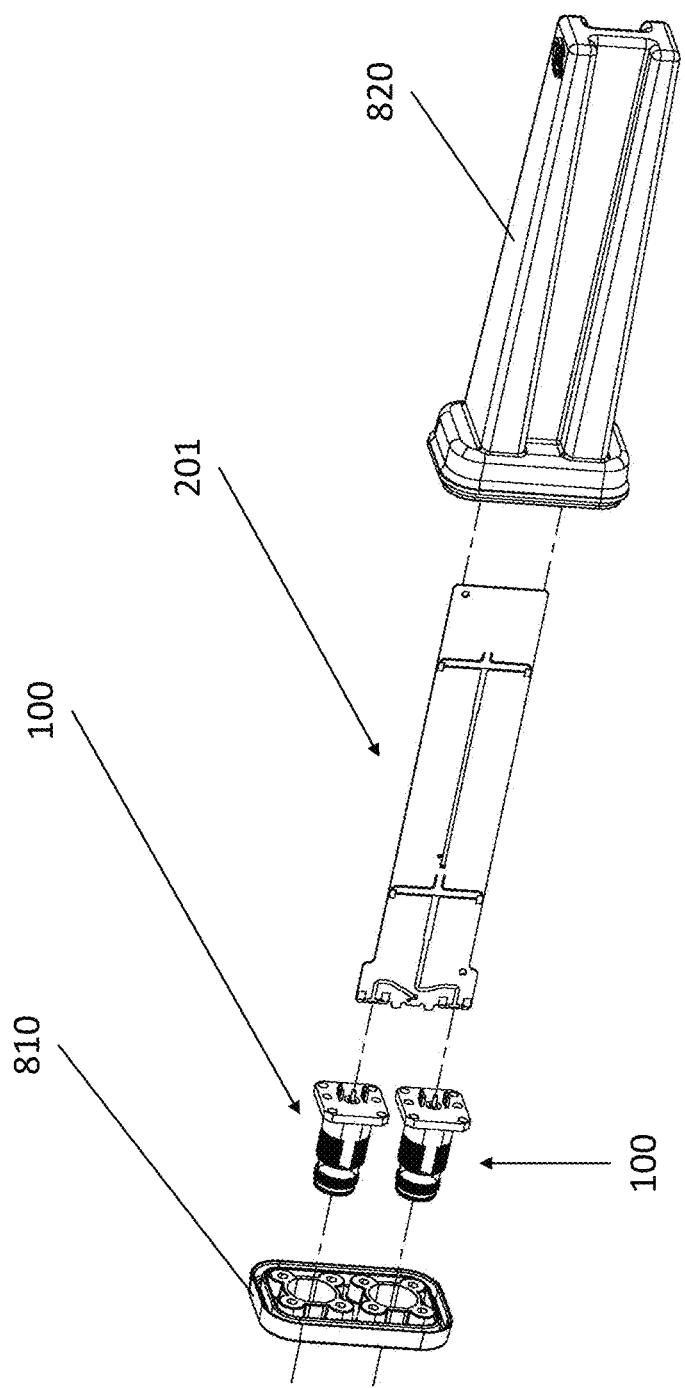
FIG. 26 shows an exploded view of an embodiment of a UMTS antenna.

FIG. 26 shows an exploded view of an embodiment of a UMTS antenna. Two RF connectors 100 connect to a single PCB board 201. The PCB board 201 is surrounded by a radome shell 820 and radome base 810. An O-ring or other similar weatherproofing may sit at the interface between the radome shell and radome base to provide weatherproofing to the interior components. FIG. 26 shows that a plurality of the RF connectors 100 may be included on a single PCB 201. For example, a plurality of the RF connectors 100 may be disposed on a single side or edge of the PCB 201 (as shown in FIG. 26) or on different sides or edges of the PCB 201.

Figure 27:
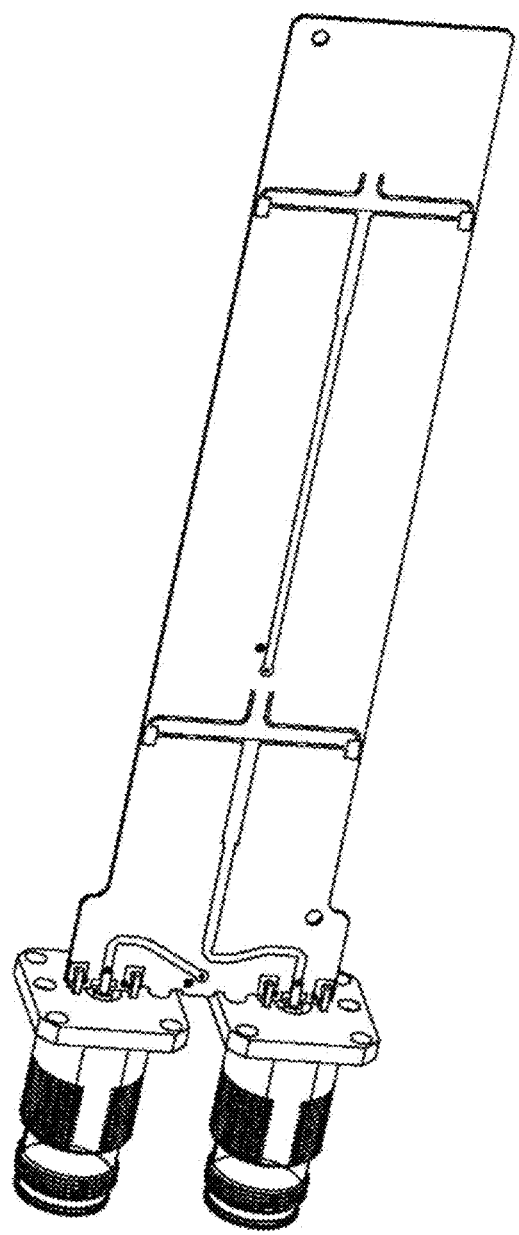
FIG. 27 shows the PCB connected to the two independent connectors according to an example embodiment.
Figure 28:
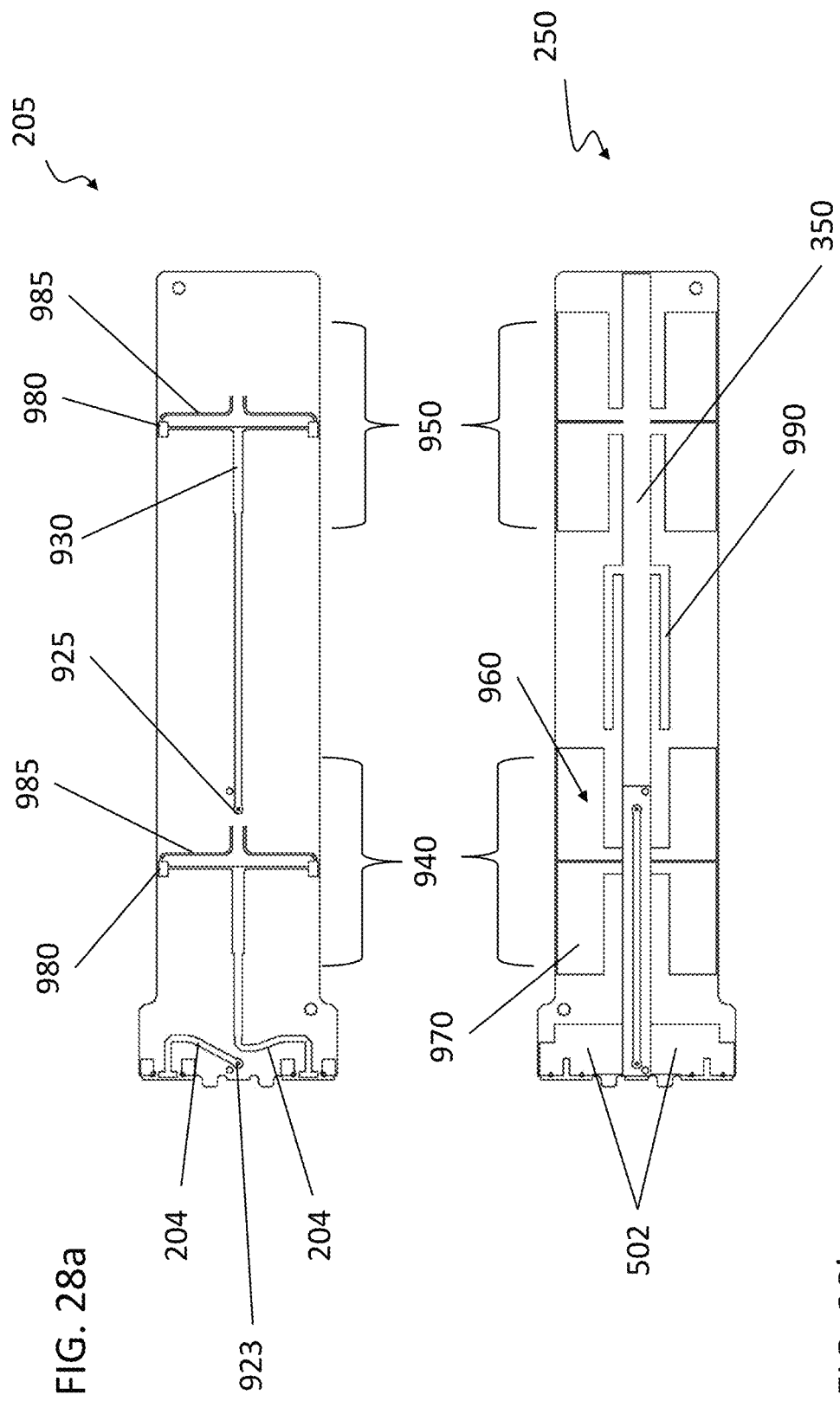
FIG. 28a shows the circuit side of the PCB according to a dual connector embodiment.
FIG. 28b shows the groundplane side of the PCB according to a dual connector embodiment.

FIG. 27 shows the PCB 201 connected to the two independent connectors 100. FIG. 28a shows the circuit side of the PCB 205. FIG. 28b shows the groundplane side of the PCB 250.

Figure 29:
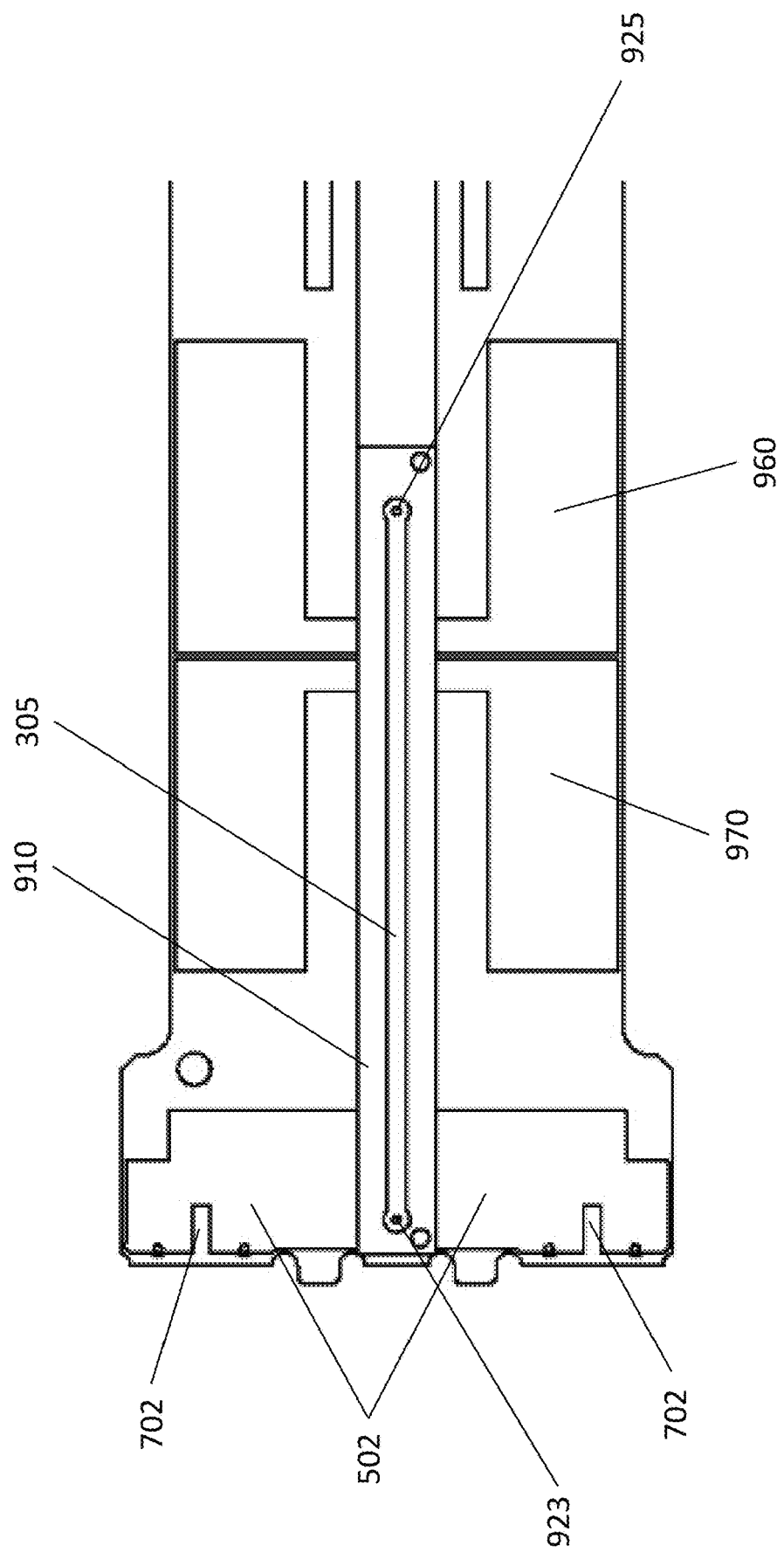
FIG. 29 shows an enlarged area of a UMTS embodiment.

This embodiment of a UMTS antenna has two independent antennas printed on the same PCB. Each connector 100 has a center pin 108 that connects to a conductive trace 204 on the circuit side of the PCB 205. One conductive trace 204 connects directly to the elements of the lower antenna 940. The other conductive trace 204 connects to a lower bus wire 923 that directs the signal to the other side of the PCB. On the other side of the PCB the lower bus wire 923 is connected to an upper bus wire 925 (as also shown in FIG. 29) which returns the signal back to the circuit side of the PCB 205. Using this method avoids internal coaxial connectors. It also reduces the part cost and simplifies manufacturing. This second connector connects from the upper bus wire 925 to a microstrip transformer 930 before driving an upper antenna 950. The circuit side has a capacitively coupled dipole 980 which drives an antenna element on the opposite side of the PCB.

The groundplane side of the PCB 250 shown in FIG. 28b has both the upper antenna 950 and the lower antenna 940 visible. A common conductive trace 502 connects to the ground side of each coaxial connector. The common conductive trace connects to a single groundplane 350 running down the middle of the groundplane side of the PCB 250. Between the upper antenna 950 and the lower antenna 940 and connected to the ground 350 is a choke 990. The choke 990 may provide additional isolation between antennas in some embodiments.

FIG. 28a also shows electromagnetically coupled feeds 985 as part of the upper antenna 950. The electromagnetically coupled feeds 985 have an open circuit at the end of the microstrip line. Their length is approximately ¼ wavelength long from the end of the line to the feed point of the dipole. Hence, at the feed point for the dipole at the top of the balun, it is a virtual short circuit. When referencing a Smith chart, the open circuit is on the right and the short circuit is on the left and there is ¼ wavelength of rotation between them. This virtual short circuit is a cost effective way to feed the dipole for some embodiments, but this feeding technique has a limited frequency bandwidth since the electrical length of the electromagnetically coupled feed 985 is only ¼ wavelength at exactly one frequency.

Each antenna in the illustrated embodiment consists of a pair of dipoles, with a dipole on either side of the centerline. This center line includes the groundplane 350 on the back of the PCB 250 and the microstrip line on the circuit side of the PCB 205. With reference to the lower antenna 940, one of the dipoles of the lower antenna 940 has labels for an upper arm 960 and a lower arm 970. In the UMTS embodiment shown, the upper arm 960 and the lower arm 970 are both on the same side of the PCB. This contrasts with the Omni-WiFi embodiment discussed previously which had the upper arm 320*a* of the outer dipole 320 visible on the circuit side 205 and the lower arm 320*b* of the outer dipole 320 visible on the groundplane side 250. In the UMTS embodiment, the driving element on the circuit side is opposite the lower arm 970. In this embodiment, the lower arm 970 is driven by capacitive coupling by the driving element on the microstrip side of the PCB 205.

FIG. 29 shows an enlarged area of the UMTS embodiment. The close up illustrates the jumper printed circuit board 910 attached to the groundplane side of the PCB 250. The jumper printed circuit board 910 contains a microstrip line 305 and connects at the lower end to a lower bus wire 923 and at the upper end to an upper bus wire 925. These bus wire connections provide connectivity to the electrical traces on the circuit side of the PCB 205. The jumper printed circuit board 910 and the upper bus wire 925 and lower bus wire 923 are all electrically insulated from the groundplane 350 as well as other elements on the groundplane side of the PCB 250. The enlargement also shows the common conductive trace 502 to which the connector arms are soldered and which provides a connection to the ground side of each coaxial connector. At the connection location of each connector a notch 702 is visible. The size of the notch on the groundplane side of the PCB 250 and the size of the tuning tabs 602*a* and 602*b* on the circuit side of the PCB 205 may be adjusted to tune the circuit.

Figure 30:
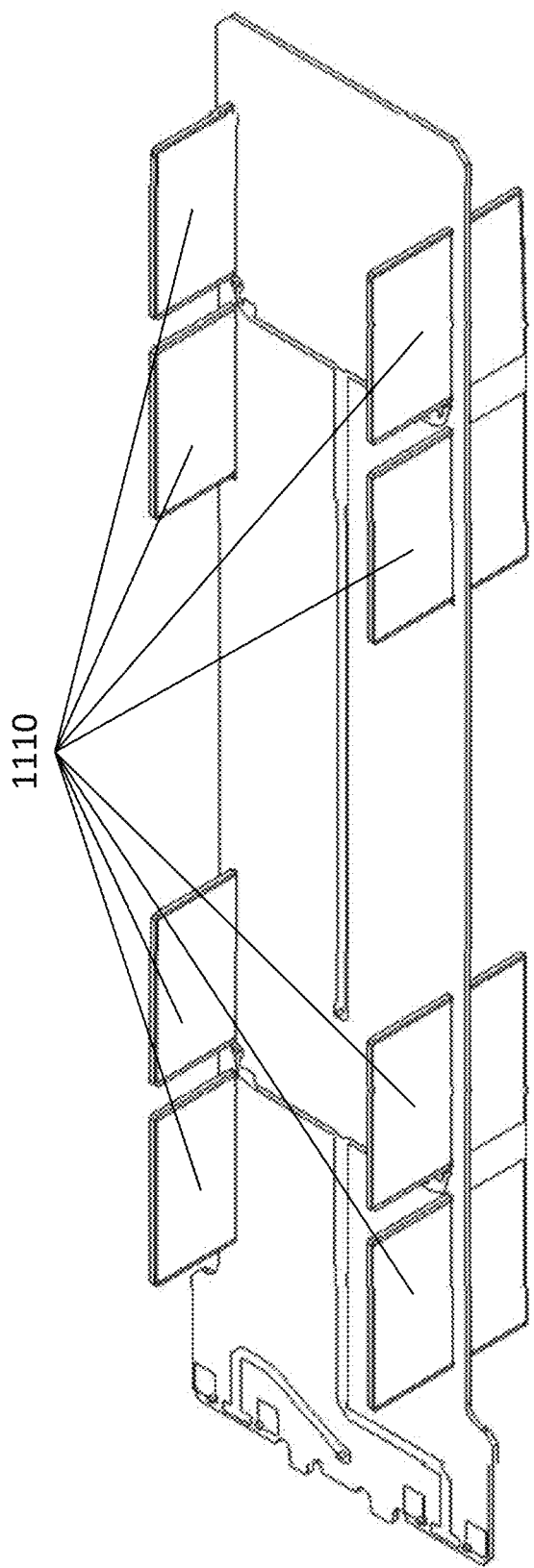
FIG. 30 shows perpendicular printed circuit boards connected to the dipole arms to add volume.

FIG. 30 shows perpendicular printed circuit boards 1110 connected to the dipole arms to add volume. The addition of these perpendicular circuit boards 1110 may increase the frequency bandwidth according to some embodiments.

Figure 31:
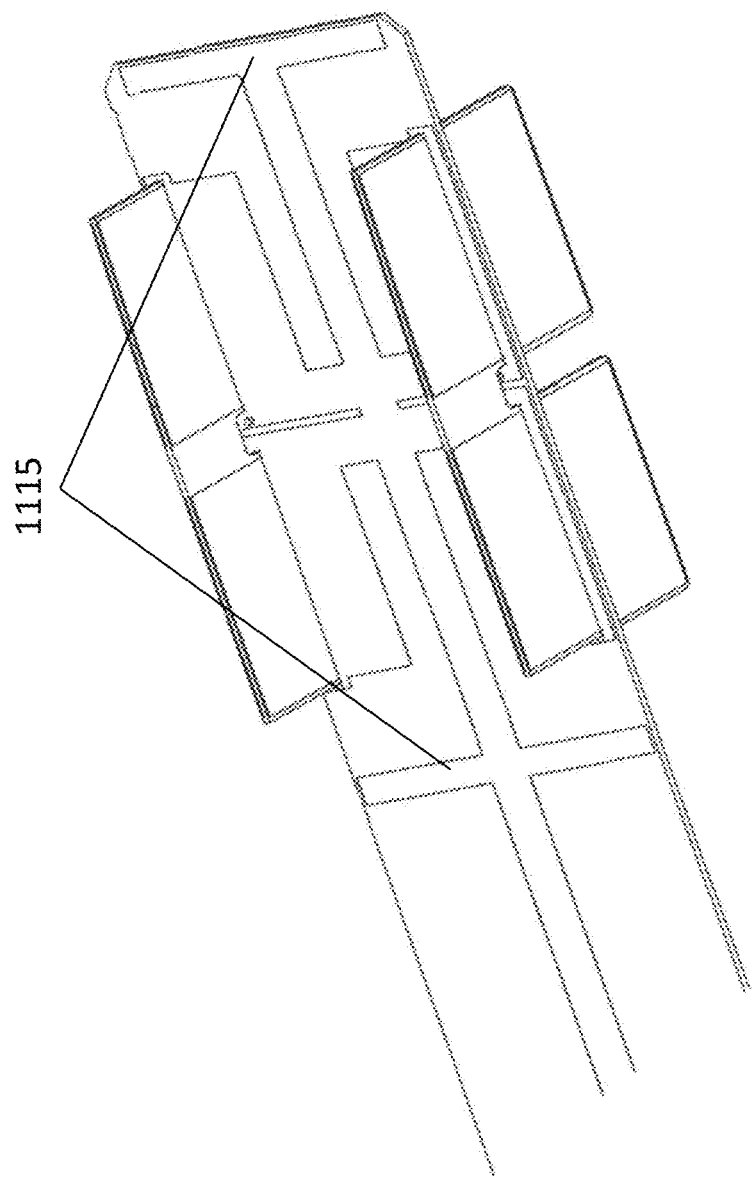
FIG. 31 shows copper areas added to the ground layer of some embodiments to make a shielding wall between antennas to improve the isolation between the two antennas.

FIG. 31 shows a portion of the groundplane side of the PCB 250 of the embodiment shown in FIG. 30. In some embodiments copper areas 1115 are added to the ground layer 350 of the printed circuit board to make a shielding wall between the bottom antenna 940 and the top antenna 950 to improve the isolation between the two antennas.

Figure 32B:
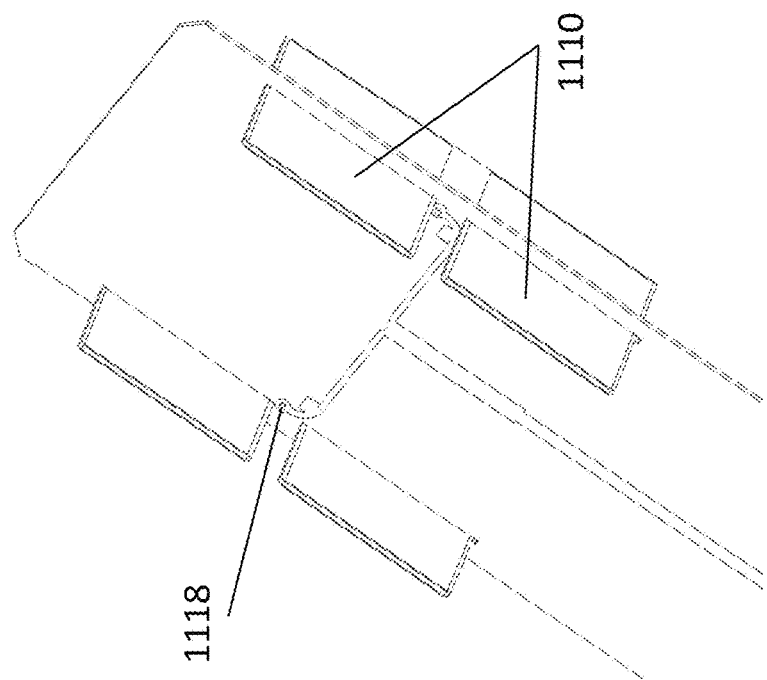
FIG. 32a and FIG. 32b show the use of a bus wire in some embodiments to electromagnetically couple the feeds.
Figure 32A:
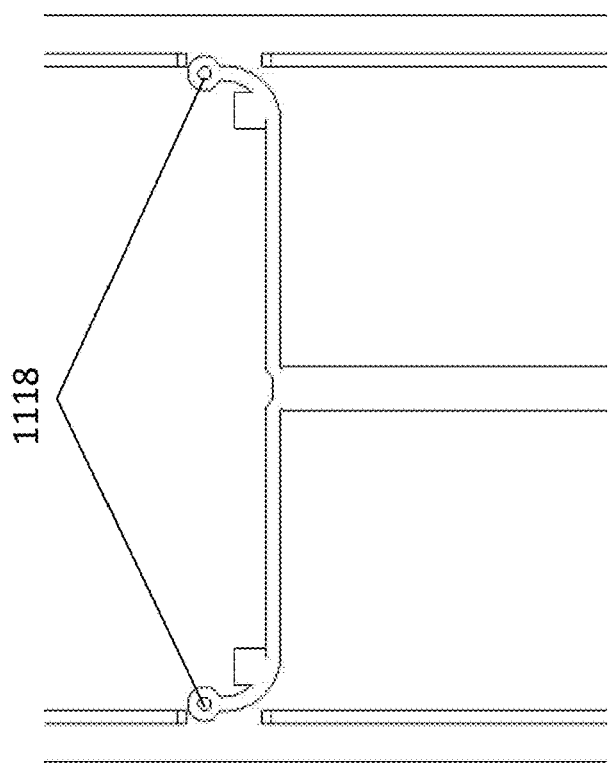

FIG. 32*a* and FIG. 32*b* show the addition of a bus wire 1118. According to some embodiments, the electromagnetically coupled feeds 985 illustrated in FIG. 28*a*, and/or the microstrip line adjacent to feature 980, may be removed and replaced with a bus wire 1118 that substitutes for a plated through hole. In contrast to the embodiment illustrated in FIG. 28*a*, the embodiment illustrated in FIG. 32*a* shows the virtual short circuit feed replaced with an actual short circuit feed using a bus wire. This adds cost to the manufacturing of the antenna but expands the frequency bandwidth of the antenna by avoiding the limitations inherent to the feeding technique. The bus wire provides a short circuit feed without a concern for the frequency of operation. FIG. 32*a* shows the bus wire 1118 in a direct view. FIG. 32*b* shows an angled view that also includes the perpendicular printed circuit boards 1110.

Placing multiple antennas on a single PCB without intervening coaxial or other connectors isolates the antennas and reduces PIM. A PCB provides fixed and repeatable locations for the antenna elements. The interaction between elements and the performance may be measured to ensure compliance with design objectives. Once the design is verified the use of a PCB allows consistent repeatability.

Minimizing interfaces between elements reduces PIM. Internal connectors, and/or multiple PCB boards, would increase the chances of PIM within the antenna and decrease the performance. Flexible connectors also vary in their performance and by only using fixed elements, antenna production is more consistent.

Reducing internal connections and reducing the number of PCB boards both simplify the manufacturing process. Simplification of manufacturing results in a cheaper process and lower cost parts.

The use of a jumper printed circuit board 910 allows two independent antennas, fed from two independent connectors, to reside on a single PCB 201 without internal coaxial connections. This reduces the space required for antennas and simplifies antenna deployment. When antenna space on a tower is constrained, as it usually is, the ability to fit two antennas into the space typically occupied by a single antenna is desirable. The jumper printed circuit board overcomes the normal difficulty of independently feeding an antenna further away from the connectors with an intervening antenna in the way. The jumper printed circuit board 910 is also much cheaper than printing entire circuit boards and connecting them together.

The embodiment of a single main PCB 201 with a small jumper PCB 910 for construction provides significant benefits. The industry accepted way is to bond two PCBs together of similar size using PCB bonding material and then use plated through holes to obtain the connections between the microstrip lines. This is significantly more costly and adds to the amount of PCB material that is around the dipoles. Extra PCB material will reduce the efficiency of the dipoles and hence reduce the amount of RF power that is transmitted out to mobile phones as well as received by the mobile phones. Alternatively, the same PCB dipoles could also be fed with coaxial cable coming from the coaxial connectors. This would increase the complexity and cost of the manufactured antenna but it could then be fabricated from a single printed board without a jumper printed circuit board. The use of such coaxial connectors increases the PIM and makes obtaining the required manufacturing tolerances and resulting performance more difficult. Internal coaxial connectors are more difficult to manufacture.

According to some advantageous aspects of the disclosure, an omni-directional UMTS dual antenna system can comprise one or more of the following features and aspects in various combinations. Additional features, aspects, and advantages are disclosed herein.

In some example configurations, the PCB comprises multiple antennas. The PCB comprises a first microstrip line. The PCB comprises a first dipole antenna and a second dipole antenna. The second dipole antenna is stacked vertically above the first dipole antenna on the PCB. The first dipole antenna on the PCB is configured to be operably coupled and electrically connected to a first RF connector. The second dipole antenna on the PCB is configured to be operably coupled and electrically connected to a second RF connector. A single printed circuit board configuration comprises multiple dipole antennas for wireless communication. A capacitive dipole feed on a first side of the PCB is operably coupled and electrically connected via a capacitive coupling to an antenna portion on the opposite side of the PCB to drive a dipole arm on the opposite side of the PCB.

In some aspects, a jumper printed circuit board is operably coupled and electrically connected to the PCB, the jumper printed circuit board comprises conductive lines attached to PCB to provide a path between parts of the PCB that could not easily be traced on the PCB itself. The jumper printed circuit board is attached to the groundplane side of the PCB via tape. The jumper printed circuit board comprises a bus wire configured to carry electrical power and/or signals during use. The jumper printed circuit board comprises a second microstrip line to carry electrical power and/or signals during use. The bus wire electrically connects the second microstrip line to the microstrip line on the opposite side of the PCB.

In some example embodiments, the first dipole antenna is operably coupled to the first RF connector. The second dipole antenna is operably coupled to the second RF connector. The first dipole antenna and the second dipole antenna have a common ground plane. The first dipole antenna and the second dipole antenna have a common connection to the microstrip line feed. The first dipole antenna and the second dipole antenna are mirror images of one another. A microstrip line feed is electromagnetically coupled to each dipole. The PCB comprises a two-section-quarter-wave transformer at a split point of the microstrip feed line to match the combined impedance to the impedance of the RF coaxial connector. The radome is configured to mount to a structure adapted to hold a cellular radio. The first and second dipole antennas stacked on a single PCB are configured to fit within a single radome shell during use.

According to some aspects of the disclosure, the antenna system comprises a dual-omni antenna for use with a Universal Mobile Telecommunications Service (UMTS) system. A UMTS antenna has two independent antennas printed on the same PCB. The first and second RF connectors have first and second center pins configured to be connected to respective first and second conductive traces on the circuit side of the PCB. A single common conductive trace on the groundplane side of the PCB is configured to connect to respective first and second ground portions of the first and second RF connectors. The single common conductive trace connects to a single groundplane that extends down the middle of the groundplane side of the PCB.

According to advantages of some other applications, electromagnetically coupled feeds and/or a microstrip line, may be removed and replaced with a bus wire. The virtual short circuit feed can be replaced with an actual short circuit feed using a bus wire. This adds cost to the manufacturing of the antenna but expands the frequency bandwidth of the antenna by avoiding the limitations inherent to the feeding technique. The bus wire provides a short circuit feed without a concern for the frequency of operation. The antenna system can include perpendicularly oriented printed circuit boards.

Some advantageous features can include that multiple independent antennas can be arranged on a single PCB without using an intervening coaxial connector. Multiple independent antennas are arranged on a single PCB without using a platted through hole connection. Multiple independent antennas, fed from multiple independent RF connectors, are arranged vertically on a single PCB using a smaller jumper printed circuit board attached to a groundplane side of the PCB. The jumper printed circuit board has a microstrip feed line between first and second bus wires that are coupled to the circuit side of the PCB opposite the groundplane side to vertically offset and isolate the independent antennas without internal coaxial connections to limit PIM.

CONCLUSION

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

The various features and processes described herein may be used independently of one another, or may be combined in various ways. All possible combinations and sub-combinations are intended to fall within the scope of this disclosure. The example systems and components described herein may be configured differently than described. For example, elements may be added to, removed from, or rearranged compared to the disclosed example embodiments.

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase "at least one of X, Y, or Z," unless specifically stated otherwise, is otherwise understood with the context as used in general to present that an item, term, and so forth, may be either X, Y, or Z, or any combination thereof (for example, X, Y, and/or Z). Thus, such disjunctive language is not generally intended to, and should not, imply that certain embodiments require at least one of X, at least one of Y, or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

It should be emphasized that many variations and modifications may be made to the herein-described embodiments, the elements of which are to be understood as being among other acceptable examples. All such modifications and variations are intended to be included herein within the scope of this disclosure. The foregoing description details certain embodiments. It will be appreciated, however, that no matter how detailed the foregoing appears in text, the systems and methods can be practiced in many ways. As is also stated herein, it should be noted that the use of particular terminology when describing certain features or aspects of the systems and methods should not be taken to imply that the terminology is being re-defined herein to be restricted to including any specific characteristics of the features or aspects of the systems and methods with which that terminology is associated.

Those of skill in the art would understand that information, messages, and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

What is claimed is:

1. An antenna assembly comprising:
    a printed circuit board with an antenna thereon, the antenna arranged for wireless communication of a radio frequency signal; and
    an edge launch radio frequency connector comprising:
        a conductive body;
        a center pin soldered to a trace of the printed circuit board and electrically connected to the antenna;
        conductive arms on opposing sides of the center pin, each of the conductive arms being soldered to ground pads of the printed circuit board and having a portion spaced apart from the printed circuit board;
        an insulator for electrically isolating the center pin from at least one of the conductive body and the conductive arms; and
        wherein the edge launch radio frequency connector is configured to achieve a passive intermodulation (PIM) of better than −140 decibels relative to a carrier (dBc).

2. An apparatus for transmitting data and/or power wirelessly, comprising:
    a printed circuit board (PCB) comprising a transmission line and a ground trace electrically isolated from the transmission line; and
    a radio frequency connector comprising:
        a conductive body;
        at least one pair of conductive arms each configured to provide an electrical connection between the conductive body and ground pads of the PCB, the at least one pair of conductive arms further configured to hold the PCB therebetween, wherein each of the conductive arms comprises at least one cutout that provides thermal relief when a heat source is applied to an end of the respective conductive arm configured to contact the PCB;
        a center pin configured to electrically contact a trace on the PCB and communicate a signal with the trace; and
        an insulator configured to electrically isolate the center pin from the at least one pair of conductive arms and the conductive body.

3. The apparatus of claim 2, wherein the at least one cutout has one of a square, rectangular, circular, or semicircular shape.

4. The apparatus of claim 2, wherein the radio frequency connector is configured to achieve a passive intermodulation (PIM) of better than −140 decibels relative to a carrier (dBc) when soldered to the PCB.

5. The apparatus of claim 4, wherein the carrier operates in a frequency in a range from 160 megahertz (MHz) to 80 gigahertz (GHz).

6. The apparatus of claim 2, wherein the PCB further comprises a matching circuit configured to increase a reflected power ratio match between the radio frequency connector and the transmission line.

7. The apparatus of claim 6, wherein the matching circuit comprises one or more tuning tabs having an electrical connection with the transmission line and a slot in a ground plane disposed on a side of the PCB opposite the ground pads.

* * * * *